(12) United States Patent
Toyoshima et al.

(10) Patent No.: US 8,390,560 B2
(45) Date of Patent: Mar. 5, 2013

(54) LEVEL SHIFT CIRCUIT, SIGNAL DRIVE CIRCUIT, DISPLAY DEVICE, AND ELECTRONIC DEVICE

(75) Inventors: Yoshihiko Toyoshima, Aichi (JP); Seiichiro Jinta, Aichi (JP)

(73) Assignee: Sony Corporation, Tokyo (JP)

(*) Notice: Subject to any disclaimer, the term of this patent is extended or adjusted under 35 U.S.C. 154(b) by 260 days.

(21) Appl. No.: 12/968,953

(22) Filed: Dec. 15, 2010

(65) Prior Publication Data

US 2011/0157145 A1 Jun. 30, 2011

(30) Foreign Application Priority Data

Dec. 28, 2009 (JP) .................................. 2009-298105

(51) Int. Cl.
*G09G 3/36* (2006.01)
(52) U.S. Cl. .......... 345/100; 345/55; 345/204; 345/211; 327/333; 377/64; 377/68; 377/74
(58) Field of Classification Search .................. 345/55, 345/100, 204, 205, 211–213, 690; 327/109, 327/333, 390; 377/64–81
See application file for complete search history.

(56) References Cited

U.S. PATENT DOCUMENTS

| 6,977,544 | B2* | 12/2005 | Nicollini et al. | 327/589 |
| 2006/0202736 | A1* | 9/2006 | Aksin et al. | 327/390 |
| 2006/0262074 | A1* | 11/2006 | Shimoda | 345/100 |
| 2008/0074164 | A1* | 3/2008 | Liu | 327/333 |

FOREIGN PATENT DOCUMENTS

JP 2005-149624 6/2005

* cited by examiner

*Primary Examiner* — Quan-Zhen Wang
*Assistant Examiner* — Jennifer Nguyen
(74) *Attorney, Agent, or Firm* — SNR Denton US LLP

(57) ABSTRACT

A level shift circuit includes: a first and a second output transistor outputting voltages derived from a first and a second power source voltage, respectively; a first and a second input transistor outputting, based on a first input pulse signal, a first voltage for turning ON the first output transistor and a second voltage for turning OFF the second output transistor, respectively; a third and a fourth input transistor outputting, based on a second input pulse signal, a third voltage for turning OFF the first output transistor and a fourth voltage for turning ON the second output transistor, respectively; a first bootstrap circuit enlarging an amplitude of the first voltage and supplying the same to the first output transistor; and a first voltage compensation circuit, based on a third input pulse signal, making, at an end timing of the first input pulse signal, a voltage change in a direction opposite to that of a voltage fluctuation caused in the first voltage due to a parasitic capacitance in the first input transistor.

21 Claims, 39 Drawing Sheets

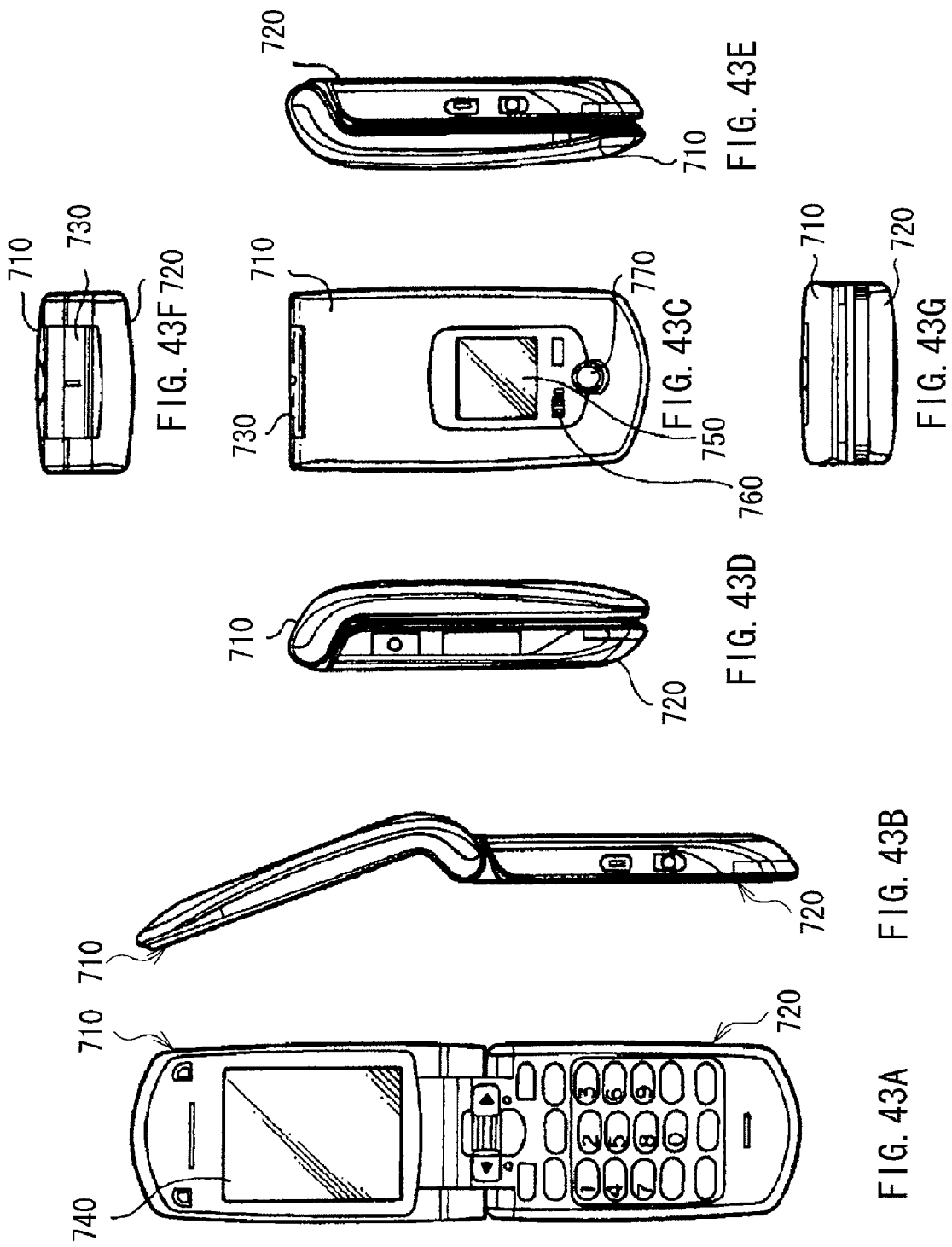

LEVEL SHIFT CIRCUIT, SIGNAL DRIVE CIRCUIT, DISPLAY DEVICE, AND ELECTRONIC DEVICE

BACKGROUND OF THE INVENTION

1. Field of the Invention

The invention relates to a level shift circuit which outputs a signal having a larger amplitude than that of an input signal, and a signal drive circuit, a display device, and an electronic device each having the level shift circuit.

2. Description of the Related Art

In recent years, a complementary metal-oxide semiconductor process, capable of forming both an N-channel metal oxide semiconductor (which may be hereinafter simply referred to as a "MOS") transistor and a P-channel MOS transistor, has been often used for a process of manufacturing an integrated circuit. A CMOS circuit manufactured using the CMOS process allows the N-channel MOS transistor and the P-channel MOS transistor to operate complementary. Such a CMOS circuit makes it possible to achieve low-power consumption, since a through-current does not flow between a power source and ground.

There are some processes that are capable of forming either the N-channel MOS transistor or the P-channel MOS transistor only. For example, in many cases, processes such as an oxide semiconductor process, a micro-silicon (μ-Si) process, and an amorphous silicon (A-Si) process are capable of forming only the N-channel MOS transistor, whereas processes such as an organic thin-film transistor (TFT) process are capable of forming only the P-channel MOS transistor. Also, processes such as a single-crystal silicon process and a low-temperature polysilicon process are normally capable of forming both the N-channel MOS transistor and the P-channel MOS transistor, although those processes may sometimes be adapted to form only either of the N-channel MOS transistor or the P-channel MOS transistor for a purpose of reducing the number of process steps associated with cost reduction. In these cases, a circuit is thus structured by MOS transistors of a single channel (i.e., structured by the MOS transistors of the same conduction type), as disclosed, for example, in Japanese Unexamined Patent Application Publication No. 2005-149624 (JP2005-149624A).

For example, JP2005-149624A proposes a shift resistor circuit utilizing the single-channel MOS transistors. The disclosed circuit operates the two single-channel MOS transistors, which are connected in series between a power source and ground, in a complementary fashion to prevent the through-current from flowing, thereby achieving a reduction in power consumption.

SUMMARY OF THE INVENTION

In general, in view of a stable operation, it is desirable that an input signal having a proper or well-shaped waveform be supplied in circuits such as a signal processing circuit. For example, inputting of waveforms having a stable high-level voltage and a stable low-level voltage enables the circuit to exhibit a desired function without causing malfunction or errors. Thus, when configuring a system with plural stages of circuits, it is desirable that a circuit in a preceding stage output a proper or well-shaped waveform.

When a circuit is structured by single-channel MOS transistors, a node inside of the circuit may turn out to be in a floating state, which state is susceptible to noise. Thus, for example, a signal external to the circuit may propagate to the floating node through a parasitic capacitance or the like, and may cause distortion of a waveform (an internal waveform) of that node. Hence, a malfunction may occur in the circuit. Even if no malfunction is occurred in the circuit itself, an output waveform of that circuit may be distorted. Therefore, in a circuit in a succeeding stage which receives a supply of signal from the circuit causing the malfunction or outputting the distorted waveform, operation of the circuit may become unstable, such as causing a malfunction or errors due to the degraded input waveform therefrom.

It is desirable to provide a level shift circuit, a signal drive circuit, a display device, and an electronic device, each capable of achieving low-power consumption while achieving a proper or well-shaped internal waveform, a proper or well-shaped output waveform, or both.

A level shift circuit according to an embodiment includes: a first output transistor driven to be turned ON to output a voltage derived from a first power source voltage; a second output transistor driven to be turned ON to output a voltage derived from a second power source voltage; a first input transistor having an output terminal, and driven, based on a first input pulse signal, to be turned ON to output a first voltage, the first voltage being a basis of a drive voltage which allows the first output transistor to turn ON; a second input transistor having an output terminal, and driven, based on the first input pulse signal, to be turned ON to output a second voltage, the second voltage being a basis of a drive voltage which allows the second output transistor to turn OFF; a third input transistor having an output terminal connected the output terminal of the first input transistor, and driven, based on a second input pulse signal, to be turned ON to output a third voltage, the third voltage being a basis of a drive voltage which allows the first output transistor to turn OFF; a fourth input transistor having an output terminal connected to the output terminal of the second input transistor, and driven, based on the second input pulse signal, to be turned ON to output a fourth voltage, the fourth voltage being a basis of a drive voltage which allows the second output transistor to turn ON; a first bootstrap circuit enlarging an amplitude of the first voltage, to supply the enlarged first voltage to the first output transistor; and a first voltage compensation circuit making a voltage change based on a third input pulse signal, a direction of the voltage change being opposite to a direction of a voltage fluctuation which is caused in the first voltage at an end timing of the first input pulse signal due to a parasitic capacitance in the first input transistor.

A level shift circuit according to an embodiment includes: a first transistor having a gate connected to a first signal supplier which supplies a signal derived from a first input signal; a second transistor having a gate supplied with a second input signal, a drain connected to a source of the first transistor, and a source connected to a first power source; a third transistor having a gate connected to a second signal supplier which supplies a signal derived from the second input signal; a fourth transistor having a gate supplied with the first input signal, a drain connected to a source of the third transistor, and a source connected to the first power source; a fifth transistor having a drain connected to a second power source, and a gate connected to a third signal supplier which supplies a signal derived from a signal outputted from the source of the third transistor; a sixth transistor having a gate connected to the source of the first transistor, a drain connected to a source of the fifth transistor, and a source connected to the first power source; a first capacitive element having a first end to which a third input signal synchronized with the second input signal is supplied, and a second end connected to the source of the third transistor; a second capacitive element inserted between the source of the third transistor and the first power source; and a third capacitive element inserted between the gate and the source, of the fifth transistor. A signal having an amplitude equal to or larger than amplitudes of the first to the third input signals is outputted from the source of the fifth transistor.

A level shift circuit according to an embodiment includes: a first input circuit to which a first input signal and a second input signal are supplied; a second input circuit to which the first and the second input signals are supplied; a first capacitive element having a first end to which a third input signal synchronized with the first input signal is supplied, and a second end connected to an output terminal of the second input circuit; a second capacitive element inserted between the output terminal of the second input circuit and a power source; and an output circuit generating, based on an output voltage of the first input circuit and an output voltage of the second input circuit, an output signal having an amplitude larger than amplitudes of the first to the third input signals. An amplitude fluctuation caused in an output of the second input circuit due to the second input signal is compensated by a combination of the third input signal and the first and the second capacitive elements. As used herein, the term "compensate" refers to application of an amplitude change which is in a direction opposite to a direction of the amplitude fluctuation caused by the second input signal. Herein, an amount of the amplitude change in the opposite direction does not have to be the same as an amount of the amplitude fluctuation caused by the second input signal. The amount of the amplitude change in the opposite direction may be the same as, smaller than, or larger than the amount of the amplitude fluctuation caused by the second input signal.

A signal drive circuit according to an embodiment includes: a shift register circuit generating pulse signals based on control signals supplied, to sequentially output the generated pulse signals to a plurality of signal lines in a time-divisional fashion; and a level shift circuit generating a drive signal based on one or more of the pulse signals, to output the generated drive signal to one of a plurality of drive signal lines, the drive signal having a voltage amplitude equal to or larger than that of the pulse signals which are basis of the drive signal. The level shift circuit includes: a first output transistor driven to be turned ON to output a voltage derived from a first power source voltage; a second output transistor driven to be turned ON to output a voltage derived from a second power source voltage; a first input transistor having an output terminal, and driven, based on a first input pulse signal, to be turned ON to output a first voltage, the first voltage being a basis of a drive voltage which allows the first output transistor to turn ON; a second input transistor having an output terminal, and driven, based on the first input pulse signal, to be turned ON to output a second voltage, the second voltage being a basis of a drive voltage which allows the second output transistor to turn OFF; a third input transistor having an output terminal connected the output terminal of the first input transistor, and driven, based on a second input pulse signal, to be turned ON to output a third voltage, the third voltage being a basis of a drive voltage which allows the first output transistor to turn OFF; a fourth input transistor having an output terminal connected to the output terminal of the second input transistor, and driven, based on the second input pulse signal, to be turned ON to output a fourth voltage, the fourth voltage being a basis of a drive voltage which allows the second output transistor to turn ON; a first bootstrap circuit enlarging an amplitude of the first voltage, to supply the enlarged first voltage to the first output transistor; and a first voltage compensation circuit making a voltage change based on a third input pulse signal, a direction of the voltage change being opposite to a direction of a voltage fluctuation which is caused in the first voltage at an end timing of the first input pulse signal due to a parasitic capacitance in the first input transistor.

A display device according to an embodiment includes: a display section; and a display controlling section having a level shift circuit which outputs a control signal having an amplitude larger than that of one or more signals supplied, and driving the display section based on the control signal. The level shift circuit includes: a first output transistor driven to be turned ON to output a voltage derived from a first power source voltage; a second output transistor driven to be turned ON to output a voltage derived from a second power source voltage; a first input transistor having an output terminal, and driven, based on a first input pulse signal, to be turned ON to output a first voltage, the first voltage being a basis of a drive voltage which allows the first output transistor to turn ON; a second input transistor having an output terminal, and driven, based on the first input pulse signal, to be turned ON to output a second voltage, the second voltage being a basis of a drive voltage which allows the second output transistor to turn OFF; a third input transistor having an output terminal connected the output terminal of the first input transistor, and driven, based on a second input pulse signal, to be turned ON to output a third voltage, the third voltage being a basis of a drive voltage which allows the first output transistor to turn OFF; a fourth input transistor having an output terminal connected to the output terminal of the second input transistor, and driven, based on the second input pulse signal, to be turned ON to output a fourth voltage, the fourth voltage being a basis of a drive voltage which allows the second output transistor to turn ON; a first bootstrap circuit enlarging an amplitude of the first voltage, to supply the enlarged first voltage to the first output transistor; and a first voltage compensation circuit making a voltage change based on a third input pulse signal, a direction of the voltage change being opposite to a direction of a voltage fluctuation which is caused in the first voltage at an end timing of the first input pulse signal due to a parasitic capacitance in the first input transistor.

An electronic device according to an embodiment includes: a display section; a processing section performing a predetermined process; and a display controlling section having a level shift circuit which outputs a control signal having an amplitude larger than that of one or more signals supplied from the processing section, and driving the display section based on the control signal. The level shift circuit includes: a first output transistor driven to be turned ON to output a voltage derived from a first power source voltage; a second output transistor driven to be turned ON to output a voltage derived from a second power source voltage; a first input transistor having an output terminal, and driven, based on a first input pulse signal, to be turned ON to output a first voltage, the first voltage being a basis of a drive voltage which allows the first output transistor to turn ON; a second input transistor having an output terminal, and driven, based on the first input pulse signal, to be turned ON to output a second voltage, the second voltage being a basis of a drive voltage which allows the second output transistor to turn OFF; a third input transistor having an output terminal connected the output terminal of the first input transistor, and driven, based on a second input pulse signal, to be turned ON to output a third voltage, the third voltage being a basis of a drive voltage which allows the first output transistor to turn OFF; a fourth input transistor having an output terminal connected to the output terminal of the second input transistor, and driven, based on the second input pulse signal, to be turned ON to output a fourth voltage, the fourth voltage being a basis of a drive voltage which allows the second output transistor to turn ON; a first bootstrap circuit enlarging an amplitude of the first voltage, to supply the enlarged first voltage to the first output transistor; and a first voltage compensation circuit making a voltage change based on a third input pulse signal, a direction of the voltage change being opposite to a direction of a voltage fluctuation which is caused in the first voltage at an end timing of the first input pulse signal due to a parasitic capacitance in the first input transistor. As used herein, the term "electronic device" refers to any devices in which supplying of proper or well-shaped waveform is desirable. The electronic device can be, for example but not limited to, a television device, a digital camera, a computer including a desk-top personal computer and a laptop personal computer, a portable terminal device including a cellular phone, a video camera, or other suitable device.

In the level shift circuit, the signal drive circuit, the display device, and the electronic device according to the embodiments, a set operation is performed at a timing of starting of the first input pulse signal by a transition of an output voltage of the level shift circuit, and a reset operation is performed at a timing of starting of the second input pulse signal by another transition of the output voltage to be returned. In other words, an operation is carried out based on a so-called SR (Set/Reset) latch function. In the set operation, the first input transistor is turned ON in response to the starting of the first input pulse signal, and the output voltage of the first input transistor is set at the first voltage. The first voltage is enlarged by the first bootstrap circuit, and an output having the enlarged voltage as compared with a voltage of the first input pulse signal is outputted from an output of the level shift circuit. Thereafter, when the first input pulse signal ends, the first input transistor is turned OFF, by which an output of the first input transistor becomes a floating state. Herein, the voltage transition at the ending of the first input pulse signal is transmitted to the output of the first input transistor through the parasitic capacitance in the first input transistor, thereby causing the voltage fluctuation. At this time, when the third input pulse signal is supplied, the third input pulse signal is transmitted to the output of the first input transistor through the first voltage compensation circuit, thereby making the voltage change which is in the direction opposite to the direction of that voltage fluctuation. Hence, the voltage fluctuation caused by the end of the first input pulse signal is compensated. As a result, the output voltage is maintained also in the output of the level shift circuit.

Advantageously, the first voltage compensation circuit includes: a first voltage compensation capacitor having a first end to which the third input pulse signal is supplied, and a second end connected to both the output terminal of the first input transistor and the output terminal of the third input transistor; and a second voltage compensation capacitor having a first end connected to both the output terminal of the first input transistor and the output terminal of the third input transistor, and a second end to which the second power source voltage is supplied. Advantageously, each of the first and the second voltage compensation capacitors is configured with use of a gate oxide film capacitance of a transistor.

Advantageously, an end timing of the third input pulse signal coincides with or comes after the end timing of the first input pulse signal. Advantageously, the third input pulse signal is generated by inverting the first input pulse signal, or by inverting the first input pulse signal and delaying a phase of the inverted first input pulse signal.

Advantageously, the level shift circuit further includes a second voltage compensation circuit making a voltage change based on a fourth input pulse signal, a direction of the voltage change being opposite to a direction of a voltage fluctuation which is caused in the fourth voltage at an end timing of the second input pulse signal due to a parasitic capacitance in the fourth input transistor.

The second voltage compensation circuit may function particularly in the reset operation. In the reset operation, the fourth input transistor is turned ON in response to the starting of the second input pulse signal, and the output voltage of the fourth input transistor is set at the fourth voltage, and in response thereto, the output voltage of the level shift circuit is reset. Thereafter, when the second input pulse signal ends, the fourth input transistor is turned OFF, by which an output of the second input transistor becomes a floating state. Herein, the voltage transition at the ending of the second input pulse signal is transmitted to the output of the fourth input transistor through the parasitic capacitance in the fourth input transistor, thereby causing the voltage fluctuation. At this time, when the fourth input pulse signal is supplied, the fourth input pulse signal is transmitted to the output of the fourth input transistor through the second voltage compensation circuit, thereby making the voltage change which is in the direction opposite to the direction of that voltage fluctuation. Hence, the voltage fluctuation caused by the end of the second input pulse signal is compensated. As a result, the output voltage is maintained also in the output of the level shift circuit.

Advantageously, the first bootstrap circuit includes a first bootstrap capacitor inserted between a control terminal and the output terminal, of the first output transistor. Advantageously, the first bootstrap circuit further includes a first bootstrap transistor having a control terminal to which the third power source voltage is supplied, and which supplies, in an ON state, the first output transistor with an output voltage of the first input transistor or an output voltage of the third input transistor.

According to the level shift circuits, the signal drive circuit, the display device, and the electronic device of the embodiments, the third input pulse signal is supplied, and the first voltage compensation circuit is provided. Therefore, it is possible to achieve low-power consumption while achieving a proper or well-shaped internal waveform, a proper or well-shaped output waveform, or both.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the specification, serve to explain the principles of the invention.

FIG. 43A is a front view in an open state of a fifth application example, FIG. 43B is a side view in the open state, FIG. 43C is a front view in a closed state, FIG. 43D is a left side view, FIG. 43E is a right side view, FIG. 43F is a top view, and FIG. 43G is a bottom view.

DETAILED DESCRIPTION OF THE PREFERRED EMBODIMENTS

Hereinafter, some embodiments of the invention will be described in detail with reference to the accompanying drawings. The description will be given in the following order.

1. First Embodiment
2. Second Embodiment
3. Third Embodiment
4. Fourth Embodiment
5. Fifth Embodiment
6. Applied Examples (Applied to a display device)
7. Application Examples (Applied to an electronic device)

1. First Embodiment

Configuration Example

Figure 1:
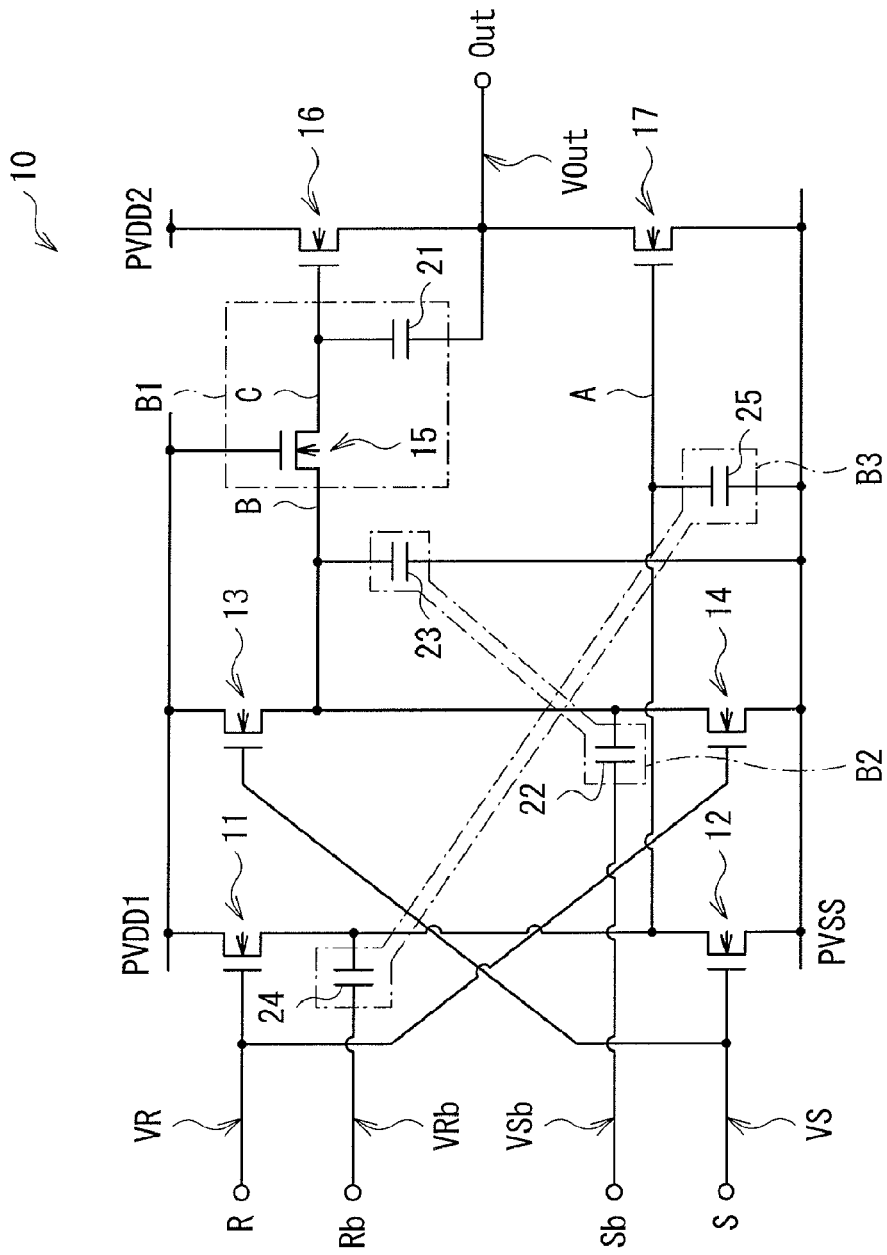
FIG. 1 is a circuit diagram illustrating an example of a configuration of a level shifter according to a first embodiment of the invention.

FIG. 1 illustrates an example of a configuration of a level shifter according to a first embodiment of the invention. As one embodiment of a circuit structured by single-channel MOS transistors, the first embodiment describes a level shifter 10, which uses N-channel MOS transistors and outputs, based on a supplied signal, a signal having a larger amplitude than an amplitude of that input signal. The level shifter 10 is provided with MOS transistors 11 to 17, and capacitive elements 21 to 25.

The MOS transistor 11 includes a gate connected to an input terminal R, a drain connected to a power source PVDD1, and a source connected to a node A. The MOS transistor 11 has an unillustrated parasitic capacitance between the gate and the source. The MOS transistor 12 includes a gate connected to an input terminal S, a drain connected to the node A, and a source connected to a power source PVSS. The MOS transistor 13 includes a gate connected to the input terminal S, a drain connected to the power source PVDD1, and a source connected to a node B. The MOS transistor 13 has an unillustrated parasitic capacitance between the gate and the source. The MOS transistor 14 includes a gate connected to the input terminal R, a drain connected to the node B, and a source connected to the power source PVSS. The MOS transistor 15 includes a gate connected to the power source PVDD1, a drain, and a source, in which one of the drain and the source is connected to the node B and the other of the drain and the source is connected to a node C. The MOS transistor 16 includes a gate connected to the node C, a drain connected to a power source PVDD2 having a voltage VDD2 which is higher than a voltage VDD1 of the power source PVDD1, and a source connected to an output terminal Out. The MOS transistor 17 includes a gate connected to the node A, a drain connected to the output terminal Out, and a source connected to the power source PVSS. Each of the MOS transistors 11 to 17 is structured by the N-channel MOS transistor.

The capacitive element 21 is inserted between the gate and the source of the MOS transistor 16. The capacitive element 21 structures a bootstrap section B1. The bootstrap section B1 serves to perform a bootstrap operation, which will be described later in greater detail. More specifically, the capacitive element 21 functions to allow a voltage in the gate (i.e., the node C) of the MOS transistor 16 to be higher than the voltage VDD2, so as to allow, when an output voltage of the level shifter 10 is at a high level, the voltage VDD2 of the power source PVDD2 to be output as a voltage level thereof.

The capacitive element 22 is inserted between an input terminal Sb and the node B. The capacitive element 23 is inserted between the node B and the power source PVSS. The capacitive elements 22 and 23 structure a voltage compensation section B2. As will be described later in greater detail, the voltage compensation section B2 functions to transmit an inversion-set signal VSb, inputted from the terminal Sb, to the node B only by an amount of amplitude corresponding a ratio of capacitance value of the capacitive element 22 to that of the capacitive element 23, when the node B is in a floating state. This capacitance ratio is set at a value by which a voltage change (a voltage fluctuation), which appears in the node B and which is caused by falling of a set signal VS, is cancelled by the inversion-set signal VSb, as will be described later.

The capacitive element 24 is inserted between an input terminal Rb and the node A. The capacitive element 25 is inserted between the node A and the power source PVSS. The capacitive elements 24 and 25 structure a voltage compensation section B3. As will be described later in greater detail, the voltage compensation section B3 functions to transmit an inversion-reset signal VRb, inputted from the terminal Rb, to the node A only by an amount of amplitude corresponding a ratio of capacitance value of the capacitive element 24 to that of the capacitive element 25, when the node A is in a floating state. This capacitance ratio is set at a value by which a voltage change (a voltage fluctuation), which appears in the node A and which is caused by falling of a reset signal VR, is cancelled by the inversion-reset signal VRb, as will be described later.

The input terminal S is supplied with the set signal VS, and the input terminal R is supplied with the reset signal VR. The input terminal Sb is supplied with the inversion-set signal VSb, and the input terminal Rb is supplied with the inversion-reset signal VRb. In this embodiment, high level voltages VIH of those signals are the same as the voltage VDD1 of the power source PVDD1, and low level voltages VIL of those signals are the same as the voltage VSS of the power source PVSS.

The power source PVDD1 supplies power to sections other than output sections (i.e., the MOS transistors 16 and 17) of the level shifter 10, and the power source PVDD2 supplies power to those output sections. The power source PVDD2 serves to set a high level voltage for an output signal VOut of the level shifter 10, and to drive a circuit connected in a succeeding stage.

With the configuration described above, the level shifter 10 operates, based on an input signal, to output the signal having the larger amplitude (the voltage VDD2–the voltage VSS) than the amplitude (the voltage VDD1–the voltage VSS) of the input signal. More specifically, the level shifter 10 operates to output the voltage VDD2 (i.e., the high level) during a time period from rising of the set signal VS to rising of the reset signal VR, and otherwise operates to output the voltage VSS (i.e., the low level), as described later.

Herein, the MOS transistor 16 and the MOS transistor 17 correspond to illustrative examples of a "first output transistor" and a "second output transistor", respectively. The MOS transistor 13 and the MOS transistor 12 correspond to illustrative examples of a "first input transistor" and a "second input transistor", respectively. The MOS transistor 14 and the MOS transistor 11 correspond to illustrative examples of a "third input transistor" and a "fourth input transistor", respectively (which examples are intended to be illustrative and not restrictive).

The bootstrap section B1 corresponds to one illustrative example of a "first bootstrap circuit". The MOS transistor 15 and the capacitive element 21 correspond to illustrative examples of a "first bootstrap transistor" and a "first bootstrap capacitor", respectively (which examples are intended to be illustrative and not restrictive).

The voltage compensation section B2 corresponds to one illustrative example of a "first voltage compensation circuit". The capacitive element 22 and the capacitive element 23 correspond to illustrative examples of a "first voltage compensation capacitor" and a "second voltage compensation capacitor", respectively. The voltage compensation section B3 corresponds to one illustrative example of a "second voltage compensation circuit" (which examples are intended to be illustrative and not restrictive).

The voltage VDD2 of the power source PVDD2 corresponds to one illustrative example of a "first power source voltage". A voltage VVSS of the power source PVSS corresponds to one illustrative example of a "second power source voltage". The voltage VDD1 of the power source PVDD1 corresponds to one illustrative example of a "third power source voltage" (which examples are intended to be illustrative and not restrictive).

The set signal VS and the reset signal VR correspond to illustrative examples of a "first input pulse signal" and a "second input pulse signal", respectively. The inversion-set signal VSb and the inversion-reset signal VRb correspond to illustrative examples of a "third input pulse signal" and a "fourth input pulse signal", respectively (which examples are intended to be illustrative and not restrictive).

[Operation and Effect]
[Outline of Operation]

First, an operation and effects of the level shifter 10 according to the first embodiment will be described.

Figure 2:
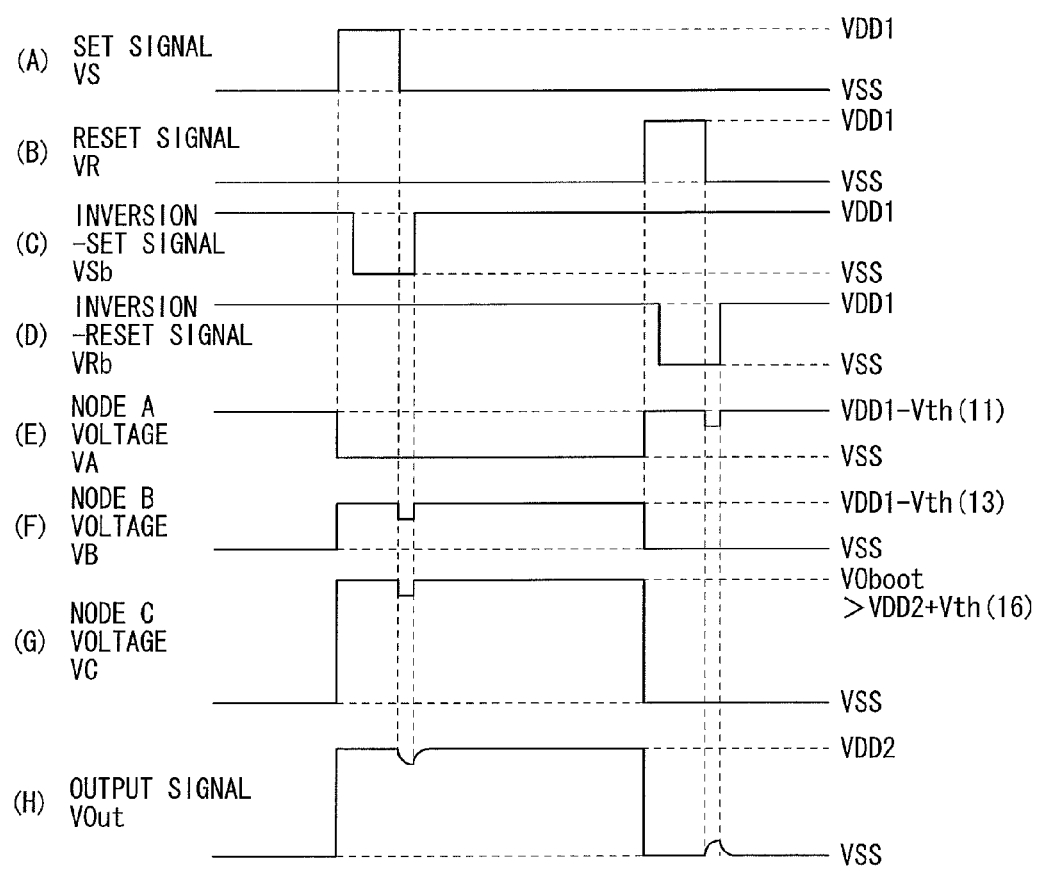
FIG. 2 is a timing waveform chart illustrating an operation example of the level shifter illustrated in FIG. 1.

FIG. 2 illustrates a timing waveform chart of the operation of the level shifter 10, in which (A) illustrates a waveform of the set signal VS, (B) illustrates a waveform of the reset signal VR, (C) illustrates a waveform of the inversion-set signal VSb, and (D) illustrates a waveform of the inversion-reset signal VRb. Further, (E) illustrates a waveform of a voltage VA in the node A, (F) illustrates a waveform of a voltage VB in the node B, (G) illustrates a waveform of a voltage VC in the node C, and (H) illustrates a waveform of the output signal VOut.

First, the set signal VS is raised ((A) of FIG. 2) to perform the bootstrap operation, and the voltage VC of the node C is raised or lifted to a higher potential than the voltage VDD2 ((G) of FIG. 2), and the output signal VOut is at the voltage VDD2 (i.e., at the high level) ((H) of FIG. 2). When the set signal VS falls ((A) of FIG. 2), a voltage change (a voltage fluctuation) occurs in the voltage VC of the node C accordingly, although a voltage change in a reverse direction is made due to immediately-subsequent rising of the inversion-set signal VSb, thereby cancelling those voltage changes ((G) of FIG. 2). Hence, the output signal VOut is maintained at the voltage VDD2 ((H) of FIG. 2).

Then, rising of the reset signal VR ((B) of FIG. 2) allows the voltage VC of the node C to be lowered to the voltage VSS ((G) of FIG. 2), and the voltage VA of the node A increases ((E) of FIG. 2), and the output signal VOut is at the voltage VSS (i.e., at the low level) ((H) of FIG. 2). When the reset signal VR falls ((B) of FIG. 2), a voltage change (a voltage fluctuation) occurs in the voltage VA of the node A accordingly, although a voltage change in a reverse direction is made due to immediately-subsequent rising of the inversion-reset signal VRb, thereby cancelling those voltage changes ((E) of FIG. 2). Hence, the output signal VOut is maintained at the voltage VSS ((H) of FIG. 2).

[Detailed Operation]

A detailed operation of the level shifter 10 will now be described with reference to FIGS. 1 and 2.

First, when the set signal VS rises from the voltage VSS to the voltage VDD1 ((A) of FIG. 2), the MOS transistor 12 is turned ON, and the voltage VA of the node A is lowered to the voltage VSS ((E) of FIG. 2). At the same time, the MOS transistor 13 is turned ON, and the voltage VB of the node B rises to a voltage (VDD1−Vth (13)), which is lower than the voltage VDD1 only by an amount corresponding to a threshold voltage Vth (13) of the MOS transistor 13 ((F) of FIG. 2). Thus, the MOS transistor 17 is turned OFF and the MOS transistor 16 is turned ON, so that a voltage of the output signal VOut rises. At this time, the capacitive element 21 is charged with electric charges, and a voltage difference between both ends of the capacitive element 21 becomes larger than a threshold voltage Vth (16) of the MOS transistor 16. When the output signal VOut rises further, the voltage VC of the node C also rises since the voltage difference between the both ends of the capacitive element 21 is maintained (i.e., the bootstrap operation), and the MOS transistor 15 is turned OFF. The voltage VC of the node C eventually rises up to a voltage VOboot, which is higher than a total voltage (VDD2+Vth (16)) of the voltage VDD2 and the threshold voltage Vth (16) of the MOS transistor 16 ((G) of FIG. 2). Thus, the output signal VOut rises up to the voltage VDD2 ((H) of FIG. 2).

A boot gain Gboot of the MOS transistor 16 in the bootstrap operation described above is expressed by a following Equation (1):

$$Gboot=(Cg+C21)/(Cg+C21+CC) \quad \text{Equation (1)}$$

where Cg is a gate capacitance of the MOS transistor 16, C21 is a capacitance value of the capacitive element 21, and CC is a capacitance of the node C excluding Cg and C21. The bootstrap operation operates more reliably as the boot gain Gboot becomes larger. In order to increase the boot gain Gboot, it is preferable that the sum of the gate capacitance Cg and the capacitance C21 of the capacitive element 21 be sufficiently larger than the capacitance CC of the node C. Also, in this embodiment, the MOS transistor 15 is provided, which is turned OFF at the time of the bootstrap operation. Thus, a capacitance C23 of the capacitive element 23, a source capacitance Cs of the MOS transistor 13, a drain capacitance Cd of the MOS transistor 14, and a capacitance of the node B are disconnected, as compared with a case where the MOS transistor 15 is not provided. Hence, it is possible to decrease the capacitance CC in the Equation (1), and thereby to increase the boot gain Gboot.

Thereafter, when the set signal VS is lowered from the voltage VDD1 to the voltage VSS ((A) of FIG. 2), the MOS transistor 12 is turned OFF, and the node A turns out to be in the floating state, so that the voltage VA of the node A is maintained at the immediately-previous voltage (i.e., the voltage VSS) ((E) of FIG. 2). At the same time, the MOS transistor 13 is also turned OFF, and the node B turns out to be in the floating state, so that the voltage VB of the node B attempts to maintain the immediately-previous voltage (i.e., VDD1−Vth (13)) as well. However, the voltage VB of the node B slightly decreases with a voltage decrease of the set signal VS due to the parasitic capacitance between the gate and the source of the MOS transistor 13 ((F) of FIG. 2). Thereby, the voltage VC of the node C also decreases slightly ((G) of FIG. 2), and the voltage of the output signal VOut starts to decrease slightly as well ((H) of FIG. 2).

Immediately subsequently, however, the inversion-set signal VSb rises from the voltage VSS to the voltage VDD1 ((C) of FIG. 2). This rise in voltage is transmitted to the node B through the capacitive element 22, and thus the voltage VB of the node B is slightly raised to cancel a corresponding amount of the immediately-previous voltage decrease of the node B ((F) of FIG. 2). Thereby, an amount of the voltage decrease is cancelled likewise for the voltage VC of the node C ((G) of FIG. 2), and the output signal VOut is maintained at the voltage VDD2 ((H) of FIG. 2).

Then, when the reset signal VR is raised from the voltage VSS to the voltage VDD1 ((B) of FIG. 2), the MOS transistor 14 is turned ON to lower the voltage VB of the node B to the voltage VSS ((F) of FIG. 2), and the MOS transistor 15 is turned ON to also lower the voltage VC of the node C to the voltage VSS ((G) of FIG. 2). At the same time, the MOS transistor 11 is turned ON, and the voltage VA of the node A is raised to a voltage (VDD1−Vth (11)), which is lower than the voltage VDD1 only by an amount corresponding to a threshold voltage Vth (11) of the MOS transistor 11 ((E) of FIG. 2). Thus, the MOS transistor 17 is turned ON, and the MOS transistor 16 is turned OFF, thereby lowering the output signal VOut to the voltage VSS ((H) of FIG. 2).

Thereafter, when the reset signal VR is lowered from the voltage VDD1 to the voltage VSS ((B) of FIG. 2), the MOS transistor 14 is turned OFF, and each of the nodes B and C turns out to be in the floating state, so that each of the voltage VB of the node B and the voltage VC of the node C is maintained at the immediately-previous voltage (i.e., the voltage VSS) ((F) and (G) of FIG. 2). At the same time, the MOS transistor 11 is also turned OFF, and the node A turns out to be in the floating state, so that the voltage VA of the node A attempts to maintain the immediately-previous voltage (i.e., VDD1−Vth (11)) as well. However, the voltage VA of the node A slightly decreases with a voltage decrease of the reset signal VR due to the parasitic capacitance between the gate and the source of the MOS transistor 11 ((E) of FIG. 2). At this time, in a case where the MOS transistor 17 no longer sufficiently maintains the ON state due to a fact that the voltage VA of the node A is turned out to be less than a threshold voltage Vth (17) of the MOS transistor 17, the output signal VOut may slightly rise depending on a state of load in the output terminal Out of the level shifter 10 ((H) of FIG. 2).

Immediately subsequently, however, the inversion-reset signal VRb rises from the voltage VSS to the voltage VDD1 ((D) of FIG. 2). This rise in voltage is transmitted to the node A through the capacitive element 24, and thus the voltage VA of the node A is slightly raised to cancel a corresponding amount of the immediately-previous voltage decrease of the node A ((E) of FIG. 2). Thereby, the output signal VOut is maintained at the voltage VSS ((H) of FIG. 2).

Thus, in the level shifter 10, the voltage changes in the voltage VB of the node B, the voltage VC of the node C, and the output signal VOut, which occur in the falling of the input set signal VS, are cancelled by the rising of the immediately-subsequently-input inversion-set signal VSb ((F) to (H) of FIG. 2). Also, the voltage changes in the voltage VA of the node A and the output signal VOut, which occur in the falling of the input reset signal VR, are cancelled by the rising of the immediately-subsequently-input inversion-reset signal VRb ((E) and (H) of FIG. 2).

The cancelling operation described above is achieved by the inversion-set signal VSb, the inversion-reset signal VRb, and the capacitive elements 22 to 25. In the following, timings of the inversion-set signal VSb and the inversion-reset signal VRb, and capacitance values of the capacitive elements 22 to 25 will be described in detail.

[Timings of Inversion-Set Signal VSb and Inversion-Reset Signal VRb]

First, description will be given on the timings of the inversion-set signal VSb and the inversion-reset signal VRb.

Referring to FIG. 2, the timing of the rising of the inversion-set signal VSb is set to be immediately after the falling of the set signal VS. Herein, since the set signal VS is at the voltage VSS when the inversion-set signal VSb rises, the MOS transistor 13 is in an OFF state and the node B is in the floating state. Thus, the rising of the inversion-set signal VSb is transmitted to the node B through the capacitive element 22, and a voltage change occurs in the voltage VB of the node B. As a result, in the voltage VB of the node B, a voltage change in a reverse direction due to the inversion-set signal VSb occurs immediately after a voltage change caused by the falling of the set signal VS, to operate to cancel those voltage changes ((F) of FIG. 2). This makes it possible to suppress degradation of internal waveforms and an output waveform of the level shifter 10 to a minimum.

Incidentally, the voltage changes occur in the voltage VB of the node B, the voltage VC of the node C, and the output signal VOut during a time period from the falling of the set signal VS to the rising of the inversion-set signal VSb ((F) to (H) of FIG. 2). Hence, it is preferable that the rising of the inversion-set signal VSb be at the same time as or immediately after the falling of the set signal VS.

For example, if the timing of the rising of the inversion-set signal VSb is set immediately before the falling of the set signal VS, the set signal VS is still at the voltage VDD when the inversion-set signal VSb rises. Thus, the MOS transistor 13 is in an ON state, and the node B is in a low impedance state. As a result, even when the rising of the inversion-set signal VSb is performed, that signal hardly appears in the voltage VB of the node B. Thus, only the voltage change caused by the falling of the set signal VS remains, thereby degrading the internal waveforms and the output waveform of the level shifter 10.

The same is true for the timing of the rising of the inversion-reset signal VRb. That is, with reference to FIG. 2, the timing of the rising of the inversion-reset signal VRb is set to be immediately after the falling of the reset signal VR. Herein, since the reset signal VR is at the voltage VSS when the inversion-reset signal VRb rises, the MOS transistor 11 is in an OFF state and the node A is in the floating state. Thus, the rising of the inversion-reset signal VRb is transmitted to the node A through the capacitive element 24, and the voltage change occurs in the voltage VA of the node A. As a result, in the voltage VA of the node A, the voltage change in the reverse direction due to the inversion-reset signal VRb occurs immediately after a voltage change caused by the falling of the reset signal VR, to operate to cancel those voltage changes ((E) of FIG. 2). This makes it possible to suppress degradation of the internal waveforms and the output waveform of the level shifter 10 to a minimum.

Incidentally, the voltage changes occur in the voltage VA of the node A and the output signal VOut during a time period from the falling of the reset signal VR to the rising of the inversion-reset signal VRb ((E) and (H) of FIG. 2). Hence, it is preferable that the rising of the inversion-reset signal VRb be at the same time as or immediately after the falling of the reset signal VR.

For example, if the timing of the rising of the inversion-reset signal VRb is set immediately before the falling of the reset signal VR, the reset signal VR is still at the voltage VDD when the inversion-reset signal VRb rises. Thus, the MOS transistor 11 is in an ON state, and the node A is in a low impedance state. As a result, even when the rising of the inversion-reset signal VRb is performed, that signal hardly appears in the voltage VA of the node A. Thus, only the voltage change caused by the falling of the reset signal VR remains. Thereby, the internal waveforms and the output waveform of the level shifter 10 may be degraded.

For the reasons set forth above, it is desirable that the timing of the rising of the inversion-set signal VSb be at the same time or after (i.e., coincide with or come after) the falling of the set signal VS, and preferable that the timing of the rising of the inversion-set signal VSb be immediately after the falling of the set signal VS. Also, it is desirable that the timing of the rising of the inversion-reset signal VRb be at the same time or after (i.e., coincide with or come after) the falling of the reset signal VR, and preferable that the timing of the rising of the inversion-reset signal VRb be immediately after the falling of the reset signal VR. In order to achieve these, it is preferable that the set signal VS be inverted using an inverter or the like to generate the inversion-set signal VSb, for example. Similarly, it is preferable that the reset signal VR be inverted using an inverter or the like to generate the inversion-reset signal VRb, for example.

[Capacitance Values of Capacitive Elements 22 to 25]

Now, description will be given on the capacitance values of the capacitive elements 22 to 25.

As already described in the foregoing, the rising of the inversion-set signal VSb operates to cancel the change in the voltage VB of the node B due to the falling of the set signal VS. This means that an amount of the voltage change caused by the rising of the inversion-set signal VSb, which appears in the node B through the capacitive element 22, is desirably set to be almost equal to an amount of the voltage change in the node B caused by the falling of the set signal VS. As a way to set the voltage change amount of the node B caused by the rising of the inversion-set signal VSb, the capacitance ratio of the capacitive elements 22 and 23 may be used, for example.

An amount of transmission TS of the inversion-set signal VSb to the voltage VB of the node B is expressed by a following Equation (2):

$$TS = C22/(C22+C23) \qquad \text{Equation (2)}$$

where C22 is the capacitance value of the capacitive element 22, and C23 is the capacitance value of the capacitive element 23. That is, the transmission amount TS is determined by the capacitance ratio of the capacitive elements 22 and 23. Hence, the following may be performed: obtaining the transmission amount TS by which an amount obtained by multiplying the amplitude (i.e., the voltage VDD1−the voltage VSS) of the inversion-set signal VSb by the transmission amount TS becomes equal to the voltage change amount of the node B caused by the set signal VS; and determining the capacitance values of the capacitive elements 22 and 23 based on the obtained transmission amount TS and the Equation (2). The use of those capacitive elements 22 and 23 makes it possible to cancel the voltage change amount of the node B caused by the falling of the set signal VS with the voltage change amount of the node B caused by the rising of the inversion-set signal VSb.

It is to be noted that parasitic capacitances, such as those in the MOS transistors, are omitted in the Equation (2). That is, in order that the Equation (2) can be accurately established, it is preferable that the capacitances C22 and C23 be sufficiently larger than such parasitic capacitances. Alternatively, the capacitances C22 and C23 may be determined with due consideration of those parasitic capacitances as well in the Equation (2).

The same is true for the capacitance values of the capacitive elements 24 and 25. That is, as a way to set an amount of the voltage change in the node A caused by the rising of the inversion-reset signal VRb, the capacitance ratio of the capacitive elements 24 and 25 may be used, for example.

An amount of transmission TR of the inversion-reset signal VRb to the voltage VA of the node A is expressed by a following Equation (3):

$$TR = C24/(C24+C25) \qquad \text{Equation (3)}$$

where C24 is the capacitance value of the capacitive element 24, and C25 is the capacitance value of the capacitive element 25. That is, the transmission amount TR is determined by the capacitance ratio of the capacitive elements 24 and 25. Hence, the following may be performed: obtaining the transmission amount TR by which an amount obtained by multiplying the amplitude (i.e., the voltage VDD1−the voltage VSS) of the inversion-reset signal VRb by the transmission amount TR becomes equal to the voltage change amount of the node A caused by the reset signal VR; and determining the capacitance values of the capacitive elements 24 and 25 based on the obtained transmission amount TR and the Equation (3). The use of those capacitive elements 24 and 25 makes it possible to cancel the voltage change amount of the node A caused by the falling of the reset signal VR with the voltage change amount of the node A caused by the rising of the inversion-reset signal VRb.

It is to be noted that parasitic capacitances, such as those in the MOS transistors, are omitted in the Equation (3). That is, in order that the Equation (3) can be accurately established, it is preferable that the capacitances C24 and C25 be sufficiently larger than such parasitic capacitances. Alternatively, the capacitances C24 and C25 may be determined with due consideration of those parasitic capacitances as well in the Equation (3).

Thus, the appropriate setting of the capacitance values of the capacitive elements 22 to 25 makes it possible to cancel the voltage changes of the internal waveforms due to the falling of the set signal VS and the falling of the reset signal VR.

Also, the MOS transistors, connected in series between the power source PVDD1 and the power source PVSS and between the power source PVDD2 and the power source PVSS, operate in a complementary fashion. That is, in each of a combination of the MOS transistors 11 and 12, a combination of the MOS transistors 13 and 14, and a combination of the MOS transistors 16 and 17, one of the MOS transistors is in an OFF state when the other of the MOS transistors is in an ON state, and both of the MOS transistors do not turn out to be in the ON state at the same time. Therefore, it is possible to achieve low-power consumption, since a static through-current does not flow.

[Resistance Against Leakage]

Now, description will be given on resistance against leakage of the electric charges charged in the capacitive element 21.

By setting the voltage VC of the node C to be higher than the total voltage (VDD2+Vth (16)) of the voltage VDD2 and the threshold voltage Vth (16) of the MOS transistor 16 when the output signal VOut is at the high level, the resistance against the leakage of the electric charges charged in the capacitive element 21 is increased by a corresponding amount. In the following, description thereon will be made.

Figure 16:
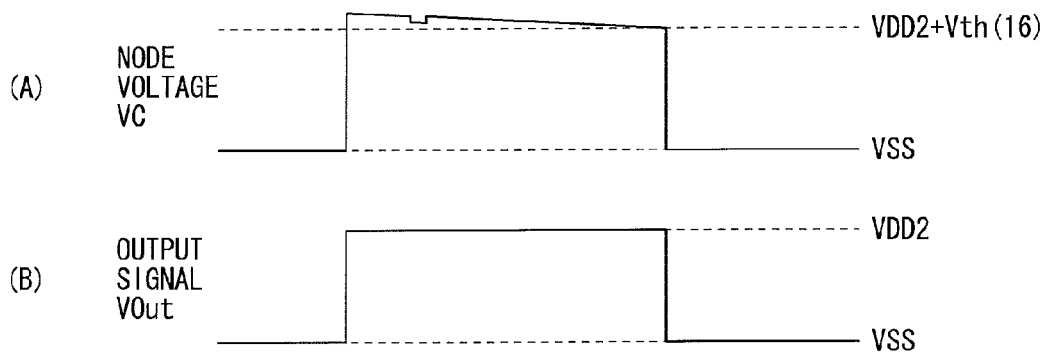
FIG. 16 is a timing waveform chart illustrating a detailed operation of the level shifter illustrated in FIG. 1.

FIG. 16 illustrates a timing waveform chart of an operation when the output signal VOut is raised to the high level in the level shifter 10, in which (A) illustrates a waveform of the voltage VC in the node C, and (B) illustrates a waveform of the output signal VOut. FIG. 16 illustrates the operation of a case where the voltage VC of the node C is decreased with an elapse of time, based on an assumption that the electric charges charged in the capacitive element 21 is subjected to the leakage through the MOS transistor 15, for example. For the purpose of convenience in description, an amount of the leakage thereof is emphasized in FIG. 16.

The level shifter 10 is capable of maintaining the voltage VDD2 when the output signal VOut is at the high level. That is, the voltage VC of the node C constantly exceeds the voltage (VDD2+Vth (16)), despite the fact that the voltage VC gradually decreases, by the leakage, after the rising from the voltage VSS to be at the high level by the bootstrap operation, as illustrated in (A) of FIG. 16. Thereby, the output signal VOut is possible to maintain the voltage VDD2 throughout the exceeding period, as illustrated in (B) of FIG. 16.

This is because the voltage VC of the node C is raised or uplifted ((G) of FIG. 2) when the inversion-set signal VSb is raised ((C) of FIG. 2). That is, in the level shifter 10, the voltage VC of the node C is set to a level which is relatively high, so that the time it takes for the voltage VC to be decreased to the voltage (VDD2+Vth (16)) becomes long even when the voltage VC is dropped by the leakage. Thus, the resistance against the leakage improves.

The same is true for a case when the output signal VOut is at the low level. That is, in the level shifter 10, the voltage VA of the node A is set to be higher than the voltage (VDD1+Vth (11)) in the rising of the inversion-reset signal VR, as illustrated in FIG. 2. At this time, when, in FIG. 1, the electric charges in the node A which is in the floating state is subjected to the leakage through the MOS transistor 12 for example, the voltage VA of the node A gradually decreases with an elapse of time. However, the voltage VA of the node A is set to be relatively high, so that the time it takes for the voltage VA to be decreased to the threshold voltage Vth (17) of the MOS transistor 17 becomes long even when the voltage VA is dropped by the leakage. Thus, the resistance against the leakage improves.

Comparative Example

Now, a level shifter 10R according to a comparative example will be described. The comparative example differs from the first embodiment described above, in that the inversion-set signal and the inversion-reset signal are not input. That is, in the first embodiment described above, the voltage change in the node B due to the set signal VS is cancelled with the inversion-set signal VSb, and the voltage change in the node A due to the reset signal VR is cancelled with the inversion-reset signal VRb. In this comparative example, however, canceling of those voltage changes are not performed. Note that the same or equivalent elements as those of the level shifter 10 according to the embodiment described above are denoted with the same reference numerals, and will not be described in detail.

Figure 3:
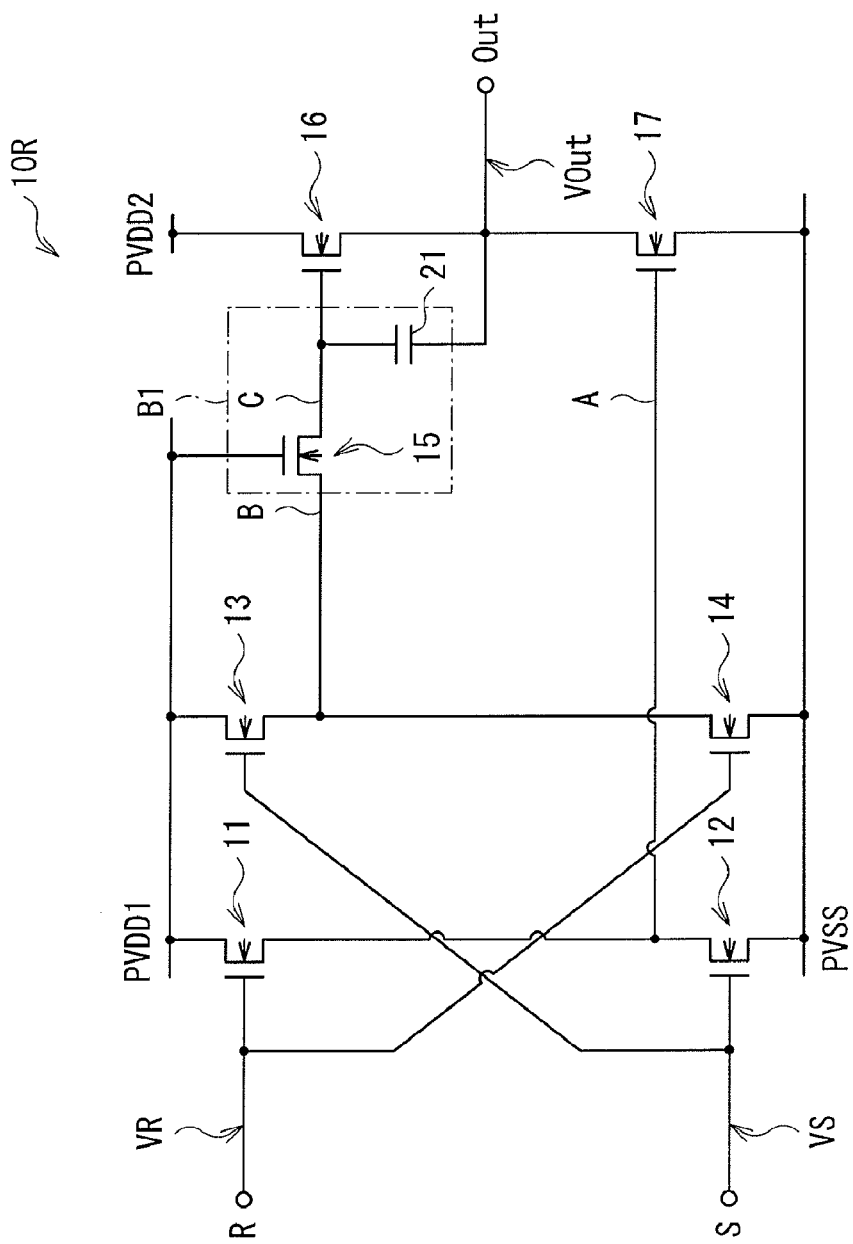
FIG. 3 is a circuit diagram illustrating an example of a configuration of a level shifter according to a comparative example.

FIG. 3 illustrates an example of a configuration of the level shifter 10R according to the comparative example. In the level shifter 10 according to the first embodiment described above, the capacitive elements 22 to 25 are provided, whereas in the level shifter 10R according to the comparative example, the capacitive elements 22 to 25 are not provided or omitted. The other configurations in the comparative example are similar to those of the above-described first embodiment illustrated in FIG. 1.

Figure 4:
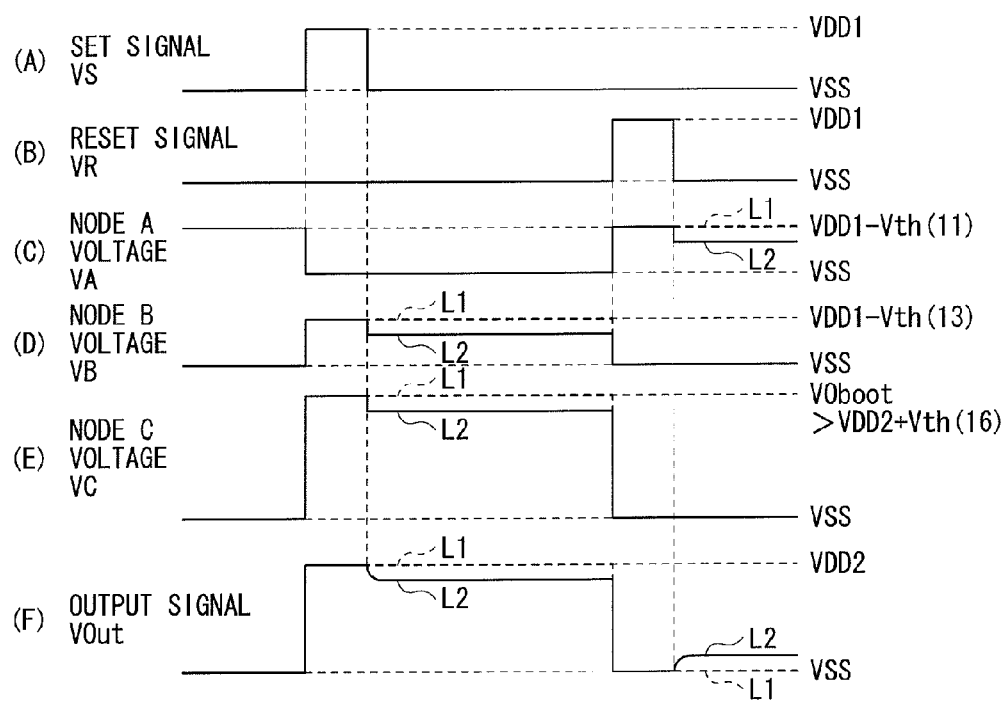
FIG. 4 is a timing waveform chart illustrating an operation example of the level shifter illustrated in FIG. 3.

FIG. 4 illustrates a timing waveform chart of an operation of the level shifter 10R, in which (A) illustrates a waveform of the set signal VS, (B) illustrates a waveform of the reset signal VR, (C) illustrates a waveform of the voltage VA in the node A, (D) illustrates a waveform of the voltage VB in the node B, (E) illustrates a waveform of the voltage VC in the node C, and (F) illustrates a waveform of the output signal VOut.

In the level shifter 10R, when the set signal VS falls ((A) of FIG. 4) after the set signal VS is raised and the output signal VOut is raised to the high level, the falling of the set signal VS is transmitted to the node B through the parasitic capacitance between the gate and the source of the MOS transistor 13. Thus, the voltage VB of the node B slightly decreases from the immediately-previous voltage (VDD1−Vth (13)), and that low voltage is still maintained even thereafter (a waveform L2 in (D) of FIG. 4). Thereby, the voltage VC of the node C also maintains the slightly-decreased voltage after the voltage VC of the node C has slightly decreased (the waveform L2 in (E) of FIG. 4), and likewise, the voltage of the output signal VOut consequently maintains the slightly-decreased voltage after the voltage of the output signal VOut has slightly decreased (the waveform L2 in (F) of FIG. 4).

Thereafter, when the reset signal VR falls ((B) of FIG. 4) after the reset signal VR is raised and the output signal Vout falls to the low level, the falling of the reset signal VR is transmitted to the node A through the parasitic capacitance between the gate and the source of the MOS transistor 11. Thus, the voltage VA of the node A slightly decreases from the immediately-previous voltage (VDD1−Vth (11)), and that low voltage is still maintained even thereafter (the waveform L2 in (C) of FIG. 4). At this time, in a case where the MOS transistor 17 no longer sufficiently maintains the ON state due to the fact that the voltage VA of the node A is turned out to be less than the threshold voltage Vth (17) of the MOS transistor 17, the output signal VOut may slightly rise depending on a state of load in the output terminal Out of the level shifter 10R (the waveform L2 in (F) of FIG. 4).

For the reasons set forth above, in the level shifter 10R, the voltage changes occur in the voltage VB of the node B, the voltage VC of the node C, and the output signal VOut when the set signal VS which is inputted falls, and these states are consequently maintained. Also, the voltage changes occur in the voltage VA of the node A and the output signal VOut when the reset signal VR which is inputted falls, and these are consequently maintained. In each of the waveforms L2 thereof, a change occurs between the high level voltage and the low level voltage, and the amplitude is lowered in mid-course, for example. Hence, in each of the waveforms L2 thereof, a quality of the waveform is degraded as compared with the waveform L1 which is based on an ideal operation. Thus, in the level shifter 10R, a noise margin is decreased due to the degradation of the waveforms in the internal signals, and may likely to cause malfunction or errors. Also, in the level shifter 10R, the degradation of the waveform in the output signal may likely to cause malfunction or errors in a circuit connected in a succeeding stage.

In contrast, in the level shifter 10 according to the first embodiment, the voltage changes in the voltage VB of the node B, the voltage VC of the node C, and the output signal VOut, which occur in the falling of the set signal VS which is inputted, are cancelled by the rising of the immediately-subsequently-input inversion-set signal VSb. Also, the voltage changes in the voltage VA of the node A and the output signal VOut, which occur in the falling of the input reset signal VR, are cancelled by the rising of the immediately-subsequently-input inversion-reset signal VRb. Thus, the level shifter 10 makes it possible to allow the waveforms in the internal signals to have proper or well-shaped waveforms to prevent malfunction or errors and to achieve stable operation. Also, the level shifter 10 makes it possible to allow the waveform in the output signal to have proper or well-shaped waveform to prevent malfunction or errors in a circuit connected in a succeeding stage.

Now, description will be given on resistance against leakage. As described above, the level shifter 10R does not have the function of changing the voltage VC of the node C by the inversion-set signal VSb. Hence, the level shifter 10R is low in resistance against the leakage as described below.

Figure 17:
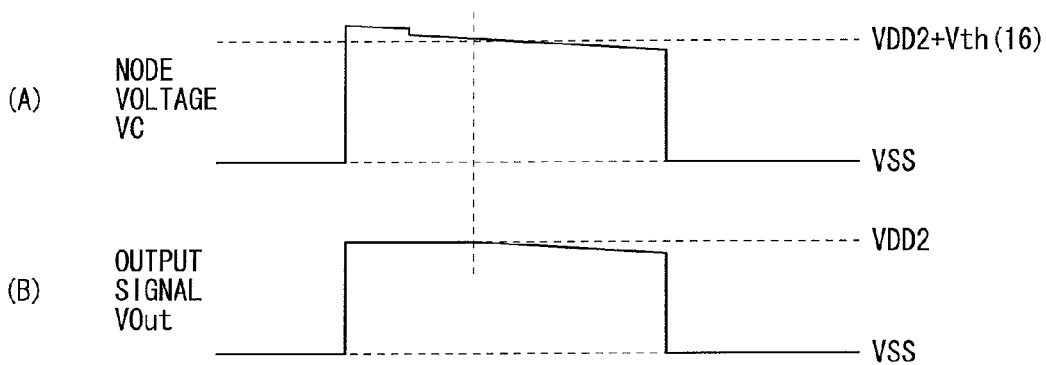
FIG. 17 is a timing waveform chart illustrating a detailed operation of the level shifter illustrated in FIG. 3.

FIG. 17 illustrates a timing waveform chart of an operation when the output signal VOut is raised to the high level in the level shifter 10R, in which (A) illustrates a waveform of the voltage VC in the node C, and (B) illustrates a waveform of the output signal VOut.

As illustrated in (A) of FIG. 17, the voltage VC of the node C gradually decreases due to the leakage after the rising from the voltage VSS to be at the high level by the bootstrap operation. Then, at some point, the voltage VC of the node C falls below the voltage (VDD2+Vth (16)). As for the output signal VOut, a voltage level thereof gradually decreases from then on as illustrated in (B) of FIG. 17 accordingly, and an output amplitude gradually decreases.

The same is true for a case when the output signal VOut is at the low level. That is, in the level shifter 10R, the voltage VA of the node A slightly decreases in the falling of the reset signal VR as illustrated in FIG. 4, and the slightly-decreased voltage is maintained thereafter ((C) of FIG. 4). At this time, when, in FIG. 3, the electric charges in the node A which is in the floating state is subjected to the leakage through the MOS transistor 12 for example, the voltage VA of the node A gradually decreases with an elapse of time. At this time, in a case where the MOS transistor 17 no longer sufficiently maintains the ON state due to the fact that the voltage VA of the node A is turned out to be less than the threshold voltage Vth (17) of the MOS transistor 17, the output signal VOut may slightly rise from the voltage VSS depending on a state of load in the output terminal Out of the level shifter 10R, and the output amplitude is likely to decrease.

For these reasons, in the level shifter 10R according to the comparative example, the amplitude of the output signal VOut is likely to decrease with an elapse of time when the electric charges in the nodes C and A are subjected to the leakage. Hence, the level shifter 10R may likely to cause malfunction or errors in a circuit connected in a succeeding stage. That is, the level shifter 10R according to the comparative example is low in resistance against the leakage.

In contrast, the level shifter 10 according to the first embodiment is high in resistance against the leakage and the output amplitude is less likely to decrease as compared with the level shifter 10R according to the comparative example. Hence, malfunction or errors is less likely to occur in a circuit connected in a succeeding stage.

[Result]

Thus, according to the first embodiment described above, the capacitive elements 22 to 25 are provided, the inversion-set signal is transmitted to the node B through the capacitive element 22, and the inversion-reset signal is transmitted to the node A through the capacitive element 24. Hence, the voltage changes in the internal signals and the output signal due to the set signal and the reset signal are cancelled. Therefore, it is possible to achieve the proper or well-shaped internal waveforms and the proper or well-shaped output waveform.

Also, the MOS transistors, connected in series between the power source PVDD1 and the power source PVSS and between the power source PVDD2 and the power source PVSS, operate in a complementary fashion. Hence, a static through-current does not flow. Therefore, it is possible to achieve low-power consumption.

Further, the output sections are caused to perform the bootstrap operation. Therefore, it is possible to output the signal having the larger amplitude than that of the input signal.

[First Modification]

In the first embodiment described above, the high level voltages VIH of the inversion-set signal VSb and the inversion-reset signal VRb are set at the voltages VDD1, and the low level voltages VIL thereof are set at the voltages VSS, although it is not limited thereto. Each of the high level voltages VIH and the low level voltages VIL thereof may be set at an optional voltage, in place of the voltages VDD1 and the VSS, for example. In this modification, the capacitance values of the capacitive elements 22 to 25 are determined using the Equations (2) and (3) to cancel the voltage changes of the internal signals and the output signal due to the set signal and the reset signal, as in the first embodiment described above.

According to this configuration, it is possible to adjust the high level voltage VIH and the low level voltage VIL of the inversion-set signal VSb and those of the inversion-reset signal VRb to change the voltage change amounts of the internal signals and that of the output signal, after a circuit is manufactured, for example. It is also possible to achieve a configuration, which constantly monitors the output waveform of the level shifter and which controls the high level voltage VIH and the low level voltage VIL of the inversion-set signal VSb and those of the inversion-reset signal VRb such that the degradation of the waveform does not occur.

[Second Modification]

In the first embodiment described above, the inversion-set signal VSb is a signal obtained by inverting the set signal VS, although it is not limited thereto. The inversion-set signal VSb can be any signal, as long as the signal satisfy the conditions that: the rising of the inversion-set signal VSb is at the same time as or after the falling of the set signal VS; and the falling of the inversion-set signal VSb is in a period in which the set signal VS is at the high level. Similarly, in the first embodiment described above, the inversion-reset signal VRb is a signal obtained by inverting the reset signal VR, although it is not limited thereto. The inversion-reset signal VRb can be any signal, as long as the signal satisfy the conditions that: the rising of the inversion-reset signal VRb is at the same time as or after the falling of the reset signal VR; and the falling of the inversion-reset signal VRb is in a period in which the reset signal VR is at the high level. Thus, the inversion-set signal VSb and the inversion-reset signal VRb do not necessarily have to be created by inverting the set signal VS and the reset signal VR, respectively, and existing optional signals satisfying the conditions are usable, for example. Therefore, it is possible to increase a degree of freedom of selection for the inversion-set signal VSb and the inversion-reset signal VRb.

[Third Modification]

Figure 5:
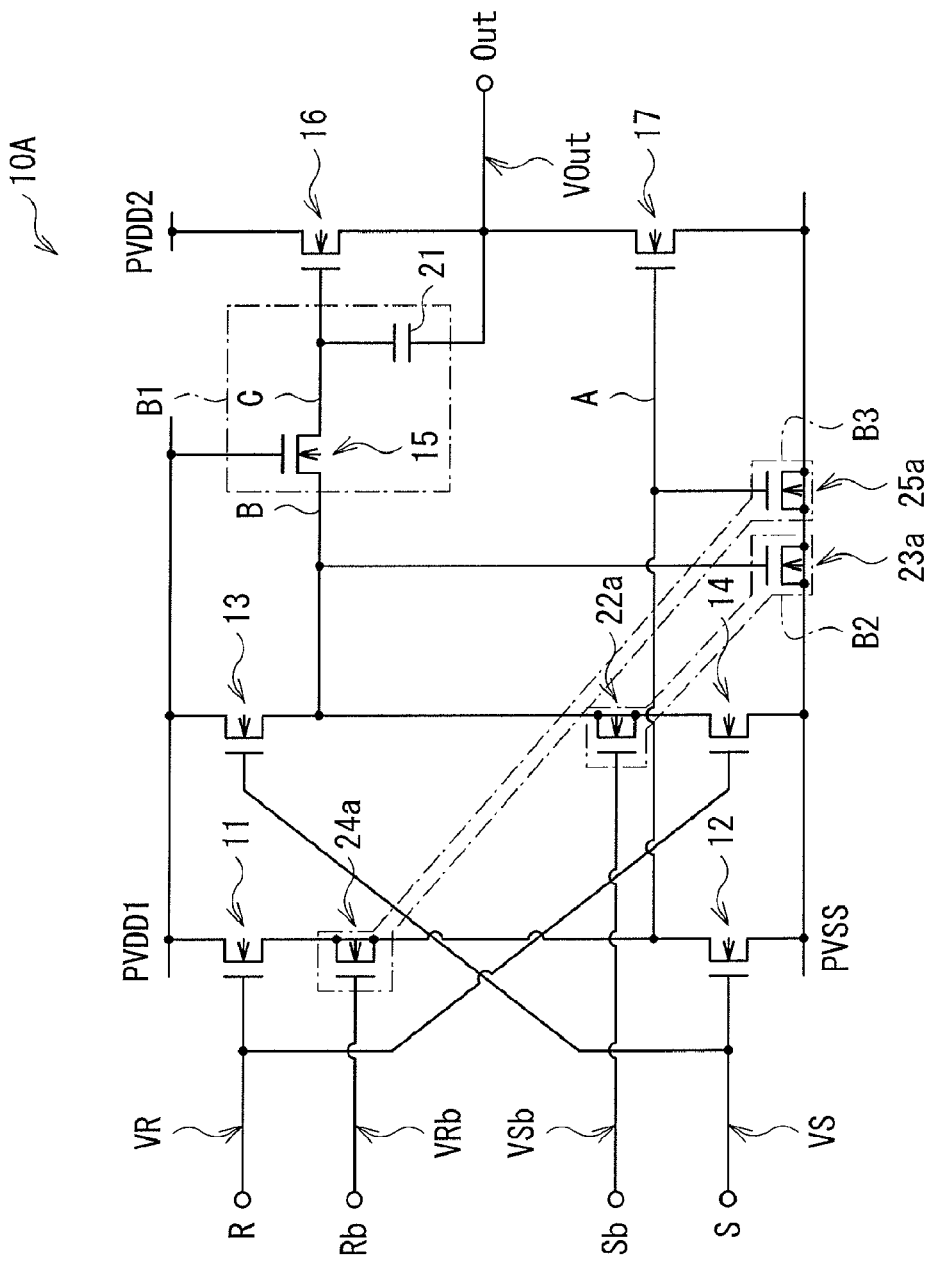
FIG. 5 is a circuit diagram illustrating an example of a configuration of a level shifter according to a third modification of the first embodiment.

In the first embodiment described above, the capacitive elements 22 to 25 are utilized to achieve the capacitances for transmitting the inversion-set signal VSb and the inversion-reset signal VRb into the circuit, although it is not limited thereto. For example, MOS transistors may be used to configure the capacitances, in place of the capacitive elements 22 to 25. FIG. 5 illustrates an example of a configuration of a level shifter 10A, which uses MOS transistors as the capacitances, according to a third modification. The level shifter 10A according to this modification utilizes gate oxide film capacitances of MOS transistors 22a to 25a to configure the capacitances.

In general, the parasitic capacitances of the MOS transistors vary by process variability as with the capacitances utilizing the MOS transistors. The configuring of the capacitances using the MOS transistors as illustrated in FIG. 5 allows the parasitic capacitances of the MOS transistors and the capacitances utilizing the MOS transistors to vary similarly. Hence, an influence on characteristics is small. That is, it is possible to increase resistance against the process variability with the configuration illustrated in FIG. 5.

[Fourth Modification]

Figure 6:
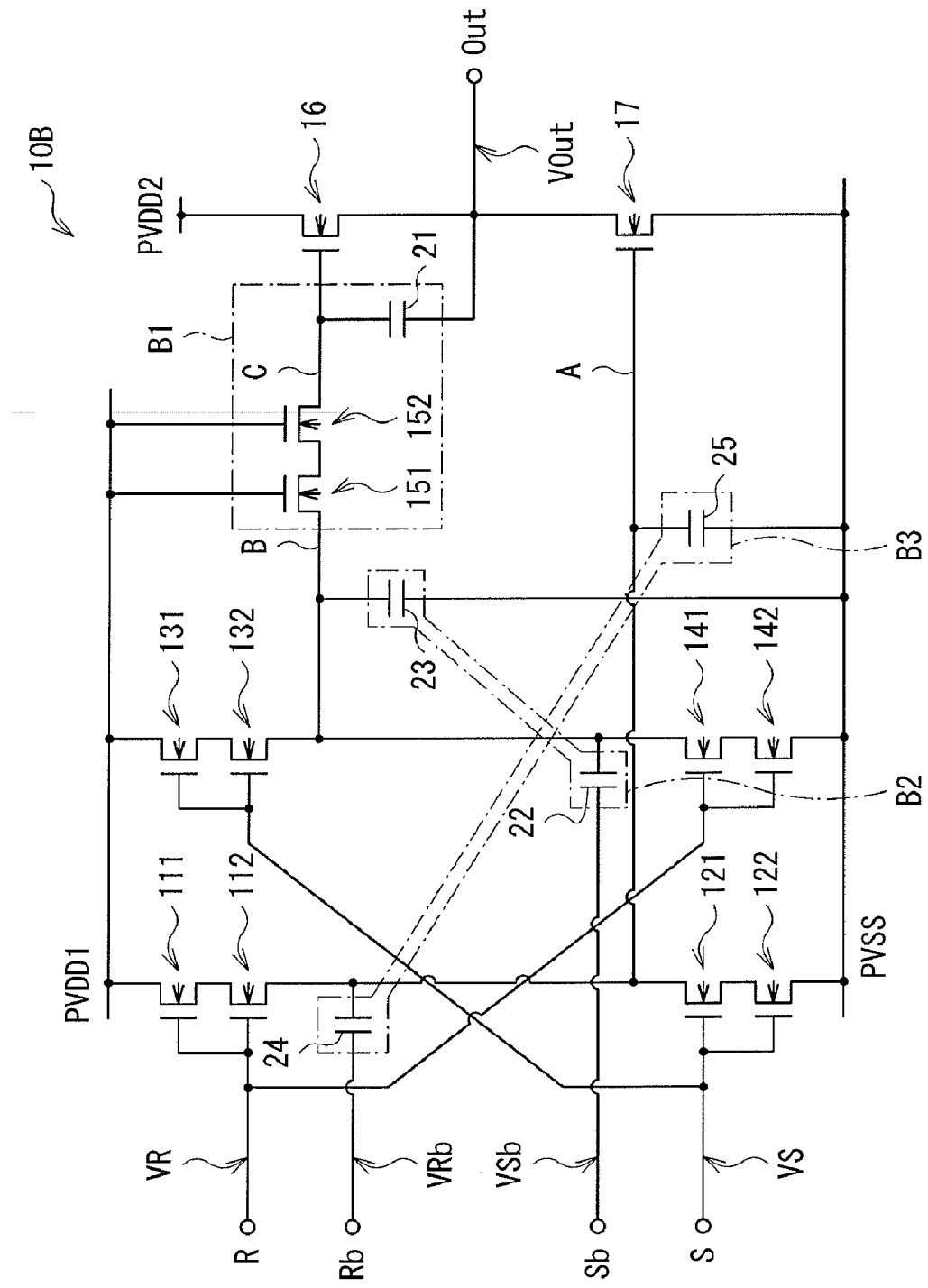
FIG. 6 is a circuit diagram illustrating an example of a configuration of a level shifter according to a fourth modification of the first embodiment.

In the first embodiment described above, the single-gate MOS transistors are used, although it is not limited thereto. For example, double-gate MOS transistors or triple-gate MOS transistors may be used, in place of the single-gate MOS transistors. FIG. 6 illustrates an example of a configuration of a level shifter 10B, which uses double-gate MOS transistors, according to a fourth modification. In the level shifter 10B according to this modification, the MOS transistors 11 to 15 in the level shifter 10 according to the first embodiment are replaced by the double-gate MOS transistors. Thereby, it is possible to reduce a leakage current in the OFF state of the MOS transistors, and to achieve low-power consumption.

[Fifth Modification]

Figure 7:
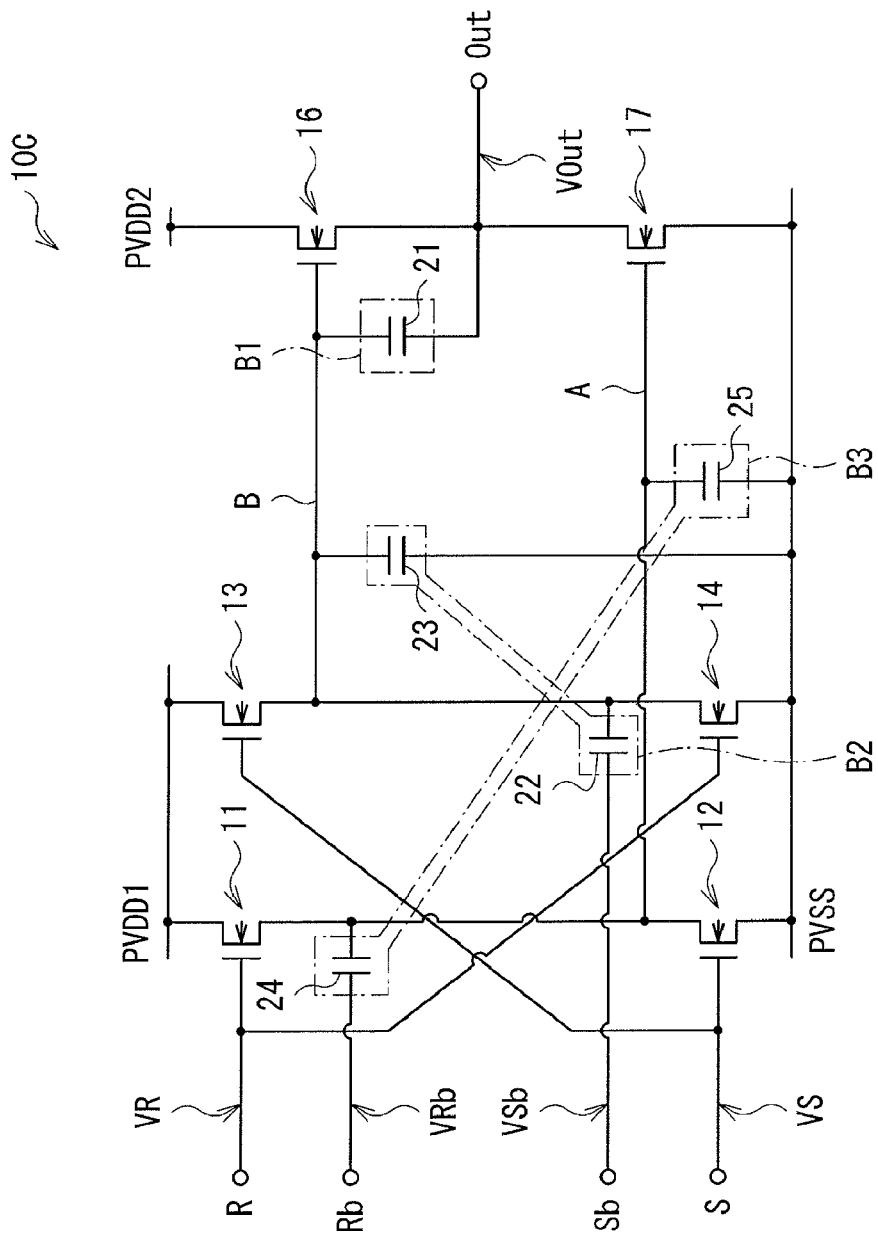
FIG. 7 is a circuit diagram illustrating an example of a configuration of a level shifter according to a fifth modification of the first embodiment.

In the first embodiment described above, the MOS transistor 15 is used to allow the node B and the node C to be electrically insulated at the time of the bootstrap operation, although it is not limited thereto. For example, the MOS transistor 15 may not be provided as illustrated in FIG. 7. Thereby, it is possible to achieve a level shifter with the reduced number of elements.

Figure 8:
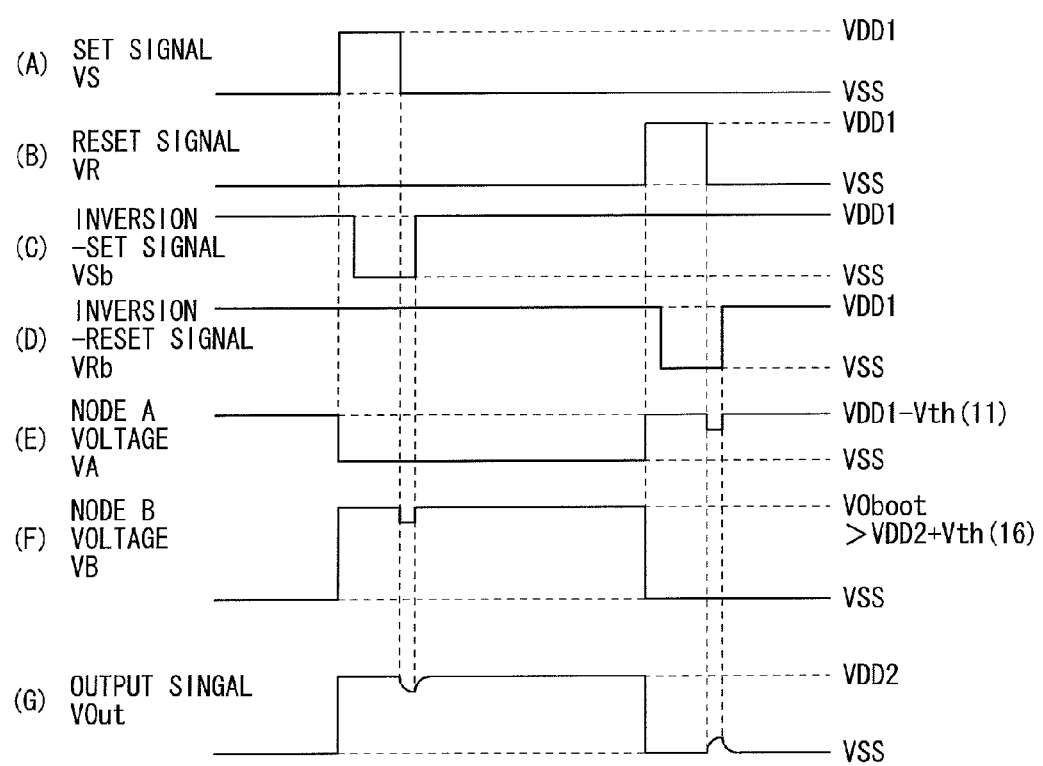
FIG. 8 is a timing waveform chart illustrating an operation example of the level shifter illustrated in FIG. 7.

FIG. 8 illustrates a timing waveform chart of an operation of a level shifter 10C, in which (A) illustrates a waveform of the set signal VS, (B) illustrates a waveform of the reset signal VR, (C) illustrates a waveform of the inversion-set signal VSb, and (D) illustrates a waveform of the inversion-reset signal VRb. Further, (E) illustrates a waveform of the voltage VA in the node A, (F) illustrates a waveform of the voltage VB in the node B, and (G) illustrates a waveform of the output signal VOut. In the level shifter 10C according to the fifth modification, the rising of the set signal VS allows the output signal VOut to be at the voltage VDD2 (high level), and the voltage level of the output signal VOut is substantially maintained even when the set signal VS has fallen as in the level shifter 10 according to the first embodiment described above. Thereafter, the rising of the reset signal VR allows the output signal VOut to be at the voltage VSS (low level), and the voltage level of the output signal VOut is substantially maintained even when the reset signal VR has fallen.

In the shift resistor 10C according to the fifth modification, the MOS transistor 15 is eliminated. Thus, a capacitance load seen by the MOS transistors 13 and 14 is increased, and a speed of operation may become slightly slow. Hence, it is preferable, but not required, that the level shifter 10C be applied to applications where fast operation speed is not desired. The level shifter 10C is thus structured by the reduced number of elements. Therefore, it is possible to achieve a reduction in size of a circuit.

[Sixth Modification]

Figure 9:
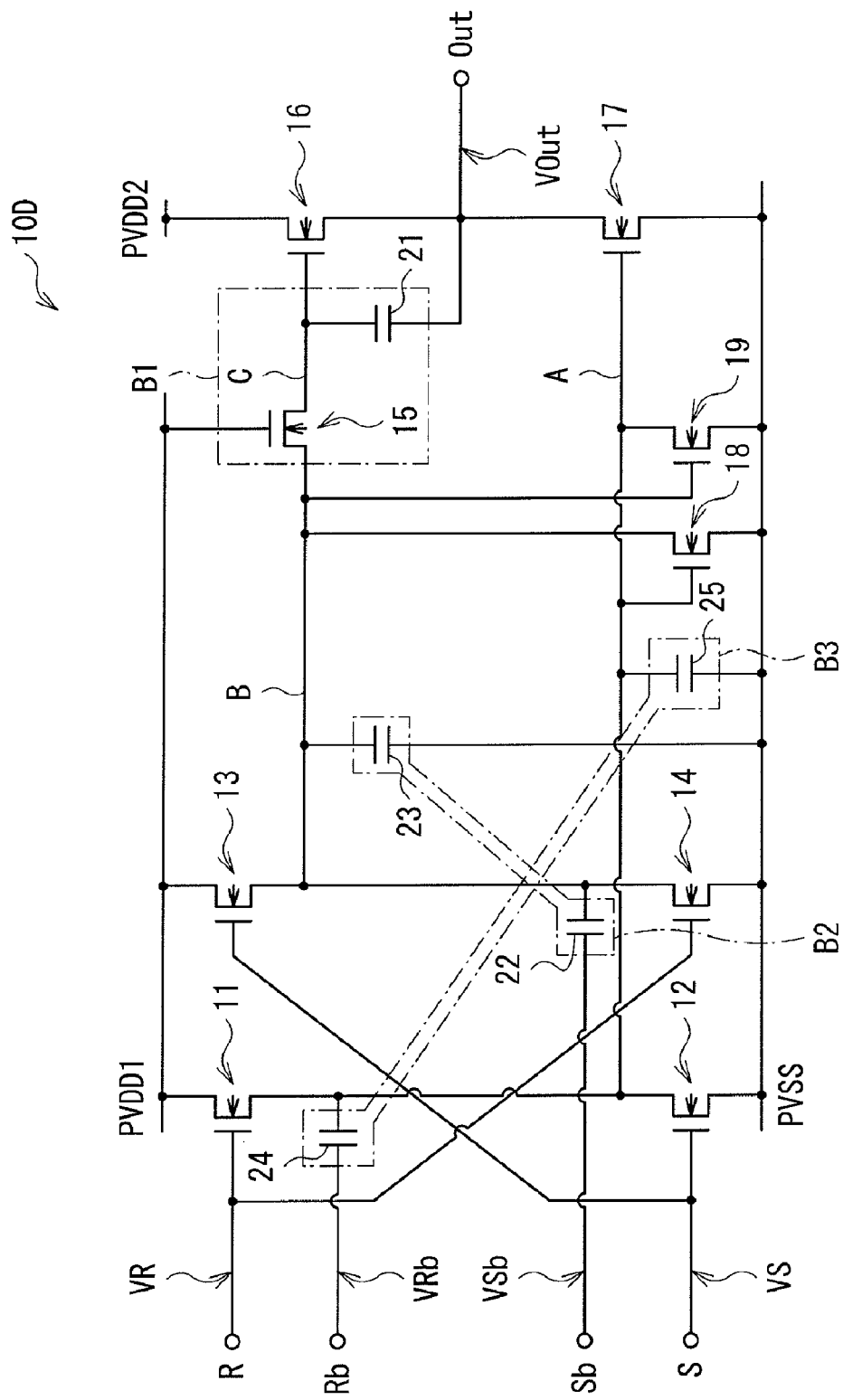
FIG. 9 is a circuit diagram illustrating an example of a configuration of a level shifter according to a sixth modification of the first embodiment.

In the first embodiment described above, the capacitive elements 22 to 25 are provided for the purpose of improving the degradation of waveforms of the node A and the node B. For example, elements may be further added. FIG. 9 illustrates an example of a configuration of a level shifter 10D according to a sixth modification, in which MOS transistors are newly added to each of the node A and the node B. The level shifter 10D according to the sixth modification is provided with a MOS transistor 18 and a MOS transistor 19. The MOS transistor 18 includes a gate connected to the node A, a drain connected to the node B, and a source connected to the power source PVSS. The MOS transistor 19 includes a gate connected to the node B, a drain connected to the node A, and a source connected to the power source PVSS.

In the level shifter 10R according to the comparative example illustrated in FIG. 3, the set signal VS is transmitted to the node B through the parasitic capacitance between the gate and the source of the MOS transistor 13, and the reset signal VR is transmitted to the node A through the parasitic capacitance between the gate and the source of the MOS transistor 11, by which the waveforms in the node A and the node B degrade, as described above. A similar phenomenon may occur in the MOS transistors 12 and 14 as well. That is, the set signal VS may be transmitted to the node A through a parasitic capacitance between the drain and the gate of the MOS transistor 12, and the reset signal VR may be transmitted on the node B through a parasitic capacitance between the drain and the gate of the MOS transistor 14 to possibly change the voltages in the node A and the node B.

As will be described below, the voltage change may occur in each of the node A and the node B through the parasitic capacitance between the drain and the gate of each of the MOS transistor 12 and the MOS transistor 14, even in the level shifter 10 according to the first embodiment illustrated in FIG. 1 as well.

Figure 10:
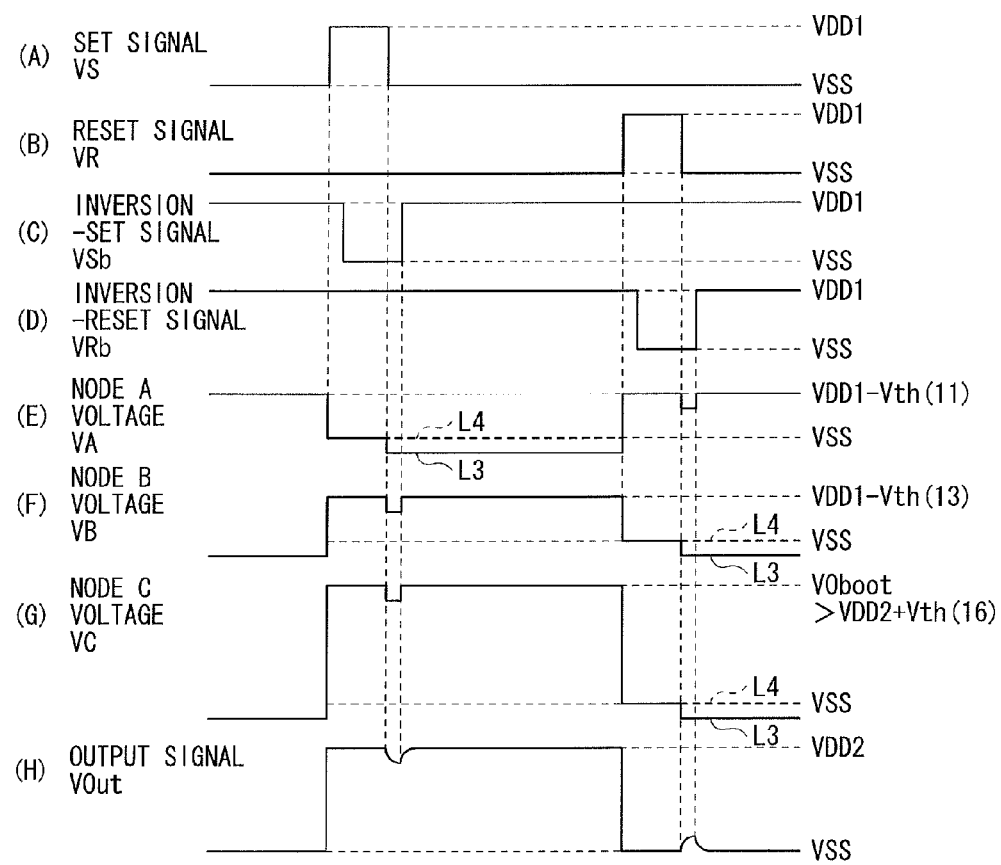
FIG. 10 is a timing waveform chart illustrating an operation example of the level shifter illustrated in FIG. 9.

FIG. 10 illustrates a timing waveform chart of an operation of the level shifter 10 according to the first embodiment, with taking into consideration the parasitic capacitance between the drain and the gate of each of the MOS transistors 12 and 14, in which (A) illustrates a waveform of the set signal VS, (B) illustrates a waveform of the reset signal VR, (C) illustrates a waveform of the inversion-set signal VSb, and (D) illustrates a waveform of the inversion-reset signal VRb. Further, (E) illustrates a waveform of the voltage VA in the node A, (F) illustrates a waveform of the voltage VB in the node B, (G) illustrates a waveform of the voltage VC in the node C, and (H) illustrates a waveform of the output signal VOut.

In the level shifter 10 according to the first embodiment, when the set signal VS falls ((A) of FIG. 10) after the set signal VS is raised and the output signal VOut is raised to the high level, the falling of the set signal VS may be transmitted to the node A through the parasitic capacitance between the drain and the gate of the MOS transistor 12. Thus, the voltage VA of the node A may slightly decrease from the immediately-previous voltage VSS, and that slightly-decreased voltage may still be maintained even thereafter (a waveform L3 in (E) of FIG. 10). That is, the voltage VB of the node B is cancelled by the rising of the immediately-subsequently-input inversion-set signal VSb as described above ((F) of FIG. 10), but the voltage VA of the node A may not be cancelled to consequently maintain its state.

Thereafter, when the reset signal VR falls ((B) of FIG. 10) after the reset signal VR is raised and the output signal VOut falls to the low level, the falling of the reset signal VR may be transmitted to the node B through the parasitic capacitance between the drain and the gate of the MOS transistor 14. Thus, the voltage VB of the node B may slightly decrease from the immediately-previous voltage VSS, and that slightly-decreased voltage may still be maintained even thereafter (the waveform L3 in (F) of FIG. 10). That is, the voltage VA of the node A is cancelled by the rising of the immediately-subsequently-input inversion-reset signal VRb as described above ((E) of FIG. 10), but the voltage VB of the node B may not be cancelled to consequently maintain its state.

Each of the voltage change in the node A (the waveform L3 in (E) of FIG. 10) and that in the node B (the waveform L3 in (F) of FIG. 10) is a voltage change which so changes as to increase the amplitude of the internal waveform thereof. Thus, a noise margin is ensured, and a stability of a circuit will not be decreased. Also, the voltage changes thereof do not influence the waveform of the output signal VOut.

On the other hand, falling of the voltage VA of the node A and that of the voltage VB of the node B below the voltages VSS mean that, when the MOS transistors 16 and 17 are to be turned OFF, voltages Vgs between the gates and the sources thereof become negative. Thus, a leakage current between the drain and the source in the OFF state may be generated.

Figure 11:
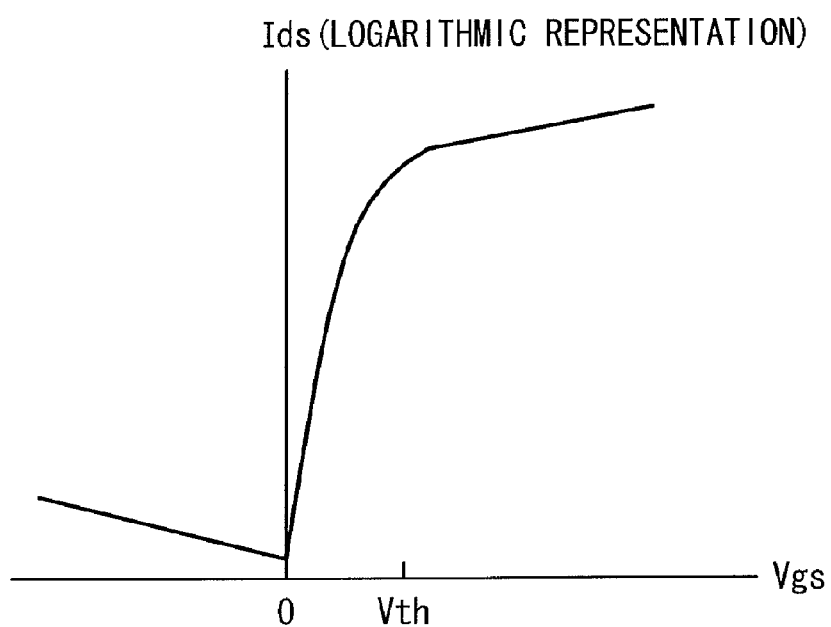
FIG. 11 is a characteristic diagram illustrating an example of a static characteristic of an N-channel MOS transistor.

FIG. 11 represents a static characteristic (Ids-Vgs characteristic) of an ordinary N-channel MOS transistor. In a region in which the gate-source voltage Vgs is positive, a drain-source current Ids increases in an exponential fashion, and in particular, the MOS transistor is turned ON when the gate-source voltage exceeds a threshold voltage Vth. On the other hand, in a region in which the gate-source voltage Vgs is negative, the drain-source current Ids tends to increase more by the leakage current as the gate-source voltage Vgs decreases more.

Referring to FIG. 9, the MOS transistors 16 and 17, which are connected in series between the power source PVDD2 and the power source PVSS, operates complementary as described above. That is, one of the MOS transistors 16 and 17 is in an OFF state when the other of the MOS transistors 16 and 17 is in an ON state. Thus, when there is a leakage current between the drain and the source of the MOS transistor which is in the OFF state, a through-current of an amount corresponding to the leakage current flows between the power source PVDD2 and the power source PVSS, and thereby power consumption consequently increases.

Thus, by focusing on the fact that when one of the voltage in the node A and the voltage in the node B (the node C) is at the high level, the other of the voltage in the node A and the voltage in the node B (node C) is at the low level, the level shifter 10D according to the sixth modification utilizes the MOS transistors 18 and 19 to set the voltage VB of the node B (the voltage VC of the node C) to be at the voltage VSS when the voltage VA of the node A is at the high level, and to set the voltage VA of the node A to be at the voltage VSS when the voltage VB of the node B (the voltage VC of the node C) is at the high level (a characteristic L4 in FIG. 10). Thereby, it is possible to prevent the increase in the power consumption due to the leakage current.

[Seventh Modification]

In the first embodiment described above, the N-channel MOS transistors are used as the MOS transistors, although it is not limited thereto. For example, P-channel MOS transistors may be used for the MOS transistors, in place of the N-channel MOS transistors.

Figure 12:
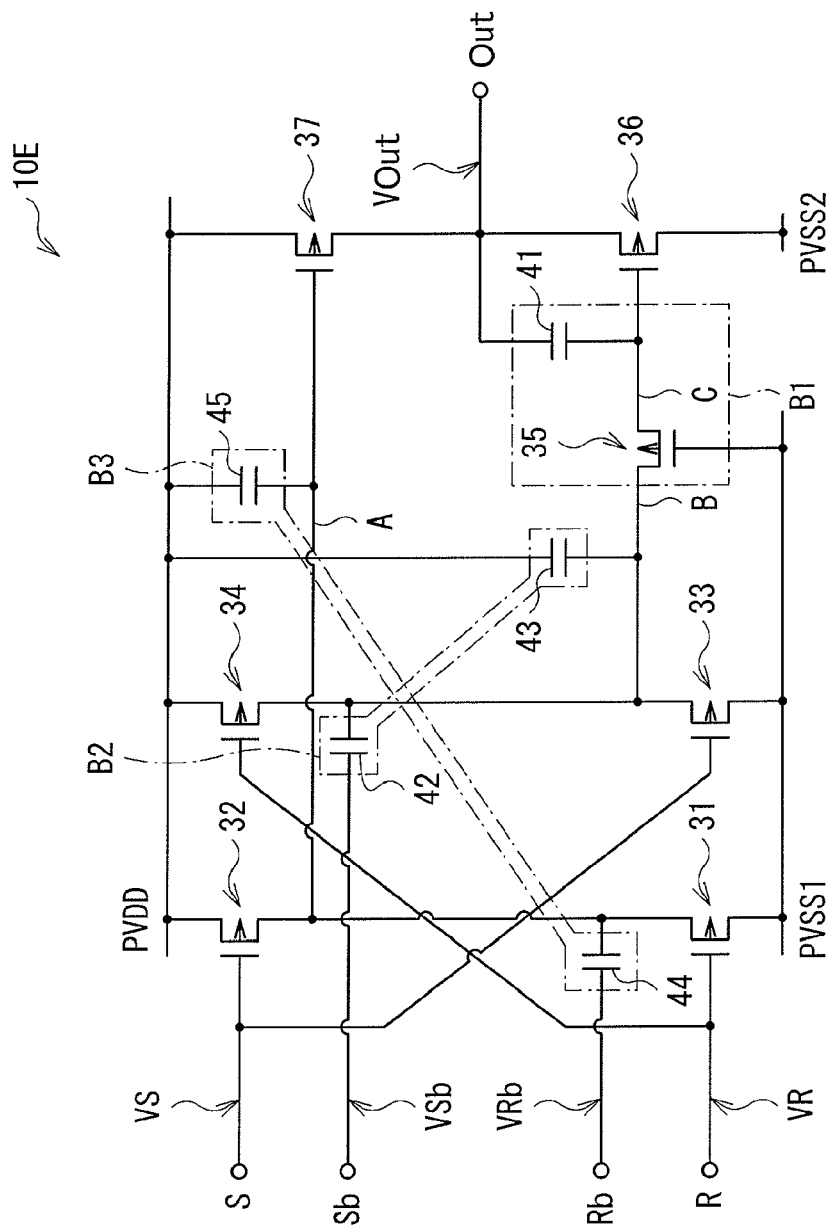
FIG. 12 is a circuit diagram illustrating an example of a configuration of a level shifter according to a seventh modification of the first embodiment.

FIG. 12 illustrates an example of a configuration of a level shifter 10E according to the seventh modification. The level shifter 10E has a configuration in which the NMOS transistors of the level shifter 10 according to the first embodiment are replaced directly with the PMOS transistors, and voltage axes of an input-output signal waveform and an internal signal waveform are inverted accordingly. The level shifter 10E operates similarly as the level shifter 10 according to the first embodiment.

A MOS transistor 31 includes a gate connected to the input terminal R, a drain connected to a power source PVSS1, and a source connected to the node A. The MOS transistor 31 has an unillustrated parasitic capacitance between the gate and the source. A MOS transistor 32 includes a gate connected to the input terminal S, a drain connected to the node A, and a source connected to a power source PVDD. A MOS transistor 33 includes a gate connected to the input terminal S, a drain connected to the power source PVSS1, and a source connected to the node B. The MOS transistor 33 has an unillustrated parasitic capacitance between the gate and the source. A MOS transistor 34 includes a gate connected to the input terminal R, a drain connected to the node B, and a source connected to the power source PVDD. A MOS transistor 35 includes a gate connected to the power source PVSS1, a drain, and a source, in which one of the drain and the source is connected to the node B and the other of the drain and the source is connected to the node C. A MOS transistor 36 includes a gate connected to the node C, a drain connected to a power source PVSS2 having a voltage VSS2 which is lower than a voltage VSS1 of the power source PVSS1, and a source connected to the output terminal Out. A MOS transistor 37 includes a gate connected to the node A, a drain connected to the output terminal Out, and a source connected to the power source PVDD.

A capacitive element 41 is inserted between the gate and the source of the MOS transistor 36. A capacitive element 42 is inserted between the input terminal Sb and the node B. A capacitive element 43 is inserted between the node B and the power source PVDD. A capacitive element 44 is inserted between the input terminal Rb and the node A. A capacitive element 45 is inserted between the node A and the power source PVDD.

The power source PVSS1 supplies power to sections other than output sections (i.e., the MOS transistors 36 and 37) of the level shifter 10E, and the power source PVSS2 supplies power to those output sections. The power source PVSS2 serves to set a low level voltage for the output signal VOut of the level shifter 10E, and to drive a circuit connected in a succeeding stage.

Figure 13:
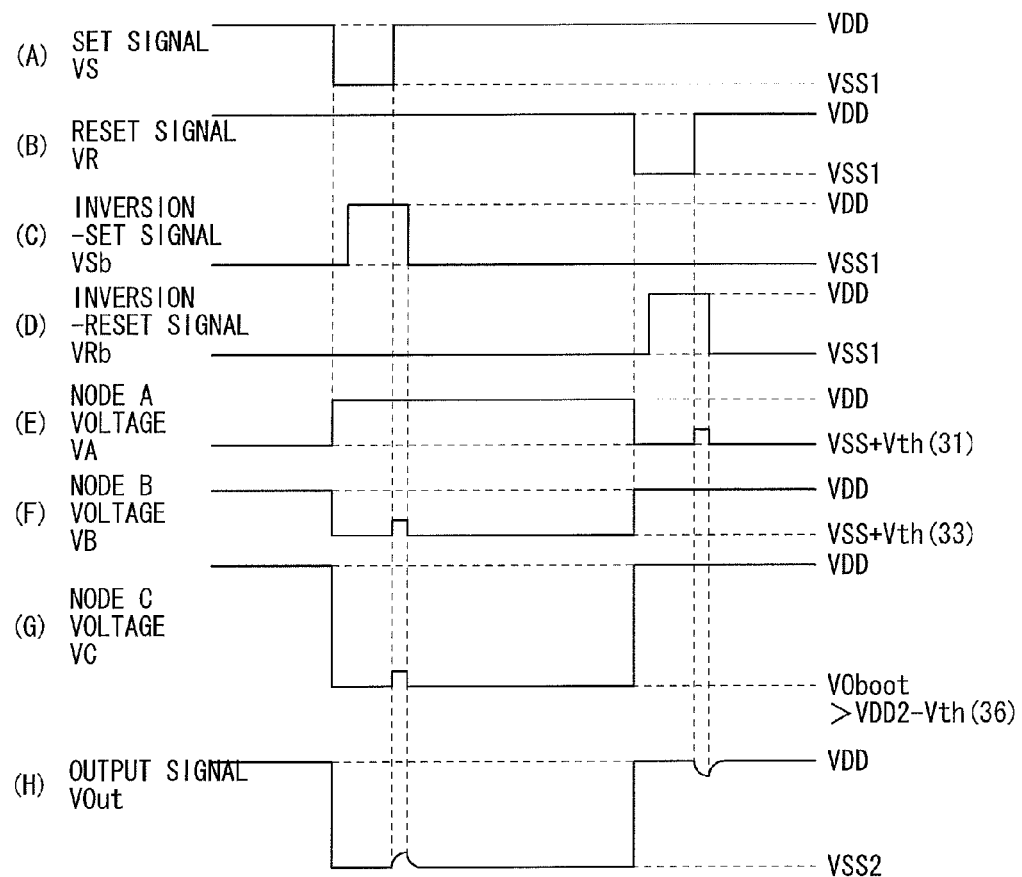
FIG. 13 is a timing waveform chart illustrating an operation example of the level shifter illustrated in FIG. 12.

FIG. 13 illustrates a timing waveform chart of an operation of the level shifter 10E, in which (A) illustrates a waveform of the set signal VS, (B) illustrates a waveform of the reset signal VR, (C) illustrates a waveform of the inversion-set signal VSb, and (D) illustrates a waveform of the inversion-reset signal VRb. Further, (E) illustrates a waveform of the voltage VA in the node A, (F) illustrates a waveform of the voltage VB in the node B, (G) illustrates a waveform of the voltage VC in the node C, and (H) illustrates a waveform of the output signal VOut.

First, the set signal VS falls ((A) of FIG. 13) to perform the bootstrap operation, and the voltage VC of the node C falls to a lower potential than the voltage VSS2 ((G) of FIG. 13), and the output signal VOut is at the voltage VSS2 (i.e., at the low level) ((H) of FIG. 13). When the set signal VS is raised ((A) of FIG. 13), voltage changes occur in the voltage VB of the node B and the voltage VC of the node C accordingly, although voltage changes in a reverse direction occurs due to immediately-subsequent falling of the inversion-set signal VSb, thereby cancelling those voltage changes ((G) of FIG. 13). Hence, the output signal VOut is maintained at the voltage VSS2 ((H) of FIG. 13).

Then, falling of the reset signal VR ((B) of FIG. 13) allows the voltage VC of the node C to be raised ((G) of FIG. 13), and the voltage VA of the node A decreases ((E) of FIG. 13), and the output signal VOut is at the voltage VDD (i.e., at the high level) ((H) of FIG. 13). When the reset signal VR is raised, a voltage change occurs in the voltage VA of the node A accordingly, although a voltage change in a reverse direction occurs due to immediately-subsequent falling of the inversion-reset signal VRb, thereby cancelling those voltage changes ((E) of FIG. 13). Hence, the output signal VOut is maintained at the voltage VDD ((H) of FIG. 13).

Thus, according to the seventh modification, the capacitive elements 42 to 45 are provided, the inversion-set signal VSb is transmitted to the node B through the capacitive element 42, and the inversion-reset signal VRb is transmitted to the node A through the capacitive element 44, in a similar fashion as the first embodiment described above. Hence, the voltage changes in the internal signals and the output signal due to the set signal VS and the reset signal VR are cancelled. Therefore, it is possible to prevent malfunction or errors and to achieve stable operation.

2. Second Embodiment

Hereinafter, a level shifter according to a second embodiment will be described. In the second embodiment, the voltage change amounts of the internal waveforms achieved by the inversion-set signal and the inversion-reset signal are made larger than those in the first embodiment described above. That is, in the second embodiment, the capacitance ratio of the capacitive elements 22 and 23 and the capacitance ratio of the capacitive elements 24 and 25 in the level shifter 10 according to the above-described first embodiment illustrated in FIG. 1 are modified to structure a level shifter 20, for example. The capacitance ratio of the capacitive elements 22 and 23 is so set that the transmission amount TS expressed in the Equation (2) becomes larger than that in the first embodiment. Also, the capacitance ratio of the capacitive elements 24 and 25 is so set that the transmission amount TR expressed in the Equation (3) becomes larger than that in the first embodiment. The other configurations are similar to those of the above-described first embodiment illustrated in FIG. 1. Therefore, a reference is made to FIG. 1 for a description of a circuit structure of the level shifter 20 according to this embodiment, and the description thereof will not be given in detail where appropriate.

[Operation and Effect]

Figure 14:
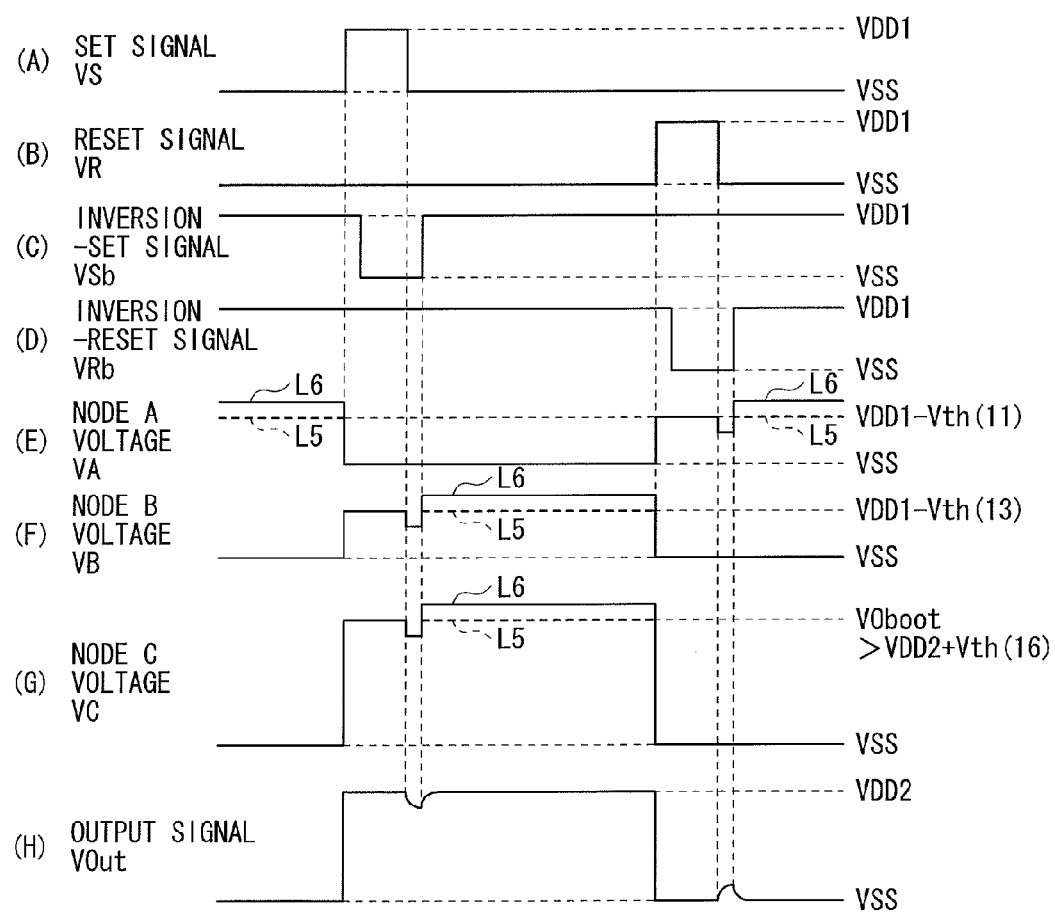
FIG. 14 is a timing waveform chart illustrating an operation example of a level shifter according to a second embodiment.

FIG. 14 illustrates a timing waveform chart of an operation of the level shifter 20, in which (A) illustrates a waveform of the set signal VS, (B) illustrates a waveform of the reset signal VR, (C) illustrates a waveform of the inversion-set signal VSb, and (D) illustrates a waveform of the inversion-reset signal VRb. Further, (E) illustrates a waveform of the voltage VA in the node A, (F) illustrates a waveform of the voltage VB in the node B, (G) illustrates a waveform of the voltage VC in the node C, and (H) illustrates a waveform of the output signal VOut.

In the level shifter 20, when the set signal VS falls ((A) of FIG. 14) after the set signal VS is raised and the output signal VOut is raised to the high level, the falling of the set signal VS is transmitted to the node B through the parasitic capacitance between the gate and the source of the MOS transistor 13. Thus, the voltage VB of the node B slightly decreases from the immediately-previous voltage (VDD1−Vth (13)) ((F) of FIG. 14), and this causes the voltage VC of the node C to be slightly decreased from the immediately-previous voltage VOboot as well ((G) of FIG. 14). When the inversion-set signal VSb is raised immediately thereafter ((C) of FIG. 14), this rise in the voltage is transmitted to the node B through the capacitive element 22, and thus the voltage VB of the node B is raised to cancel a corresponding amount of the immediately-previous voltage decrease, and is further raised slightly ((F) of FIG. 14). Similarly, the voltage VC of the node C is raised to cancel a corresponding amount of the immediately-previous voltage decrease, and is further raised slightly (a waveform L6 in (G) of FIG. 14). Hence, the output signal VOut substantially maintains the voltage VDD2 ((H) of FIG. 14).

Thereafter, when the reset signal VR falls ((B) of FIG. 14) after the reset signal VR is raised and the output signal VOut falls to the low level, the falling of the reset signal VR is transmitted to the node A through the parasitic capacitance between the gate and the source of the MOS transistor 11. Thus, the voltage VA of the node A slightly decreases from the immediately-previous voltage (VDD1−Vth (11)) ((E) of FIG. 14). When the inversion-reset signal VRb is raised immediately thereafter ((D) of FIG. 14), this rise in the voltage is transmitted to the node A through the capacitive element 24, and thus the voltage VA of the node A is raised to cancel a corresponding amount of the immediately-previous voltage decrease, and is further raised slightly (the waveform L6 in (E) of FIG. 14). Thereby, the output signal VOut substantially maintains the voltage VSS ((H) of FIG. 14).

Now, description will be given on the resistance against the leakage of the electric charges charged in the capacitive element 21.

Figure 15:
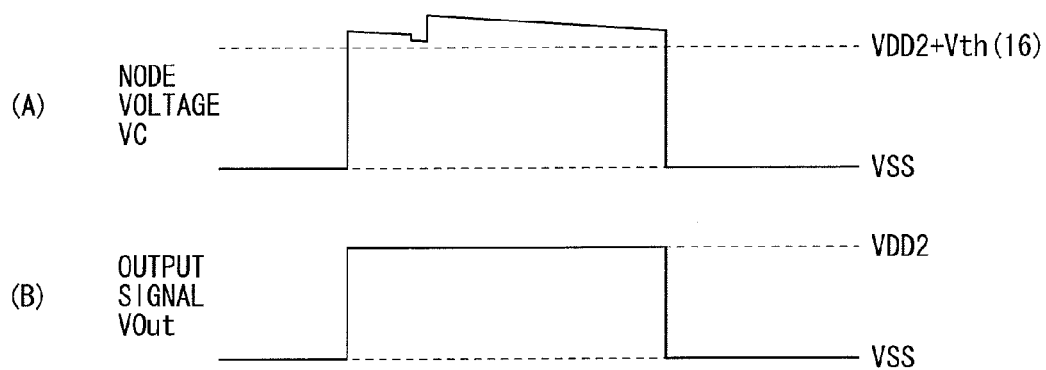
FIG. 15 is a timing waveform chart illustrating a detailed operation of the level shifter illustrated in FIG. 14.

FIG. 15 illustrates a timing waveform chart of an operation when the output signal VOut is raised to the high level in the level shifter 20, in which (A) illustrates a waveform of the voltage VC in the node C, and (B) illustrates a waveform of the output signal VOut.

As illustrated in FIG. (A) of FIG. 15, the voltage VC of the node C constantly exceeds the voltage (VDD2+Vth (16)), despite the fact that the voltage VC gradually decreases by the leakage after the rising from the voltage VSS to be at the high level by the bootstrap operation. Thereby, the output signal VOut is possible to maintain the voltage VDD2 throughout the exceeding period, as illustrated in (B) of FIG. 15.

This is because the voltage VC of the node C is raised or uplifted ((G) of FIG. 14) when the inversion-set signal VSb is raised ((C) of FIG. 14). That is, in the level shifter 20, the voltage VC of the node C is set to a level which is relatively high, so that the time it takes for the voltage VC to be decreased to the voltage (VDD2+Vth (16)) becomes long even when the voltage VC is dropped by the leakage. Thus, the resistance against the leakage improves.

The same is true for a case when the output signal VOut is at the low level. That is, in the level shifter 20, the voltage VA of the node A is set to be higher than the voltage (VDD1+Vth (11)) in the rising of the inversion-reset signal VR, as illustrated in FIG. 14. At this time, when, in FIG. 1, the electric charges in the node A which is in the floating state is subjected to the leakage through the MOS transistor 12 for example, the voltage VA of the node A gradually decreases with an elapse of time. However, the voltage VA of the node A is set to be relatively high, so that the time it takes for the voltage VA to be decreased to the threshold voltage Vth (17) of the MOS transistor 17 becomes long even when the voltage VA is dropped by the leakage. Thus, the resistance against the leakage improves.

Thus, in the level shifter 20 according to the second embodiment, the amount of rise in the voltage VC of the node C in the rising of the inversion-set signal VSb is larger than that of the level shifter 10 according to the first embodiment. Hence, the time it takes for the voltage VC to be decreased to the voltage (VDD2+Vth (16)) becomes longer even when the voltage VC is dropped by the leakage. As a result, it is possible to further increase the resistance against the leakage.

[Result]

According to the second embodiment, the voltage change amounts of the internal waveforms achieved by the inversion-set signal and the inversion-reset signal are made larger. Therefore, it is possible to increase the resistance to the leakage. The other effects achieved by the second embodiment are similar to those of the first embodiment described above.

3. Third Embodiment

Hereinafter, a level shifter according to a third embodiment will be described. In the third embodiment, the bootstrap operation is performed not only on the output sections but also on input sections. Note that the same or equivalent elements as those of the shift resistors according to the embodiments and the modifications described above are denoted with the same reference numerals, and will not be described in detail.

Configuration Example

Figure 18:
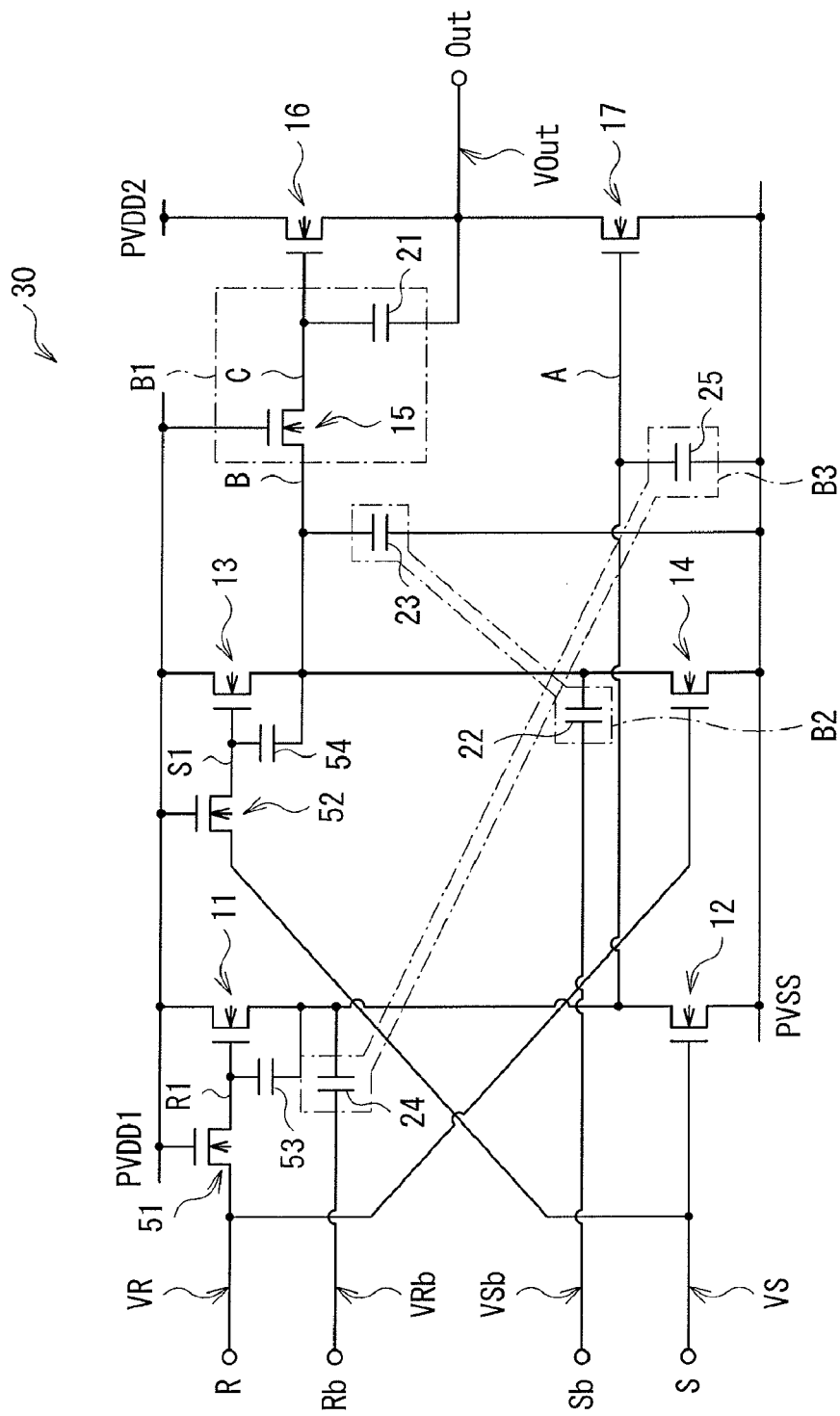
FIG. 18 is a circuit diagram illustrating an example of a configuration of a level shifter according to a third embodiment.

FIG. 18 illustrates an example of a configuration of a level shifter 30 according to the third embodiment. The level shifter 30 is provided with MOS transistors 51 and 52, and capacitive elements 53 and 54.

The MOS transistor 51 includes a gate connected to the power source PVDD1, a drain, and a source, in which one of the drain and the source is connected to the input terminal R and the other of the drain and the source is connected to the gate of the MOS transistor 11 through a node R1. The MOS transistor 52 includes a gate connected to the power source PVDD1, a drain, and a source, in which one of the drain and the source is connected to the input terminal S and the other of the drain and the source is connected to the gate of the MOS transistor 13 through a node S1.

The capacitive element 53 is inserted between the gate and the source of the MOS transistor 11. The capacitive element 53 serves to perform the bootstrap operation. More specifically, the capacitive element 53 functions to allow a voltage VR1 of the gate (i.e., the node R1) of the MOS transistor 11 to be higher than the voltage VDD1, so as to allow the voltage of the source of the MOS transistor 11 to output the voltage VDD1 of the power source PVDD1 when the reset signal VR is at the high level.

The capacitive element 54 is inserted between the gate and the source of the MOS transistor 13. The capacitive element 54 serves to perform the bootstrap operation, as with the capacitive element 53. More specifically, the capacitive element 54 functions to allow a voltage VS1 of the gate (i.e., the node S1) of the MOS transistor 13 to be higher than the voltage VDD1, so as to allow the voltage of the source of the MOS transistor 13 to output the voltage VDD1 of the power source PVDD1 when the set signal VS is at the high level.

[Operation and Effect]

Figure 19:
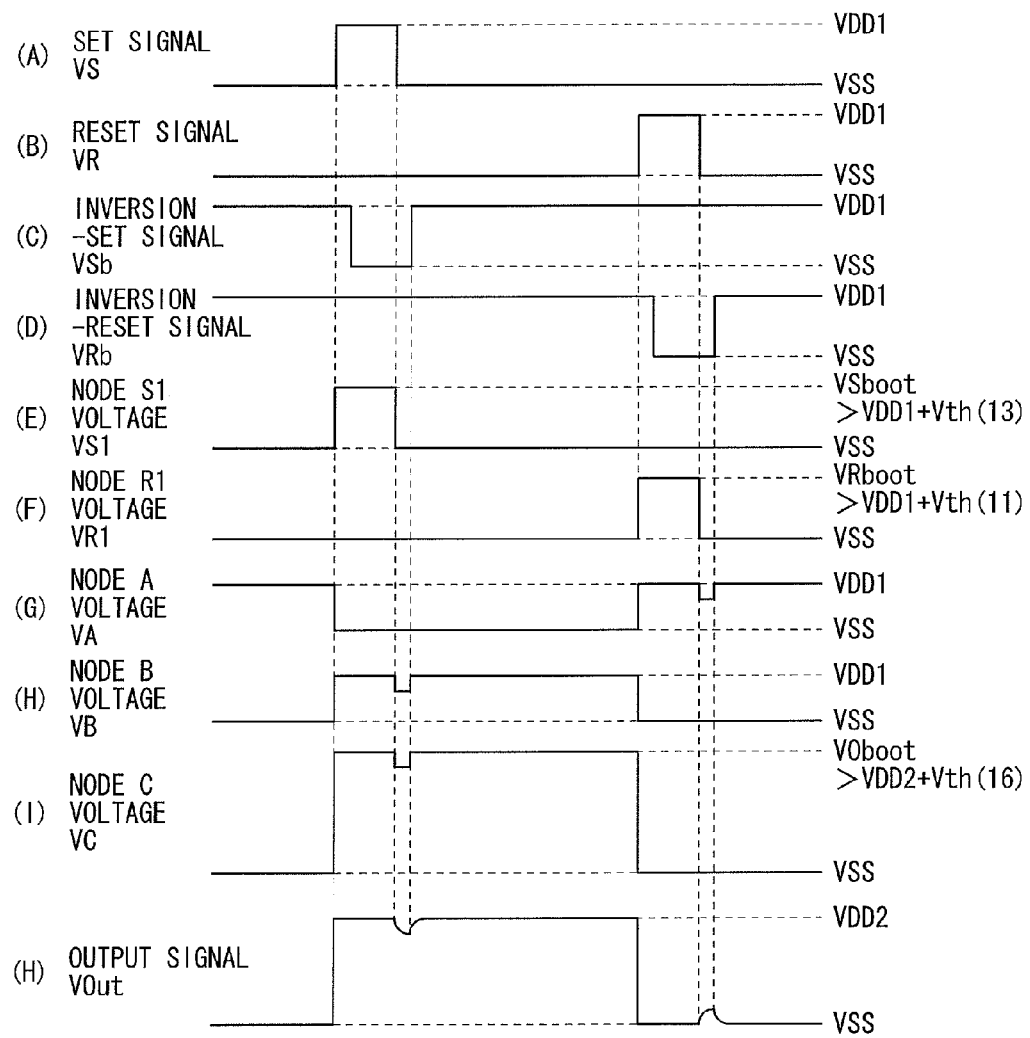
FIG. 19 is a timing waveform chart illustrating an operation example of the level shifter illustrated in FIG. 18.

FIG. 19 illustrates a timing waveform chart of an operation of the level shifter 30, in which (A) illustrates a waveform of the set signal VS, (B) illustrates a waveform of the reset signal VR, (C) illustrates a waveform of the inversion-set signal VSb, and (D) illustrates a waveform of the inversion-reset signal VRb. Further, (E) illustrates a waveform of the voltage VS1 in the node S1, (F) illustrates a waveform of the voltage VR1 in the node R1, (G) illustrates a waveform of the voltage VA in the node A, (H) illustrates a waveform of the voltage VB in the node B, (I) illustrates a waveform of the voltage VC in the node C, and (J) illustrates a waveform of the output signal VOut.

First, when the set signal VS rises from the voltage VSS to the voltage VDD1 ((A) of FIG. 19), the MOS transistor 12 is turned ON, and the voltage VA of the node A falls to the voltage VSS ((G) of FIG. 19). At the same time, the MOS transistor 13 is turned ON, and the voltage VB of the node B rises. At this time, the capacitive element 54 is charged with electric charges, and a voltage difference between both ends of the capacitive element 54 becomes larger than the threshold voltage Vth (13) of the MOS transistor 13. The voltage VB of the node B continues to rise even after the MOS transistor 52 is turned OFF, while the voltage VS1 of the node S1 also rises since the voltage difference between the both ends of the capacitive element 54 is maintained (i.e., the bootstrap operation in the input section). The voltage VS1 of the node S1 eventually rises up to a voltage VSboot, which is higher than the total voltage (VDD1+Vth (13)) of the voltage VDD1 and the threshold voltage Vth (13) of the MOS transistor 13 ((E) of FIG. 19), and the voltage VB of the node B rises up to the voltage VDD1 ((H) of FIG. 19). Thereafter, the voltage VC of the node C also rises up to the voltage VOboot by the bootstrap operation of the output sections ((I) of FIG. 19), and thus the output signal VOut rises up to the voltage VDD2 ((J) of FIG. 19).

Thereafter, when the set signal VS falls from the voltage VDD1 to the voltage VSS ((A) of FIG. 19), the MOS transistor 52 is turned ON, and the voltage VS1 of the node S1 falls to the voltage VSS ((E) of FIG. 19), and the MOS transistor 13 is turned OFF. At this time, the voltage changes occur in the voltage VB of the node B and the voltage VC of the node C through the capacitive element 54 and the parasitic capacitance between the gate and the source of the MOS transistor 13, although voltage changes in a reverse direction occur due to the immediately-subsequent rising of the inversion-set signal VSb, thereby cancelling those voltage changes ((H) and (I) of FIG. 19). Hence, the output signal VOut is maintained at the voltage VDD2 ((J) of FIG. 19).

Then, when the set signal VR rises from the voltage VSS to the voltage VDD1 ((B) of FIG. 19), the MOS transistor 14 is turned ON, and the voltage VB of the node B falls to the voltage VSS ((H) of FIG. 19), and also the voltage VC of the node C falls to the voltage VSS accordingly ((I) of FIG. 19). At the same time, the MOS transistor 11 is turned ON, and the voltage VA of the node A rises. At this time, the capacitive element 53 is charged with electric charges, and a voltage difference between both ends of the capacitive element 53 becomes larger than the threshold voltage Vth (11) of the MOS transistor 11. The voltage VA of the node A continues to rise even after the MOS transistor 51 is turned OFF, while the voltage VR1 of the node R1 also rises since the voltage difference between the both ends of the capacitive element 53 is maintained (i.e., the bootstrap operation in the input section). The voltage VR1 of the node R1 eventually rises up to a voltage VRboot, which is higher than the total voltage (VDD1+Vth (11)) of the voltage VDD1 and the threshold voltage Vth (11) of the MOS transistor 11 ((F) of FIG. 19), and the voltage VA of the node A rises up to the voltage VDD1 ((G) of FIG. 19). Thereby, the output voltage VOut falls to the voltage VSS ((J) of FIG. 19).

Thereafter, when the reset signal VR falls from the voltage VDD1 to the voltage VSS ((B) of FIG. 19), the MOS transistor 51 is turned ON, and the voltage VR1 of the node R1 falls to the voltage VSS ((F) of FIG. 19), and the MOS transistor 11 is turned OFF. At this time, the voltage change occurs in the voltage VA of the node A through the capacitive element 53 and the parasitic capacitance between the gate and the source of the MOS transistor 11, although a voltage change in a reverse direction occurs due to the immediately-subsequent rising of the inversion-reset signal VRb, thereby cancelling those voltage changes ((G) of FIG. 19). Hence, the output signal VOut is maintained at the voltage VSS ((J) of FIG. 19).

[Result]

Thus, according to the third embodiment described above, the bootstrap operation is performed also in the input sections. This makes it possible to increase the amplitudes of the internal waveforms in the node A and the node B, thereby allowing a circuit to operate stably. The other effects achieved by the third embodiment are similar to those of the first embodiment described above.

[Modification of Third Embodiment]

Figure 20:
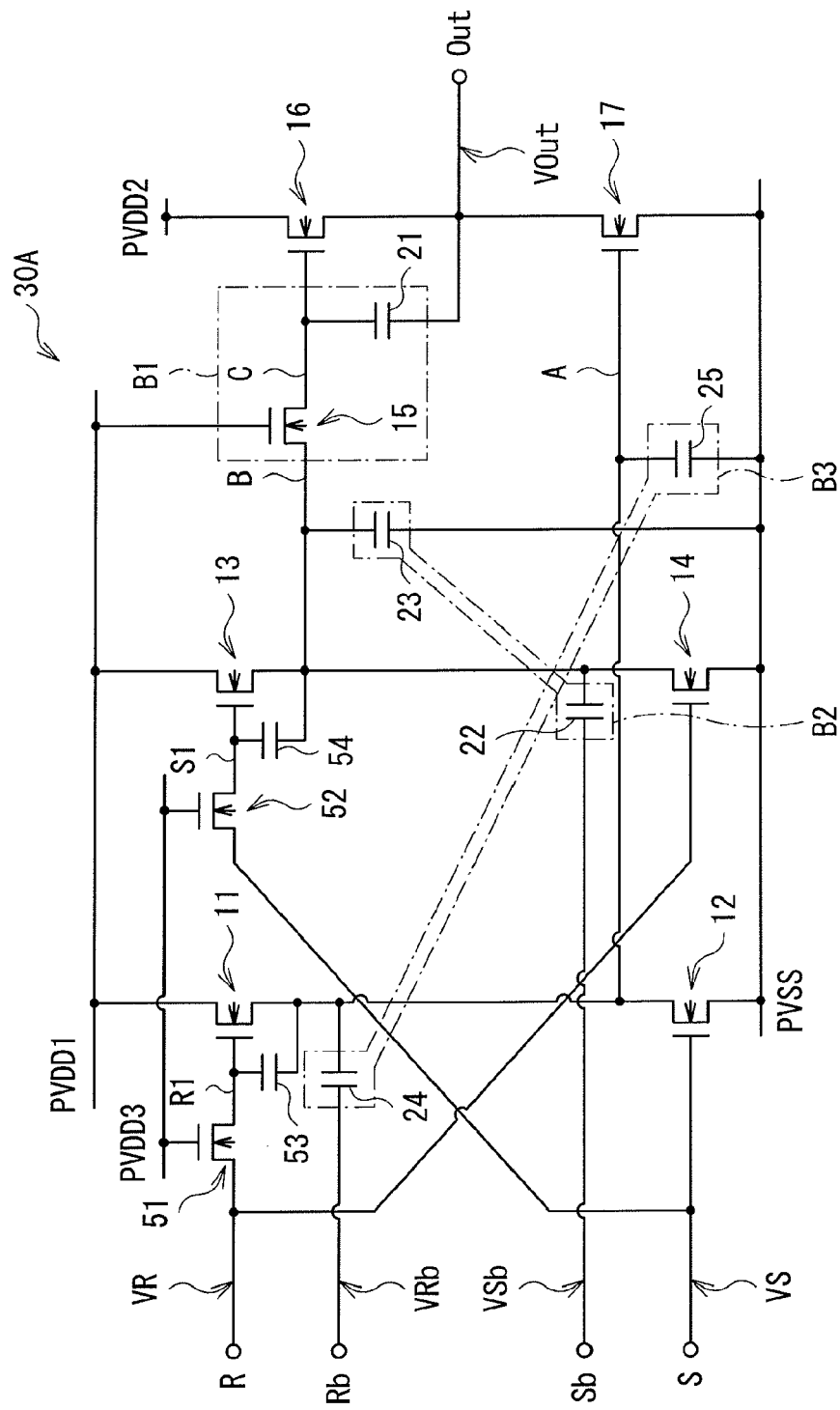
FIG. 20 is a circuit diagram illustrating an example of a configuration of a level shifter according to a modification of the third embodiment.

In the third embodiment described above, the gate of each of the MOS transistors 51 and 52 is connected to the power source PVDD1, although it is not limited thereto. For example, a power source PVDD3 having a voltage VDD3 which is lower than the voltage VDD1 of the power source PVDD1 may be newly provided, and the gate of each of the MOS transistors 51 and 52 may be connected to the power source PVDD3, as illustrated in FIG. 20. Further, each of the high level voltages VIH of the four input signals may be set as the voltage VDD3, and the low level voltages VIL thereof may be set as the voltage VSS.

Figure 21:
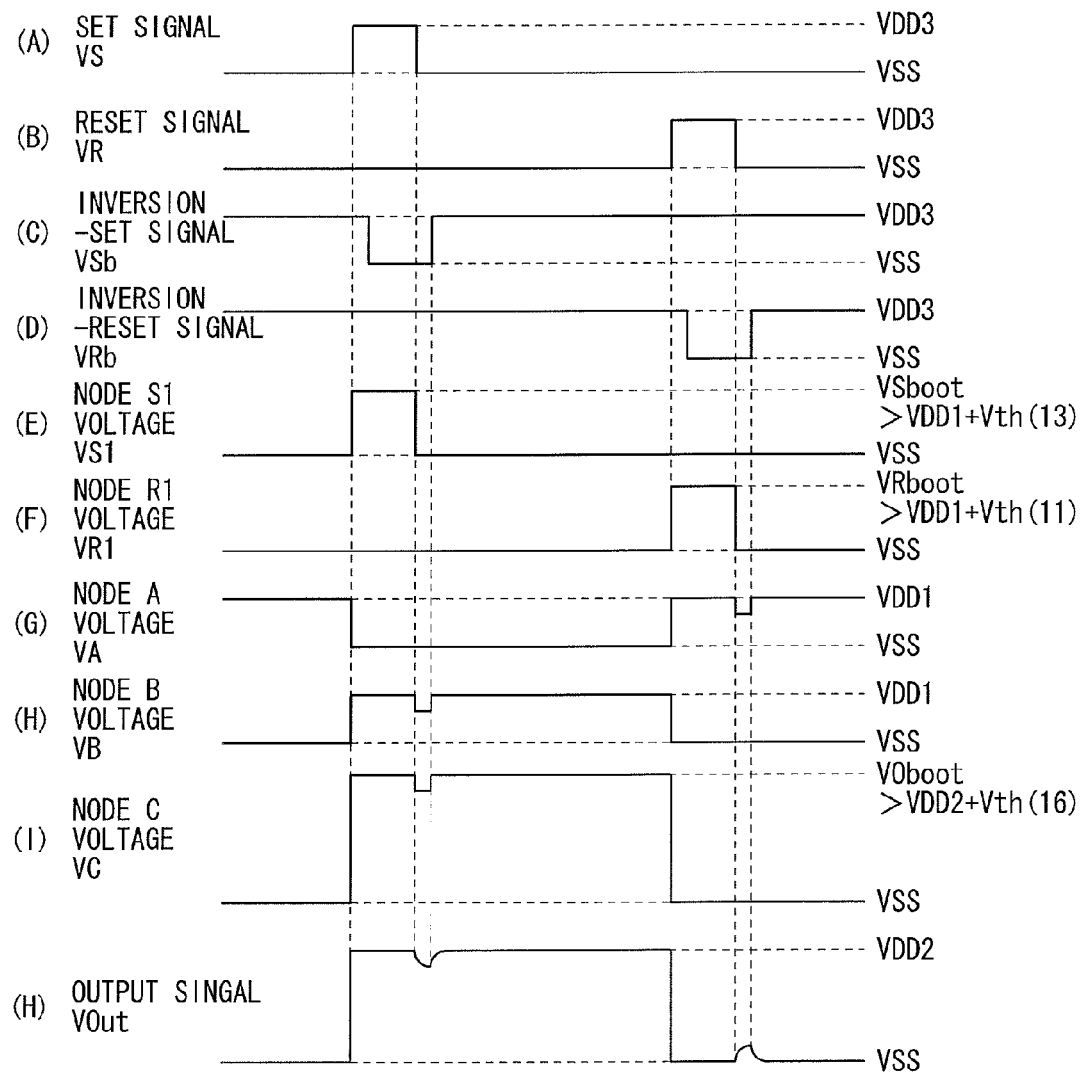
FIG. 21 is a timing waveform chart illustrating an operation example of the level shifter illustrated in FIG. 20.

FIG. 21 illustrates a timing waveform chart of an operation of the level shifter 30A according to a modification of the third embodiment. In the third embodiment described above, the high level voltage of each of the four input signals including the set signal VS, the reset signal VR, the inversion-set signal VSb, and the inversion-reset signal VRb is the voltage VDD1. In this modification illustrated in FIG. 21, the high level voltage VIH of each of the four input signals is the voltage VDD3, which is lower than the voltage VDD1. The other operations in this modification are the same as those described above.

In the level shifter 30A according to the modification of the third embodiment, the voltage amplitudes (VDD1-VSS) in the nodes A and B are maintained by the bootstrap operation in the input sections even when the high level voltages VIH of the four input signals are lowered. Therefore, it is possible to decrease power consumption of a circuit in a preceding stage that supplies the four input signals, while maintaining a stability of an operation of a circuit.

4. Fourth Embodiment

Hereinafter, a level shifter according to a fourth embodiment will be described. In the fourth embodiment, a configuration is adopted in which power except for the output sections is supplied from the input signals. Note that the same or equivalent elements as those of the shift resistors according to the embodiments and the modifications described above are denoted with the same reference numerals, and will not be described in detail.

Configuration Example

Figure 22:
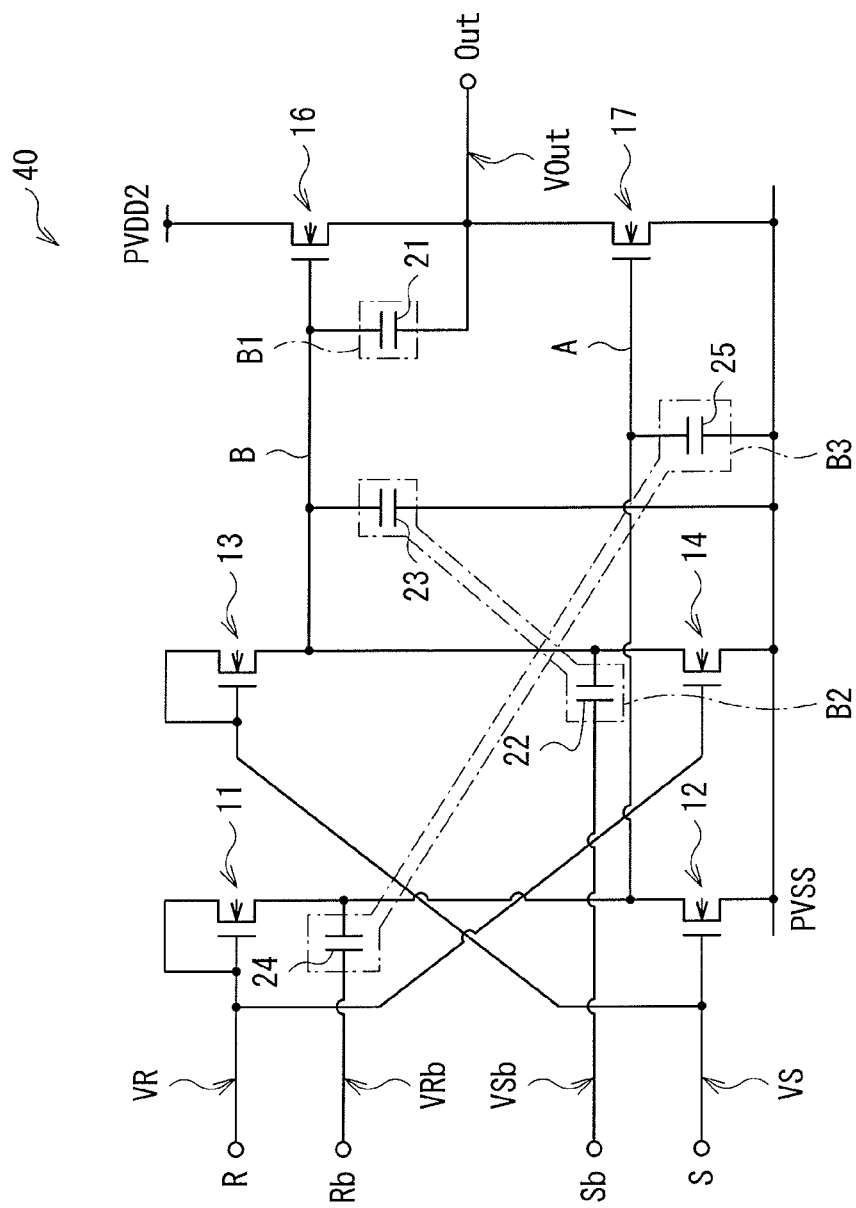
FIG. 22 is a circuit diagram illustrating an example of a configuration of a level shifter according to a fourth embodiment.

FIG. 22 illustrates an example of a configuration of a level shifter 40 according to the fourth embodiment. The level shifter 40 differs from the level shifter 10C according to the modification of the first embodiment illustrated in FIG. 7, in that a destination of connection of the drain in the MOS transistor 11 is configured to be the gate thereof in place of the power source PVDD1, and that a destination of connection of the drain in the MOS transistor 13 is configured to be the gate thereof in place of the power source PVDD1, to eliminate the power source PVDD1. The other configurations are similar to those of the above-described modification of the first embodiment illustrated in FIG. 7.

The high level voltages VIH of the four input signals including the set signal VS, the reset signal VR, the inversion-set signal VSb, and the inversion-reset signal VRb are mutually the same, and the low level voltages VIL thereof are the voltage VSS.

With this configuration, power of the level shifter 40 is supplied from a circuit in a preceding stage, which supplies the set signal VS and the reset signal VR, through those input signals. That is, the level shifter 40 operates so that, when the set signal VS and the reset signal VR are at the high level, the voltage VIH thereof is supplied as the power.

[Operation and Effect]

Figure 23:
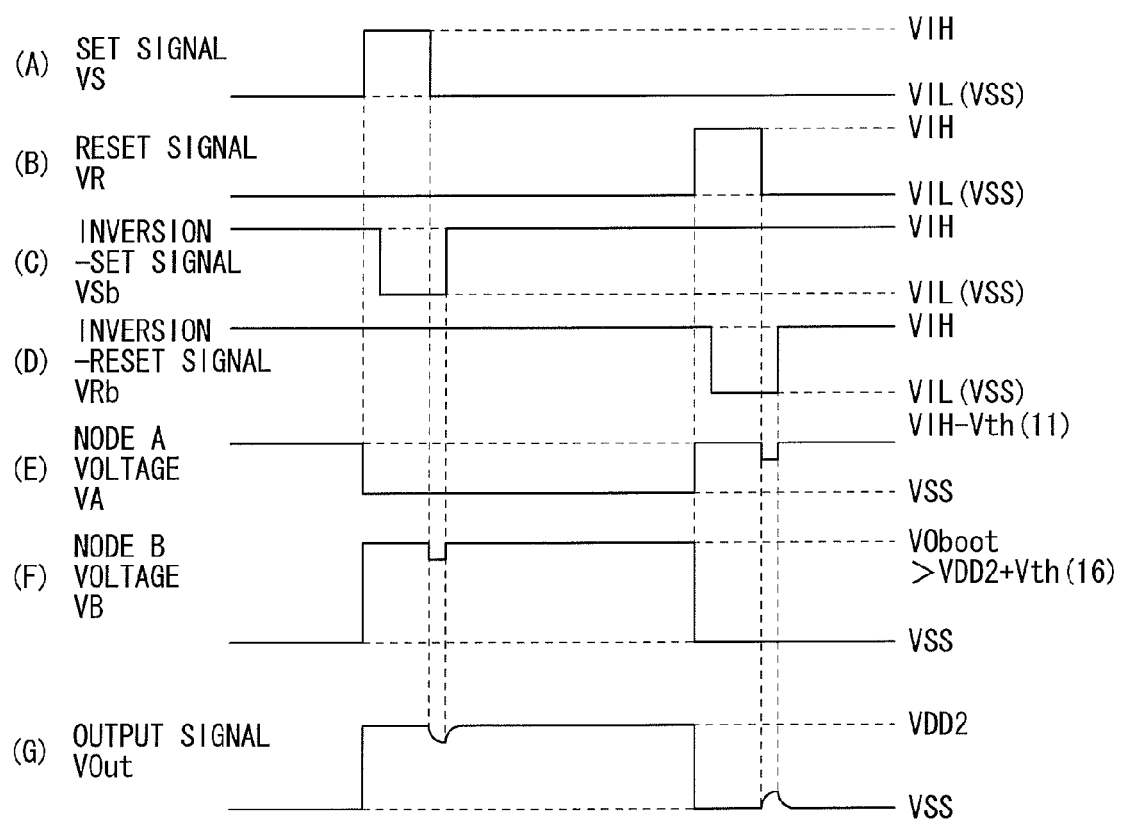
FIG. 23 is a timing waveform chart illustrating an operation example of the level shifter illustrated in FIG. 22.

FIG. 23 illustrates a timing waveform chart of an operation of the level shifter 40, in which (A) illustrates a waveform of the set signal VS, (B) illustrates a waveform of the reset signal VR, (C) illustrates a waveform of the inversion-set signal VSb, and (D) illustrates a waveform of the inversion-reset signal VRb. Further, (E) illustrates a waveform of the voltage VA in the node A, (F) illustrates a waveform of the voltage VB in the node B, and (G) illustrates a waveform of the output signal VOut.

First, when the set signal VS rises from the voltage VSS to the voltage VIH ((A) of FIG. 23), the MOS transistor 12 is turned ON, and the voltage VA of the node A falls to the voltage VSS ((E) of FIG. 23). At the same time, the MOS transistor 13 is turned ON, and the power is supplied through the set signal VS, and the voltage VB of the node B rises up to the voltage VOboot by the bootstrap operation ((F) of FIG. 23), and the output signal VOut rises up to the voltage VDD2 ((G) of FIG. 23).

Thereafter, when the set signal VS falls ((A) of FIG. 23), the voltage change occurs in the voltage VB of the node B accordingly, although a voltage change in a reverse direction occurs due to the immediately-subsequent rising of the inversion-set signal VSb, thereby cancelling those voltage changes ((F) of FIG. 23). Hence, the output signal VOut is maintained at the voltage VDD2 ((G) of FIG. 23).

Then, when the reset signal VR rises from the voltage VSS to the voltage VIH ((B) of FIG. 23), the MOS transistor 14 is turned ON, and the voltage VB of the node B falls to the voltage VSS ((F) of FIG. 23). At the same time, the MOS transistor 11 is turned ON, and the power is supplied through the reset signal VR, and the voltage VA of the node A rises to a voltage (VIH−Vth (11)), which is lower than the voltage VIH only by an amount corresponding to the threshold voltage Vth (11) of the MOS transistor 11 ((E) of FIG. 23). Thus, the output signal VOut falls to the voltage VSS ((G) of FIG. 23).

Thereafter, when the reset signal VR falls ((B) of FIG. 23), the voltage change occurs in the voltage VA of the node A accordingly, although a voltage change in a reverse direction occurs due to the immediately-subsequent rising of the inversion-reset signal VRb, thereby cancelling those voltage changes ((E) of FIG. 23). Hence, the output signal VOut is maintained at the voltage VSS ((G) of FIG. 23).

[Result]

Thus, according to the fourth embodiment described above, the power, except for the output sections, is supplied from the input signals. This makes it possible to eliminate a power wiring thereof, and to allow a circuit layout to be compact in size. The other effects achieved by the fourth embodiment are similar to those of the first embodiment described above.

5. Fifth Embodiment

Hereinafter, a level shifter according to a fifth embodiment will be described. The fifth embodiment simplifies the scheme for cancelling the voltage changes of the internal signals and the output signal caused by the set signal and the reset signal. That is, in the first embodiment described above, the capacitive elements 22 to 25 are provided, the inversion-set signal is transmitted to the node B through the capacitive element 22, and the inversion-reset signal is transmitted to the node A through the capacitive element 24. In the fifth embodiment, only the capacitive elements 22 and 23 are provided, and the inversion-set signal is transmitted to the node B through the capacitive element 22. Note that the same or equivalent elements as those of the shift resistors according to the embodiments and the modifications described above are denoted with the same reference numerals, and will not be described in detail.

Configuration Example

Figure 24:
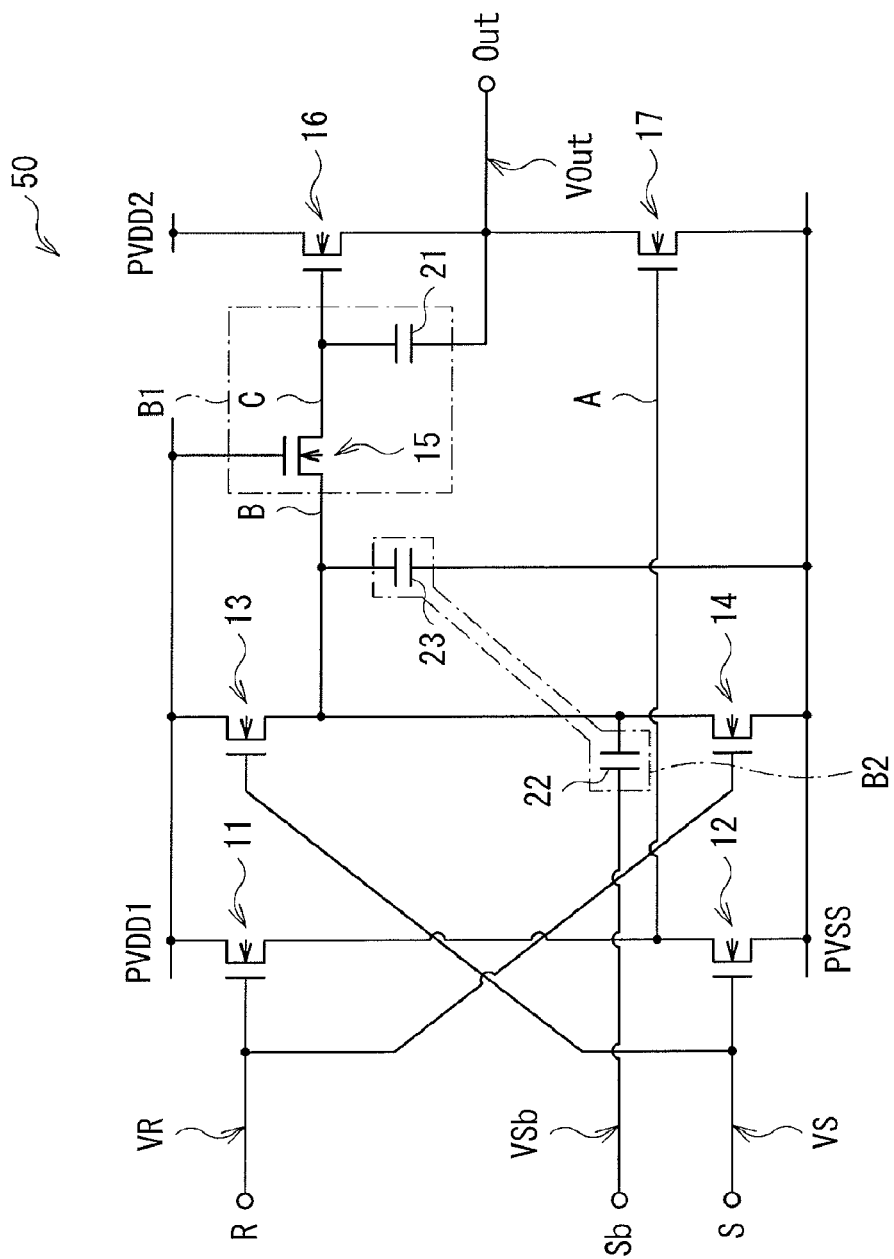
FIG. 24 is a circuit diagram illustrating an example of a configuration of a level shifter according to a fifth embodiment.

FIG. 24 illustrates an example of a configuration of a level shifter 50 according to the fifth embodiment. The level shifter 50 differs from the level shifter 10 according to the first embodiment illustrated in FIG. 1, in that the capacitive elements 24 and 25 are eliminated. The other configurations are similar to those of the first embodiment illustrated in FIG. 1.

[Operation and Effect]

Figure 25:
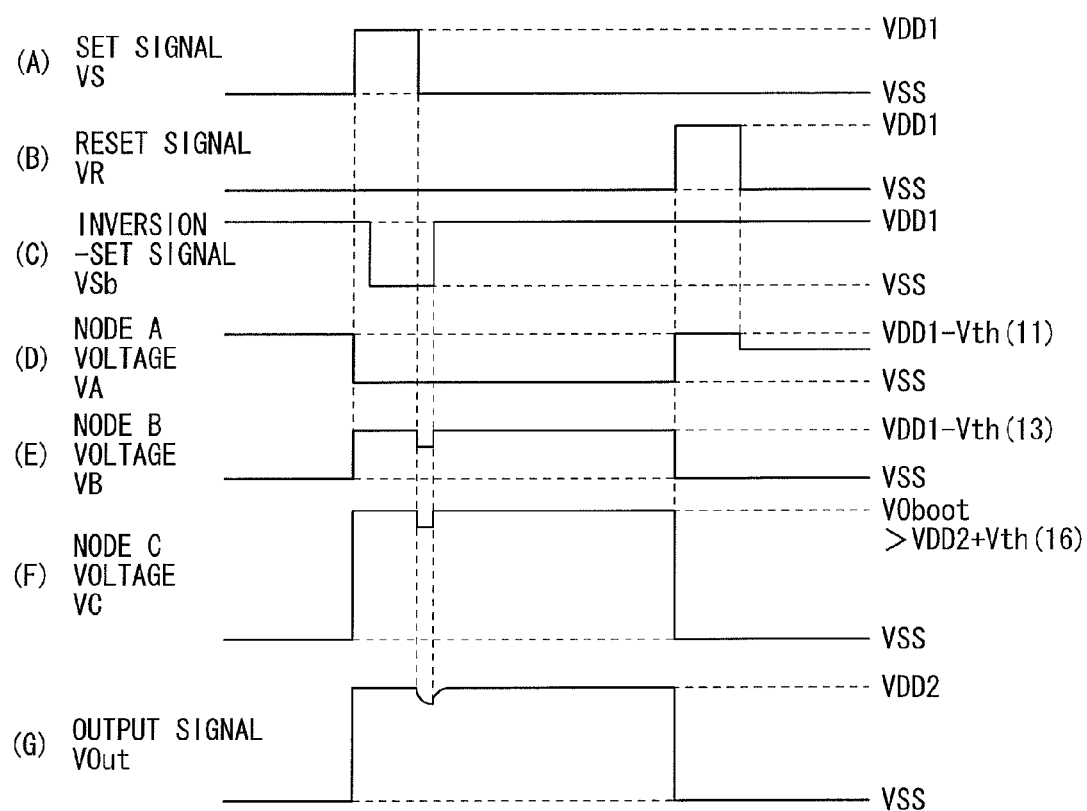
FIG. 25 is a timing waveform chart illustrating an operation example of the level shifter illustrated in FIG. 24.

FIG. 25 illustrates a timing waveform chart of an operation of the level shifter 50, in which (A) illustrates a waveform of the set signal VS, (B) illustrates a waveform of the reset signal VR, and (C) illustrates a waveform of the inversion-set signal VSb. Further, (D) illustrates a waveform of the voltage VA in the node A, (E) illustrates a waveform of the voltage VB in the node B, (F) illustrates a waveform of the voltage VC in the node C, and (G) illustrates a waveform of the output signal VOut.

First, the set signal VS is raised ((A) of FIG. 25) to perform the bootstrap operation, and the voltage VC of the node C rises to a higher potential than the voltage VDD2 ((F) of FIG. 25), and the output signal VOut outputs the voltage VDD2 ((G) of FIG. 25). When the set signal VS falls ((A) of FIG. 25), the voltage change occurs in each of the voltage VB of the node B and the voltage VC of the node C accordingly, although voltage changes in a reverse direction occur therein due to immediately-subsequent rising of the inversion-set signal VSb, thereby cancelling those voltage changes ((E) and (F) of FIG. 25). Hence, the output signal VOut is maintained at the voltage VDD2 ((G) of FIG. 25).

Then, the rising of the reset signal VR ((B) of FIG. 25) allows the voltage VC of the node C to be lowered to the voltage VSS ((F) of FIG. 25), and the voltage VA of the node A rises ((D) of FIG. 25), and the output signal VOut outputs the voltage VSS ((G) of FIG. 25). When the reset signal VR falls, the voltage change occurs in the voltage VA of the node A accordingly ((D) of FIG. 25), although the MOS transistor 17 is possible to keep on maintaining the ON state as long as that voltage is larger than the threshold voltage Vth (17) of the MOS transistor 17. Hence, the output signal VOut is maintained at the voltage VSS ((G) of FIG. 25).

[Result]

Thus, according to the fifth embodiment described above, the capacitive elements 24 and 25 are eliminated, and only the capacitive elements 22 and 23 are provided for the scheme for cancelling the voltage changes of the internal signals and the output signal caused by the set signal and the reset signal. Therefore, it is possible to reduce the number of components, while achieving a stable operation.

6. Applied Examples to Display Device

Hereinafter, applied examples of the level shifters described in the above embodiments and the modifications will be described. The level shifters according to the embodiments and the modifications may be used for applications where a signal having a large amplitude is generated based on a signal having a small amplitude, for example. In particular, the level shifters according to the embodiments and the modifications are preferable, but not necessary, for applications where single-channel MOS transistors are used to achieve a configuration. In the following, the applied examples will be described with reference to examples where any one of the level shifters described above is used in a display device, or particularly in a scanning line driving circuit of the display device.

[Overall Configuration]

Figure 26:
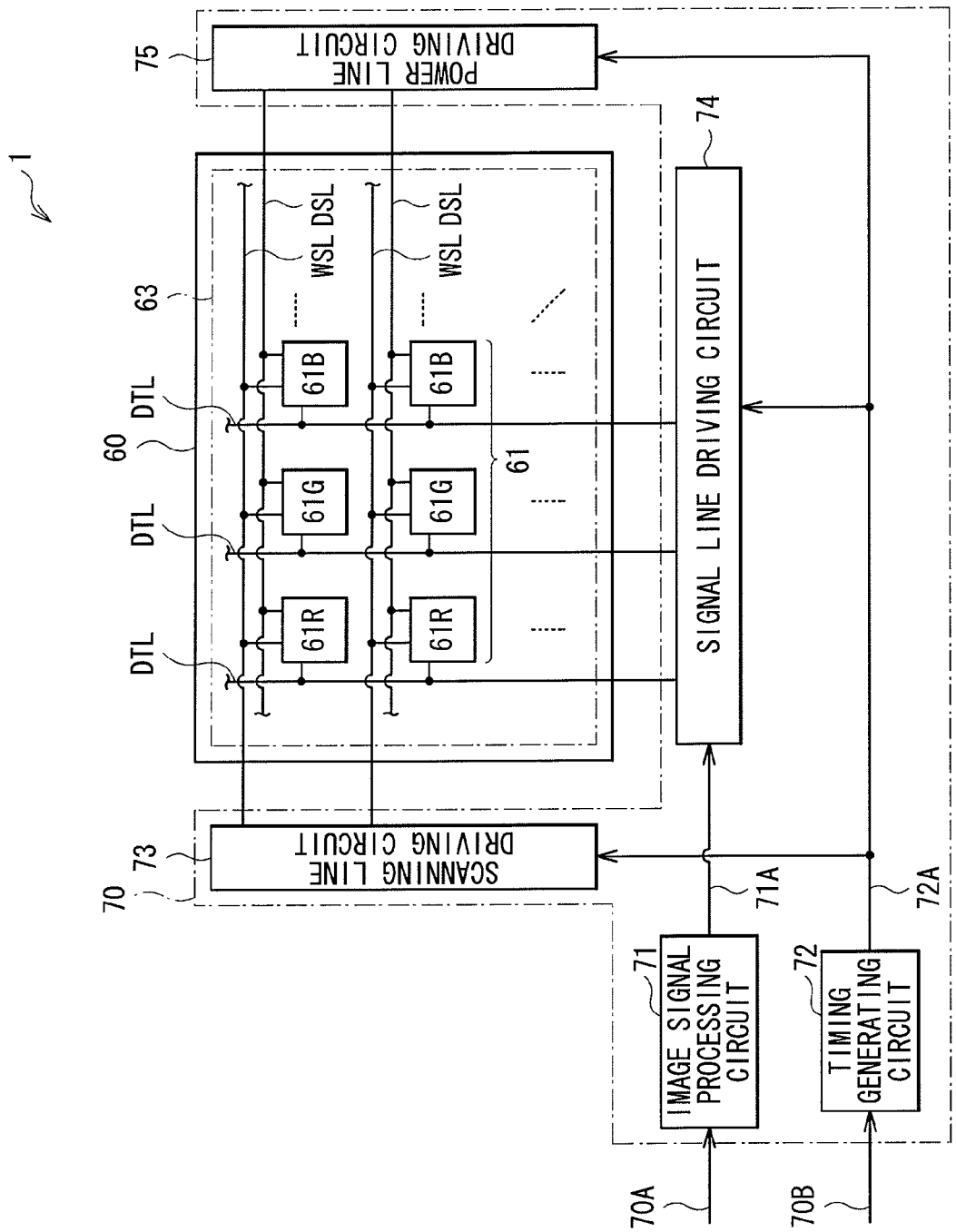
FIG. 26 is a block diagram illustrating an example of a configuration of a display device according to an applied example.

FIG. 26 illustrates an example of a configuration of a display device 1 to which any one of the level shifters according to the embodiments and the modifications described above is applied. The display device 1 is provided with a display panel 60 and a drive circuit 70.

[Display Panel 60]

The display panel 60 includes a pixel array section 63 in which a plurality of pixels 61 are arranged in matrix. The display panel 60 may perform pixel-displaying by an active-matrix driving method, based on an image signal 70A and a synchronization signal 70B which are inputted from the outside. In the applied examples, each of the pixels 61 is structured by a pixel 61R for red, a pixel 61G for green, and a pixel 61B for blue, although the number of colors and the types of colors are not limited thereto. It is to be noted that, in the following, the pixels 61R, 61G, and 61B may be collectively referred to as the pixel 61 where appropriate.

The pixel array section 63 includes N-number of scanning lines WSL arranged in rows, N-number of signal lines DTL arranged in columns, and N-number of power lines DSL arranged in rows along the scanning lines WSL. One ends of the scanning lines WSL, the signal lines DTL, and the power lines DSL are respectively connected to the drive circuit 70, which will be described later in greater detail. The pixels 61R, 61G, and 61B are arranged in rows and columns (i.e., arranged in matrix) at positions corresponding to intersections of the scanning lines WSL and the signal lines DTL. It is to be noted that, in the following, the term "scanning lines WSL (1) to WSL (N)", indicating the respective N-number of scanning lines WSL, may be used to refer to the N-number of scanning lines WSL where appropriate.

Figure 27:
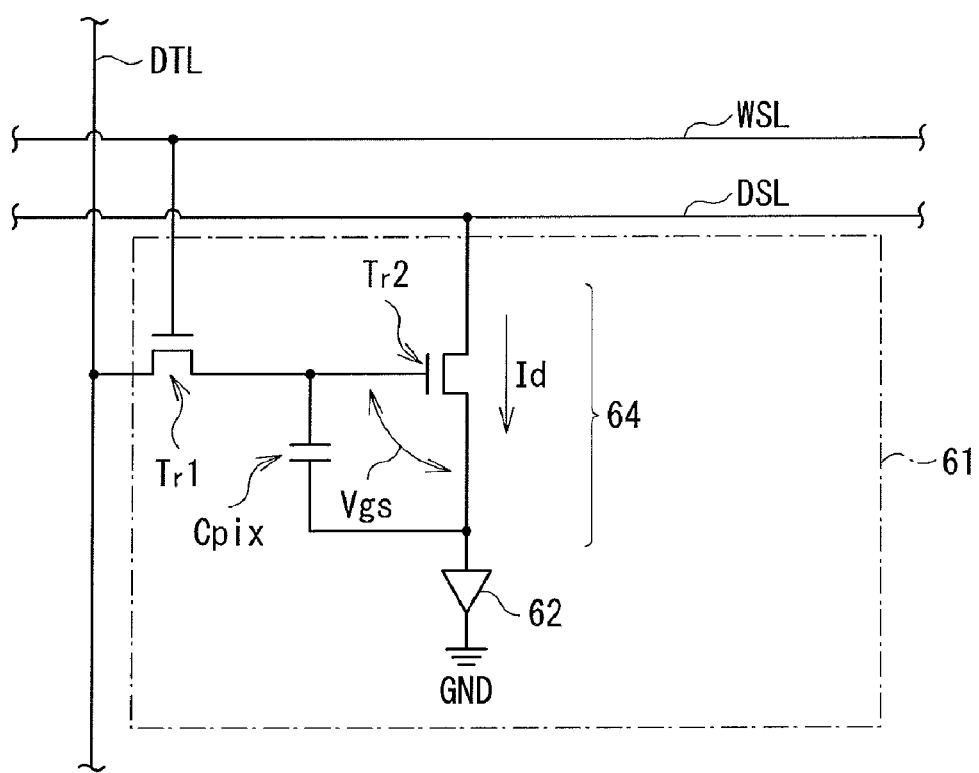
FIG. 27 is a circuit diagram illustrating an example of a configuration of a pixel illustrated in FIG. 26.

FIG. 27 illustrates an example of an internal configuration of the pixel 61. The pixel 61 is provided therein with an organic electroluminescence (which will be hereinafter simply referred to as "EL") element 62, and a pixel circuit 64.

The organic EL element 62 is a light-emitting element that emits light at a luminance corresponding to a supplied drive current. The drive current is supplied by the pixel circuit 64 which will be described below.

The pixel circuit 64 is provided with a write transistor Tr1, a drive transistor Tr2, and a capacitive element Cpix, and thus has a circuit configuration referred to as so-called "2Tr1C". Each of the write transistor Tr1 and the drive transistor Tr2 may be configured by an N-channel MOS thin-film transistor (TFT), for example.

In the pixel circuit 64, the write transistor Tr1 includes a gate connected to the scanning line WSL, a source connected to the signal line DTL, and a drain connected to a gate of the drive transistor Tr2 and to a first end of the capacitive element Cpix. A drain of the drive transistor Tr2 is connected to the power line DSL, and a source is connected to a second end of the capacitive element Cpix and to an anode of the organic EL element 62. A cathode of the organic EL element 62 is set at a fixed potential. Herein, the cathode of the organic EL element 62 is connected to a ground line GND to set the cathode to ground (to a ground potential). The cathode of the organic EL element 62 may serve as a common electrode of each of the organic EL elements 62. For example, cathode of the organic EL element 62 may be formed continuously throughout a displaying region of the display panel 60, and thus may be a flat plate-like electrode.

[Drive Circuit 70]

The drive circuit 70 drives (performs displaying-drive of) the pixel array section 63 (the display panel 60). More specifically, the drive circuit 70 selects sequentially the plurality of pixels 61 in the pixel arrays section 63, and writes a signal voltage based on the image signal 70A to the selected pixels 61, to perform the displaying-drive on the plurality of pixels 61. As illustrated in FIG. 26, the drive circuit 70 is provided with an image signal processing circuit 71, a timing generating circuit 72, a scanning line driving circuit 73, a signal line driving circuit 74, and a power line driving circuit 75.

The image signal processing circuit 71 performs a predetermined correction on the digital image signal 70A inputted from the outside, and outputs the corrected image signal 71A to the signal line driving circuit 74. The predetermined correction can be a gamma correction, an overdrive correction, or other suitable correction.

The timing generating circuit 72 generates a control signal 72A based on the synchronization signal 70B inputted from the outside and outputs the generated control signal 72A, to control each of the scanning line driving circuit 73, the signal line driving circuit 74, and the power line driving circuit 75 such that they operate in a cooperative or interlocking fashion.

The scanning line driving circuit 73 sequentially applies selection pulses to the plurality of scanning lines WSL in accordance with or in synchronization with the control signal 72A, to sequentially select the plurality of pixels 61. More specifically, the scanning line driving circuit 73 selectively outputs: a voltage Von applied in setting the write transistor Tr1 to an ON state; and a voltage Voff applied in setting the write transistor Tr1 to an OFF state, to generate the selection pulses described above. Herein, the voltage Von is at a value (a constant value) which is equal to or higher than an ON voltage of the write transistor Tr1, and the voltage Voff is at a value (a constant value) which is lower than the ON voltage of that write transistor Tr1.

The signal line driving circuit 74 generates an analog image signal (a luminance signal) corresponding to the image signal inputted from the image signal processing circuit 71 in accordance with or in synchronization with the control signal 72A, and applies the generated analog signal to each of the signal lines DTL. More specifically, the signal line driving circuit 74 applies an analog signal voltage Vsig, which is based on the image signal 70A, to each of the signal lines DTL to perform writing of an image signal to the pixels (selection targets) 61 selected by the scanning line driving circuit 73. As used herein, the term "writing of image signal" refers to an application of a predetermined voltage corresponding to the signal voltage Vsig between the gate and the source of the drive transistor Tr2. Further, the signal line driving circuit 74 outputs a voltage Vofs used in correcting a variation in the threshold voltages Vth of the drive transistors Tr2 at the time when the organic EL elements 12 are quenched.

The power line driving circuit 75 sequentially applies control pulses to the plurality of power lines DSL in accordance with or in synchronization with the control signal 72A, to perform a control of an emitting operation and a quenching operation of each of the organic EL elements 62. More specifically, the power line driving circuit 75 selectively outputs: a voltage VCC applied in emitting each of the organic EL elements 62; and a voltage Vini applied, before the emission of each of the organic EL elements 62, in so preparing each of the pixel circuits 64 that each of the organic EL elements 62 emits at a desired luminance, to generate the control pulses described above.

[Overall Operation]

An outline of a displaying operation in the display device 1, to which the level shifter according to any one of the embodiments and the modifications described above is used, will be described.

Referring to FIGS. 26 and 27, in the display device 1, the drive circuit 70 performs the displaying-drive based on the image signal 70A and the synchronization signal 70B on each of the pixels 61 (or the pixels 61R, 61G, and 61B) in the display panel 60 (or the pixel array section 63). More specifically, first, the image signal processing circuit 71 performs the correction, such as the gamma correction and the overdrive correction, based on the image signal 70A, and outputs the corrected image signal 71A. The timing generating circuit 72 generates the control signal 72A based on the synchronization signal 70B, and outputs the generated control signal 72A. The scanning line driving circuit 73 generates the selection pulses including the voltage Von (constant value) and the voltage Voff (constant value), and sequentially applies the generated selection pulses to the N-number of scanning lines WSL, in synchronization with the control signal 72A. The signal line driving circuit 74 generates the analog image signal including: the voltage Vsig corresponding to the corrected image signal 71A; and the voltage Vofs (constant value), and applies the generated analog image signal to each of the signal lines DTL, in synchronization with the control signal 72A. The power line driving circuit 75 generates the control pulses including the voltage VCC (constant value) and the voltage Vini (constant value), and sequentially applies the generated control pulses to the N-number of power lines DSL, in synchronization with the control signal 72A.

In the plurality of pixels 61 selected by the selection pulses of the scanning line WSL (a horizontal pixel line), the variation in the threshold voltage Vth in the drive transistor Tr2 is corrected for each of the pixels 61, and thereafter, the analog image signal of the signal lines DTL is written, and the drive current is caused to flow to the organic EL elements 62 by the control pulse of the power line DSL. The organic EL elements 62 emit in accordance with the drive current. Thus, displaying of an image based on the image signal 70A is performed in the display panel 60.

First Applied Example

First, a scanning line driving circuit according to a first applied example of any one of the level shifters described in the embodiments and the modifications will be described.

Configuration Example

Figure 28:
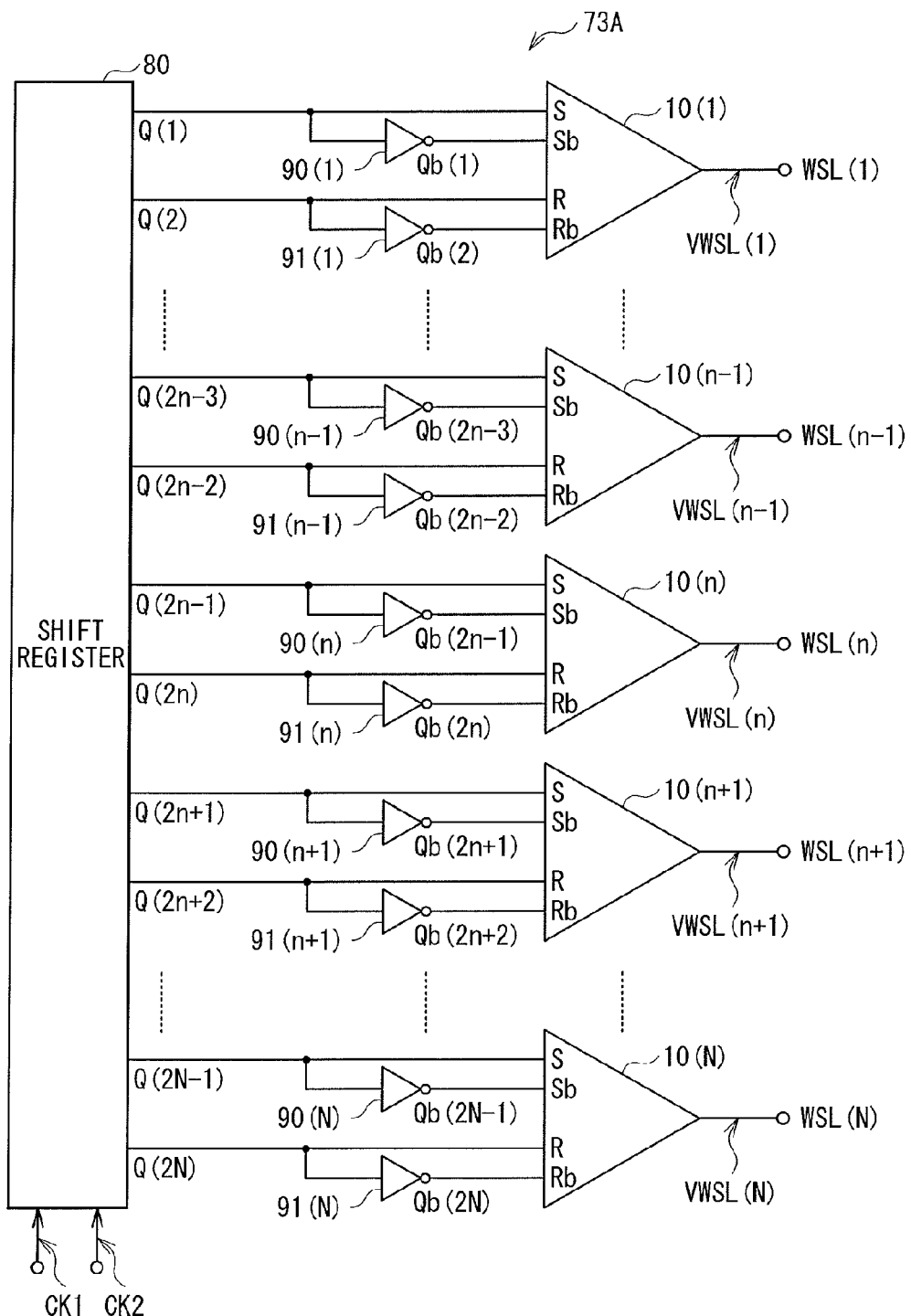
FIG. 28 is a block diagram illustrating an example of a configuration of a scanning line driving circuit according to a first applied example.

FIG. 28 illustrates an example of a configuration of a scanning line driving circuit 73A according to the first applied example of any one of the level shifters described in the embodiments and the modifications. The scanning line driving circuit 73A is provided with a shift register 80, N-number of inverters 90, N-number of inverters 91, and N-number of level shifters 10.

The shift resistor 80 has functions of sequentially generating, in a time-divisional fashion, 2N-number of pulse signals based on a clock signal CK1 and a clock signal CK2 which are inputted, and outputting the generated 2N-number of pulse signals in an order of generation thereof as output signals Q(1) to Q(2N). The clock signals CK1 and CK2 are illustrative examples of signals included in the control signal 72A which the timing generating circuit 72 generates and outputs. Also, as will be described later in greater detail, clock pulses appear alternately in the clock signals CK1, and CK2. It is to be noted that, in the following, the output signals Q(1) to Q(2N) may be collectively referred to as output signals Q where appropriate.

Each of the inverters 90 is a circuit which: handles odd-numbered output signal Q(2k−1) (where k is a natural number equal to or less than N) of the shift resistor 80 as an input; inverts the odd-numbered output signal Q; and outputs the inverted odd-numbered output signal Q as an output signal Qb(2k−1). Each of the inverters 91 is a circuit which: handles even-numbered output signal Q(2k) of the shift resistor 80 as an input; inverts the even-numbered output signal Q; and outputs the inverted even-numbered output signal Q as an output signal Qb(2k). It is to be noted that, in the following, the output signals Qb(1) to Qb(2N) may be collectively referred to as output signals Qb where appropriate.

Each of the level shifters 10 corresponds to any one of the level shifters according to the embodiments and the modifications described above. The n-th level shifter 10(n) includes: the input terminal S to which the output signal Q(2n−1) of the shift resistor 80 is supplied; the input terminal Sb to which the output signal Qb(2n−1) of the inverter 90(n), the input thereto being the signal supplied to the input terminal S, is supplied; the input terminal R to which the output signal Qb(2n) of the shift resistor 80 is supplied; and the input terminal Rb to which the output signal Qb(2n) of the inverter 91(n), the input thereto being the signal supplied to the input terminal R, is supplied, and a signal having a larger amplitude than amplitudes of those input signals is outputted from the output terminal Out. The outputs of the N-number of level shifters are connected respectively to the N-number of scanning lines WSL (i.e., WSL (1) to WSL (N)) in the pixel array section 63 illustrated in FIG. 26. The level shifters 10 apply voltages VWSL (i.e., VWSL(1) to VWSL(N)) to the scanning lines WSL (i.e., WSL (1) to WSL (N)), to sequentially drive the scanning lines WSL (i.e., WSL (1) to WSL (N)) in a time-divisional fashion. That is, a high level voltage of the voltage VWSL corresponds to the voltage Von for turning ON the write transistor Tr1 in FIG. 27, and a low level voltage of the voltage VWSL corresponds to the voltage Voff for turning OFF the write transistor Tr1 in FIG. 27.

In the first applied example, the level shifter 10 outputs the voltage at high level to the output terminal Out, during a time period from rising of the signal supplied to the input terminal S (i.e., the set signal VS) to falling of the signal supplied to the input terminal R (i.e., the reset signal VR), and for example, the level shifter among the level shifters according to the above embodiments and the modifications which utilizes the N-channel MOS transistors may be used therefor.

Operation Example

Figure 29:
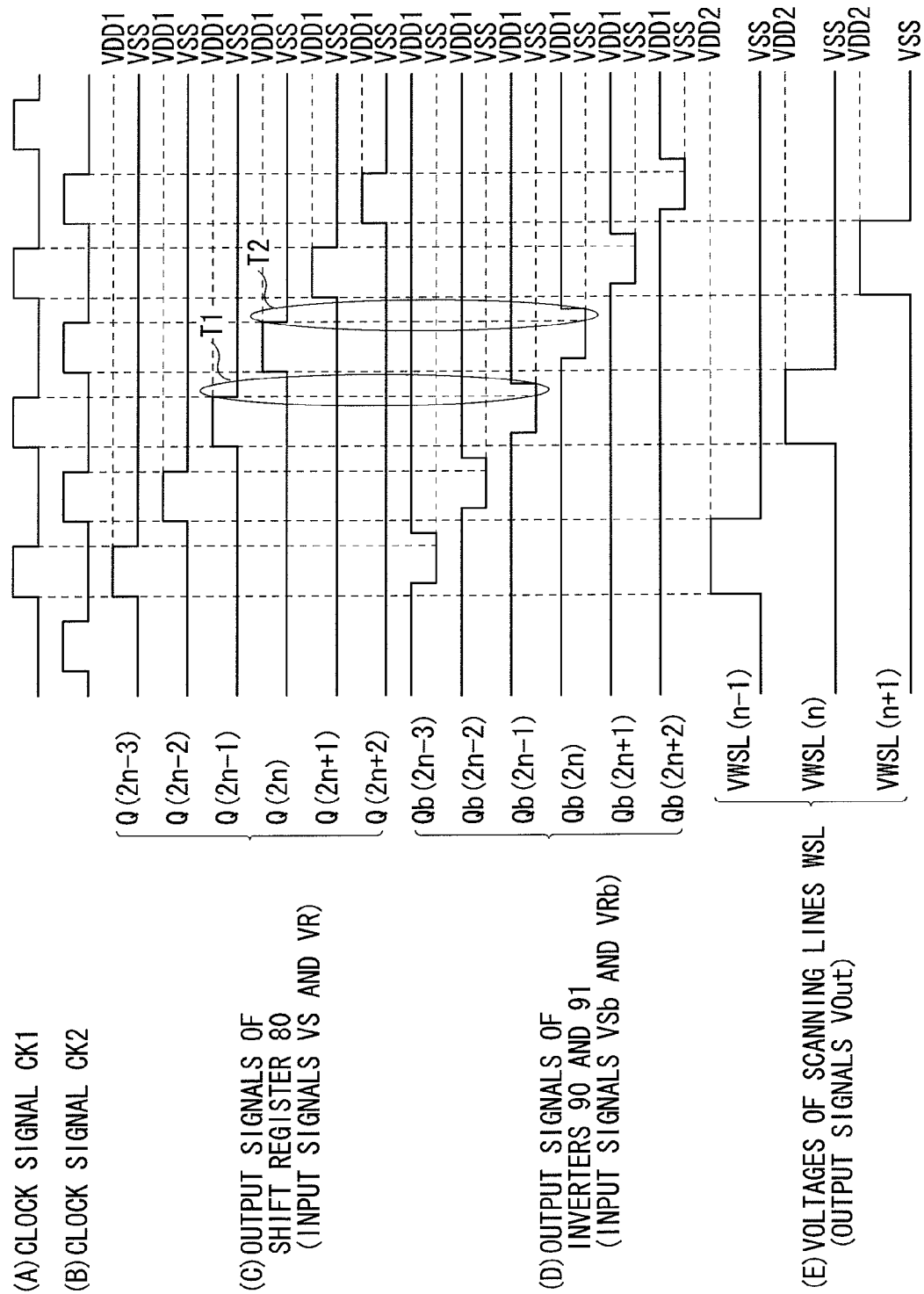
FIG. 29 is a timing waveform chart illustrating an operation example of the scanning line driving circuit illustrated in FIG. 28.

FIG. 29 illustrates a timing waveform chart of an operation of the scanning line driving circuit 73A, in which (A) illustrates a waveform of the clock signal CK1, (B) illustrates a waveform of the clock signal CK2, (C) illustrates waveforms of the output signals Q of the shift resistor 80, (D) illustrates waveforms of output signals Qb of the inverters 90 and 91, and (E) illustrates waveforms of the voltages VWSL of the scanning lines WSL. For the purpose of convenience in description, only the output signals Q of the shift register 80 and the output signals Qb of the inverters 90 and 91 that are related to three certain particular level shifters 10(n−1) to 10(n+1) are illustrated in FIG. 29. That is, only the waveforms of the output signals Q(2n−3) to Q(2n+2) are illustrated for the output signals Q of the shift register 80, and only the waveforms of the output signals Qb(2n−3) to Qb(2n+2) are illustrated for the output signals Qb of the inverters 90 and 91.

As illustrated in (A) and (B) of FIG. 29, the clock pulses alternately appear in the clock signals CK1 and CK2. The shift register 80, based on the clock signals CK1 and CK2, takes the clock pulses thereof one-by-one in order, and generates and outputs the output signals Q(1) to Q(2N) ((C) of FIG. 29). Each of the inverters 90 and 91 inverts the output signal Q supplied from the shift register 80, and outputs the inverted output signal Q as the output signal Qb ((D) of FIG. 29).

At this time, the waveform of the output signal Qb in each of the inverters 90 and 91 is delayed as compared with the input waveform thereof, due to a circuit delay in each of the inverters 90 and 91. For example, rising of the output signal Qb(2n−1) of the n-th inverter 90(n) is occurred immediately after the falling of the output signal Q(2n−1) of the shift resister 80 (a timing T1 of FIG. 29). Similarly, rising of the output signal Qb(2n) of the n-th inverter 91(n) is occurred immediately after the falling of the output signal Q(2n) of the shift resister 80 (a timing T2 of FIG. 29), for example.

The level shifters 10, based on the signals supplied from the shift resistor 80 and the inverters 90 and 91, each generate the signal having the larger amplitude than those of the signals supplied therefrom, and each apply the generated signal to the scanning line WSL as the voltage VWSL. More specifically, as illustrated in FIG. 28, the n-th level shifter 10(n) performs the operation described in any one of the embodiments and the modifications described above, by utilizing the output signal Q(2n−1) of the shift register 80 as the set signal VS, utilizing the output signal Qb(2n−1) of the inverter 90(n) as the inversion-set signal VSb, by utilizing the output signal Q(2n) of the shift register 80 as the reset signal VR, and utilizing the output signal Qb(2n) of the inverter 91(n) as the inversion-reset signal VRb, for example.

First, when the output signal Q(2n−1) (the set signal VS) of the shift register 80 rises from the voltage VSS to the voltage VDD1 ((C) of FIG. 29), the n-th level shifter 10(n) rises the voltage VWSL(n) of the scanning line WSL from the voltage VSS to the voltage VDD2 ((E) of FIG. 29). Thereafter, the output signal Q(2n−1) of the shift register 80 falls from the voltage VDD1 to the voltage VSS ((C) of FIG. 29), and then immediately, the output signal Qb(2n−1) (the inversion-set signal VSb) of the inverter 90(n) rises from the voltage VSS to the voltage VDD1 ((D) of FIG. 29). This timing relationship (the timing T1 in FIG. 29) allows the voltage change in the internal waveform of the level shifter 10(n) due to the falling of the set signal VS to be cancelled by the rising of the inversion-set signal VSb, and thereby the voltage VWSL(n) maintains the voltage VDD2 ((E) of FIG. 29) as described in the above embodiments and the modifications. It is to be noted that the slight change in the voltage in the output signal VOut during the time period from the falling of the set signal VS to the rising of the inversion-set signal VSb, illustrated in FIG. 2 etc., is omitted in FIG. 29.

Then, when the output signal Q(2n) (the reset signal VR) of the shift register 80 rises from the voltage VSS to the voltage VDD1 ((C) of FIG. 29), the n-th level shifter 10(n) causes the voltage VWSL(n) of the scanning line WSL to fall from the voltage VDD2 to the voltage VSS ((E) of FIG. 29). Thereafter, the output signal Q(2n) of the shift register 80 falls from the voltage VDD1 to the voltage VSS ((C) of FIG. 29), and then immediately, the output signal Qb(2n) (the inversion-reset signal VRb) of the inverter 91(n) rises from the voltage VSS to the voltage VDD1 ((D) of FIG. 29). This timing relationship (the timing T2 in FIG. 29) allows the voltage change in the internal waveform of the level shifter 10(n) due to the falling of the reset signal VR to be cancelled by the rising of the inversion-reset signal VRb, and thereby the voltage VWSL(n) maintains the voltage VSS ((E) of FIG. 29) as described in the above embodiments and the modifications. It is to be noted that the slight change in the voltage in the output signal VOut during the time period from the falling of the reset signal VR to the rising of the inversion-reset signal VRb, illustrated in FIG. 2 etc., is omitted in FIG. 29.

In the first applied example, the scanning line driving circuit 73A uses the proper or well-shaped waveforms, in which the high level voltages and the low level voltages are maintained, to drive the scanning lines WSL. This ensures, in the pixel 61 illustrated in FIG. 27, that the write transistor Tr1 is turned on to reliably transmit the signal voltage Vsig supplied from the signal line DTL to the gate of the drive transistor Tr2 even when the signal voltage Vsig is high in voltage, when the voltage VWSL of the scanning line WSL is at the high level. Therefore, it is possible to perform more reliable writing of the image signal. Also, when the voltage VWSL of the scanning line WSL is at the low level, it is possible to ensure that the write transistor Tr1 is reliably turned OFF to allow the voltage of the signal line DTL not to be transmitted to the gate of the drive transistor Tr2.

Second Applied Example

Now, a scanning line driving circuit according to a second applied example of any one of the level shifters described in the embodiments and the modifications, will be described. The second applied example differs from the first applied example, in that a way of supplying the reset signal VR and the inversion-reset signal VRb to each of the level shifters is modified. That is, in this applied example, the clock signal CK2 is used as the reset signal VR, and an inversion signal obtained by inverting the clock signal CK2 is used as the inversion-reset signal VRb. Note that the same or equivalent elements as those of the scanning line driving circuit according to the applied example described above are denoted with the same reference numerals, and will not be described in detail.

Configuration Example

Figure 30:
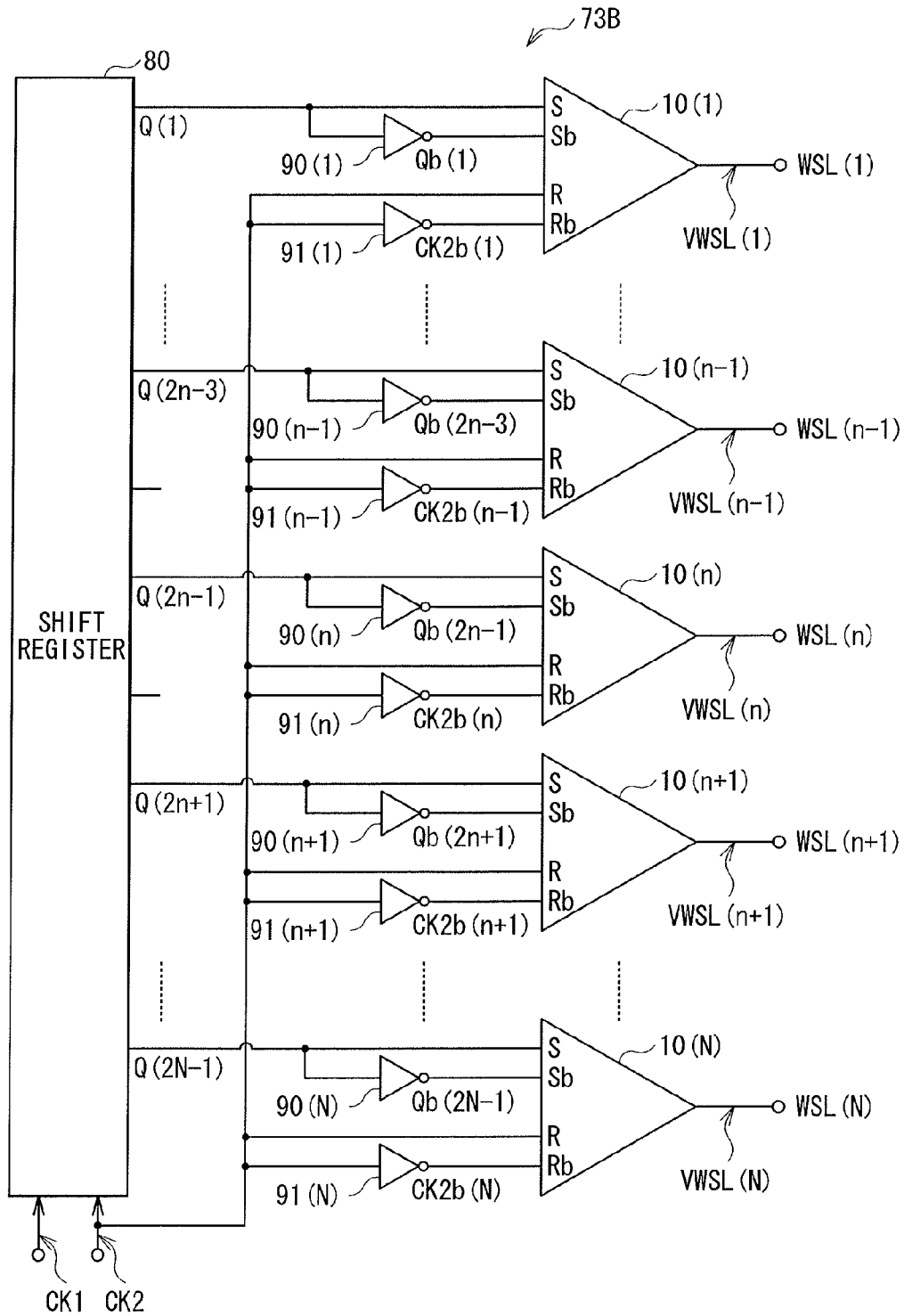
FIG. 30 is a block diagram illustrating an example of a configuration of a scanning line driving circuit according to a second applied example.

FIG. 30 illustrates an example of a configuration of a scanning line driving circuit 73B according to the second applied example of any one of the level shifters described in the embodiments and the modifications. In the scanning line driving circuit 73B, a signal supplied to the input terminal R of the level shifter 10 and to the input of the inverter 91 is the clock signal CK2. The other configurations in this applied example are similar to those of the above-described first applied example illustrated in FIG. 28. With this configuration, the clock signal CK2 is supplied as the reset signal VR to the input terminal R of each of the level shifters 10, and an inversion-clock signal CK2b which is the inversion signal of the clock signal CK2 is supplied as the inversion-reset signal VRb to the input terminal Rb of each of the level shifters 10. As used herein, the term "the inversion-clock signal CK2b" refers to the output signals CK2b(1) to CK2b(N) of the inverters 91(1) to 91(N), collectively.

It is to be noted that each of the level shifters 10 is provided with the single inverter 91 in FIG. 30. However, the level shifters 10 may share the single inverter 91, and the signal may be supplied from that inverter 91 to the N-number of level shifters 10.

Operation Example

Figure 31:
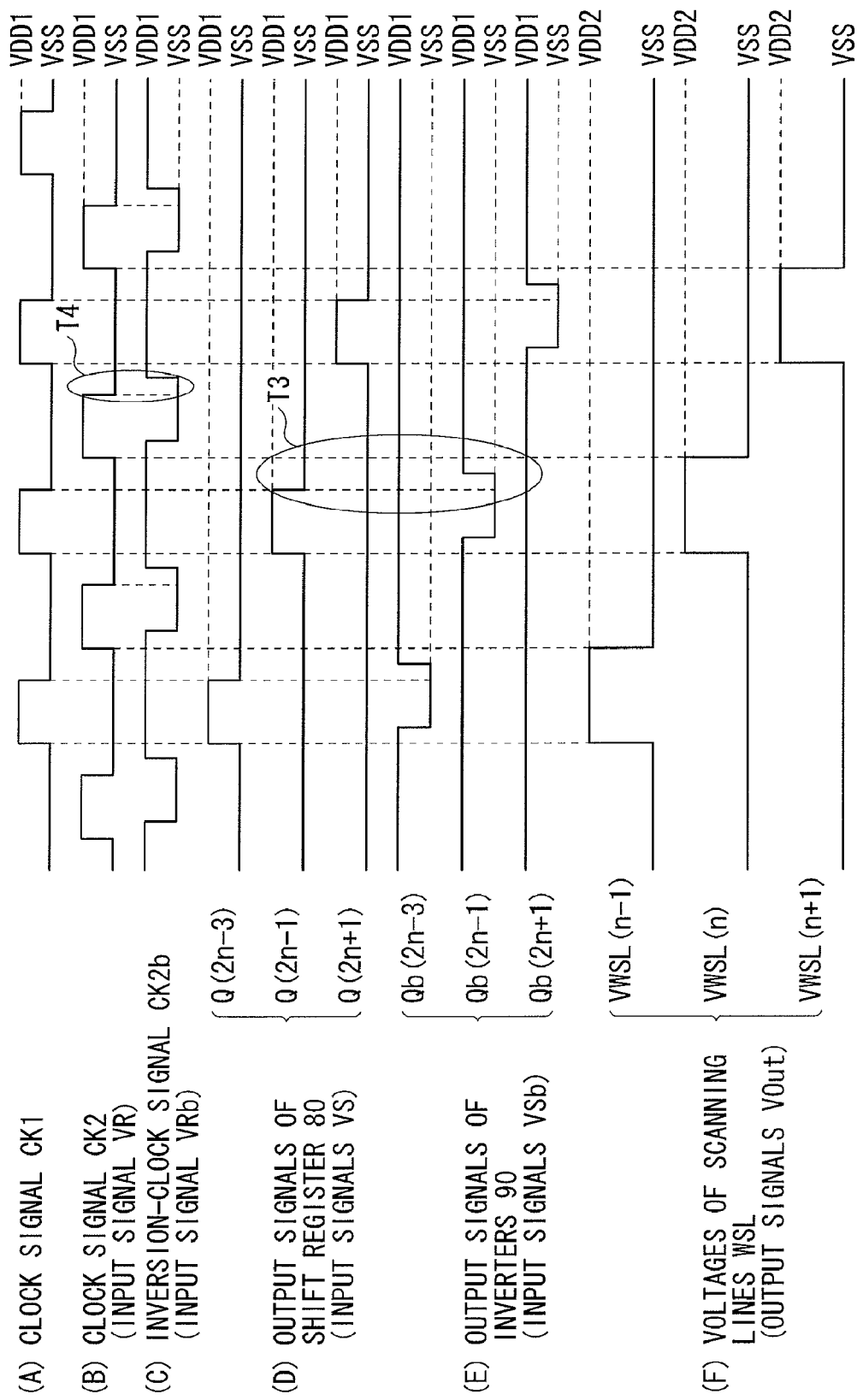
FIG. 31 is a timing waveform chart illustrating an operation example of the scanning line driving circuit illustrated in FIG. 30.

FIG. 31 illustrates a timing waveform chart of an operation of the scanning line driving circuit 73B, in which (A) illustrates a waveform of the clock signal CK1, (B) illustrates a waveform of the clock signal CK2, (C) illustrates a waveform of the inversion-clock signal CK2b, (D) illustrates waveforms of the odd-numbered output signals Q(2k−1) of the shift resistor 80, (E) illustrates waveforms of the odd-numbered output signals Q(2k−1) of the inverters 90, and (F) illustrates waveforms of the voltages VWSL of the scanning lines WSL. It is to be noted that only one waveform is illustrated for the inversion-clock signal CK2b, in view of the fact that the output signals CK2b(1) to CK2b(N) of the inverters 91 are mutually the same, approximately.

The shift register 80, based on the clock signals CK1 and CK2, takes the clock pulses thereof one-by-one in order, and generates and outputs the output signals Q(1) to Q(2N) ((D) of FIG. 31). Incidentally, only the output signals Q of the shift register 80 that are related to three certain particular level shifters 10(n−1) to 10(n+1) are illustrated in (D) of FIG. 31. Thus, only three waveforms of the output signals Q(2n−3), Q(2n−1), and Q(2n+1) corresponding respectively to the odd-numbered output signals Q(2k−1), are illustrated in FIG. 31. The inverters 90 respectively invert the odd-numbered output signals Q(2k−1) of the shift register 80, and output the inverted output signals Q(2k−1) as the output signal Q(2k−1) ((E) of FIG. 31).

At this time, the waveform of the output signal Qb(2k−1) in the inverter 90 is delayed as compared with the input waveform thereof, due to a circuit delay in the inverter 90. For example, rising of the output signal Qb(2n−1) of the n-th inverter 90(n) is occurred immediately after the falling of the output signal Q(2n−1) of the shift resister 80 (a timing T3 of FIG. 31).

Each of the inverters 91 inverts the clock signal CK2, and outputs the inverted clock signal CK2 as the inversion-clock signal CK2b ((C) of FIG. 31). At this time, the waveform of the output signal CK2b in the inverter 91 is delayed as compared with the input waveform thereof, due to a circuit delay in the inverter 91. For example, rising of the output signal CK2b of the n-th inverter 91(n) is occurred immediately after the falling of the clock signal CK2 (a timing T4 of FIG. 31).

The level shifters 10, based on the signals supplied from the shift resistor 80 and the inverters 90 and 91, and on the clock signal CK2, each generate the signal having the larger amplitude than those of the signals supplied therefrom, and each apply the generated signal to the scanning line WSL as the voltage VWSL. More specifically, as illustrated in FIG. 30, the n-th level shifter 10(n) performs the operation described in any one of the embodiments and the modifications described above, by utilizing the output signal Q(2n−1) of the shift register 80 as the set signal VS, utilizing the output signal Qb(2n−1) of the inverter 90(n) as the inversion-set signal VSb, by utilizing the clock signal CK2 as the reset signal VR, and utilizing the inversion-clock signal CK2b as the inversion-reset signal VRb, for example.

In the second applied example, the clock signal CK2 used in the shift register is utilized to generate the reset signal VR and the inversion-reset signal VRb, based on the clock signal CK2. Therefore, it is possible to allow a circuit to be compact in size.

Also, in the second applied example, the reset signal VR and the inversion-reset signal VRb are supplied regularly and frequently. Therefore, it is possible to achieve more stable operation of a circuit.

The other effects achieved by the second applied example are similar to those of the first applied example described above.

Third Applied Example

Now, a scanning line driving circuit according to a third applied example of any one of the level shifters described in the embodiments and the modifications, will be described. The third applied example differs from the above applied examples, in that the reset signal VR and the inversion-reset signal VRb for the respective level shifters are supplied from the outside of the scanning line driving circuit. Note that the same or equivalent elements as those of the scanning line driving circuits according to the applied examples described above are denoted with the same reference numerals, and will not be described in detail.

Configuration Example

Figure 32:
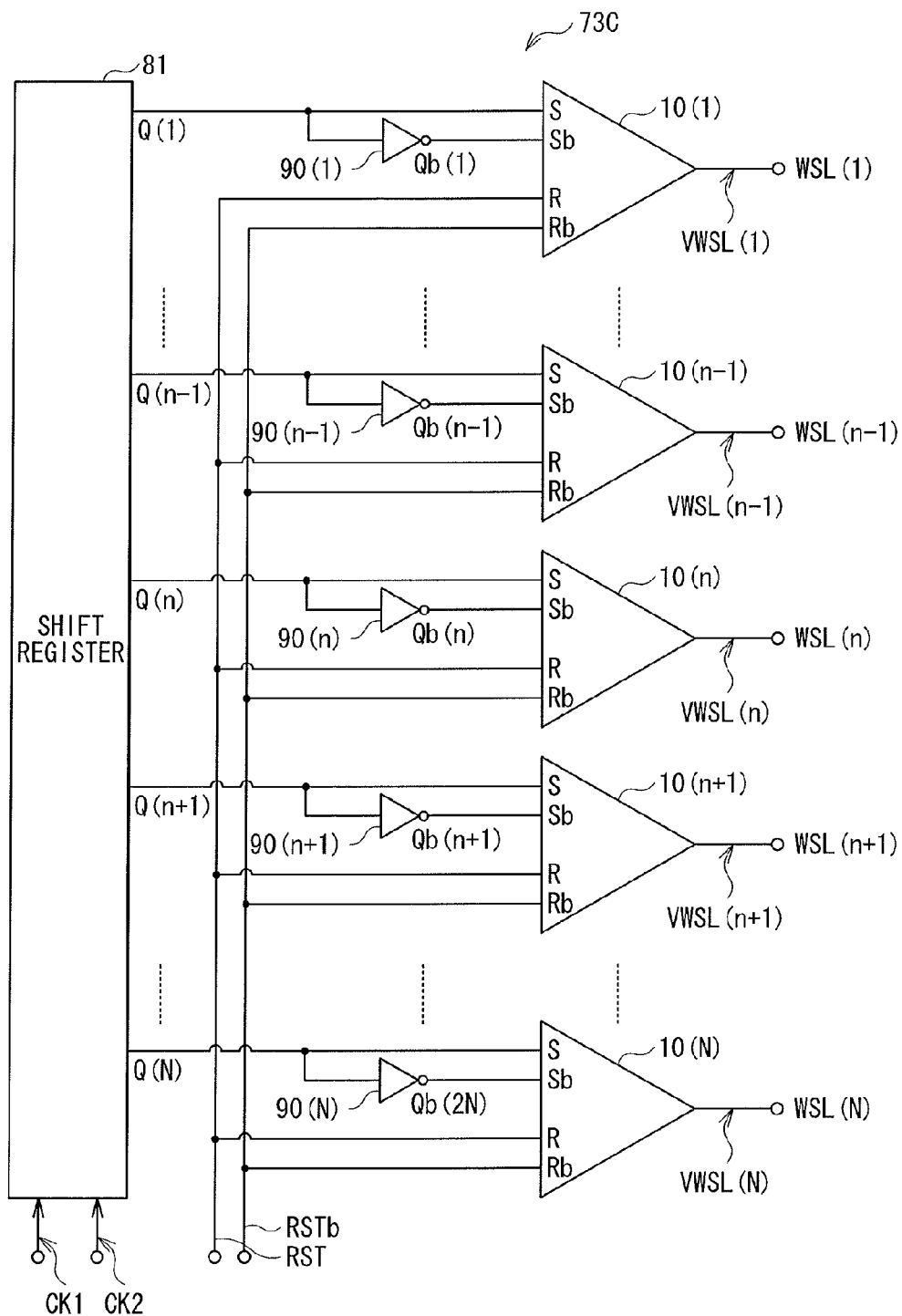
FIG. 32 is a block diagram illustrating an example of a configuration of a scanning line driving circuit according to a third applied example.

FIG. 32 illustrates an example of a configuration of a scanning line driving circuit 73C according to the third applied example of any one of the level shifters described in the embodiments and the modifications. The scanning line driving circuit 73C differs from the scanning line driving circuit 73A according to the first applied example illustrated in FIG. 28, in that the input terminal R of each of the level shifters 10 is supplied with a reset control signal RST supplied from the outside, the input terminal Rb of each of the level shifters 10 is supplied with an inversion-reset control signal RSTb supplied from the outside, and the inverters 91 are eliminated.

The reset control signal RST is a signal in which a pulse signal appears between the pulse signals of the clock signals CK1 and CK2. The inversion-reset control signal RSTb is a signal having a waveform obtained by inverting the reset control signal RST, and includes a pulse signal having an opposite polarity to that of the pulse signal which appears in the reset control signal RST.

Further, the scanning line driving circuit 73C is provided with shift registers 81 for outputting output signals Q(1) to Q(N), in place of the shift registers 80 which output the output signals Q(1) to Q(2N). As in the shift register 80, the shift resistor 81 is a circuit which sequentially generates, in a time-divisional fashion, N-number of pulse signals based on the clock signal CK1 and the clock signal CK2 which are inputted, and outputs the generated N-number of pulse signals in an order of generation thereof as the output signals Q(1) to Q(N).

In accordance with these modifications, the inputs for the level shifters 10 are also modified as follows. In the n-th level shifter 10(n), the input terminal S is supplied with the output signal Q(n) of the shift register 81, and the input terminal Sb is supplied with the output signal Qb(n) of the inverter 90(n), to which the signal supplied to the input terminal S is inputted. Further, in the n-th level shifter 10(n), the input terminal R is supplied with the reset control signal RST, and the input terminal Rb is supplied with the inversion-reset control signal RSTb.

The other configurations are similar to those of the above-described first applied example illustrated in FIG. 28.

Operation Example

Figure 33:
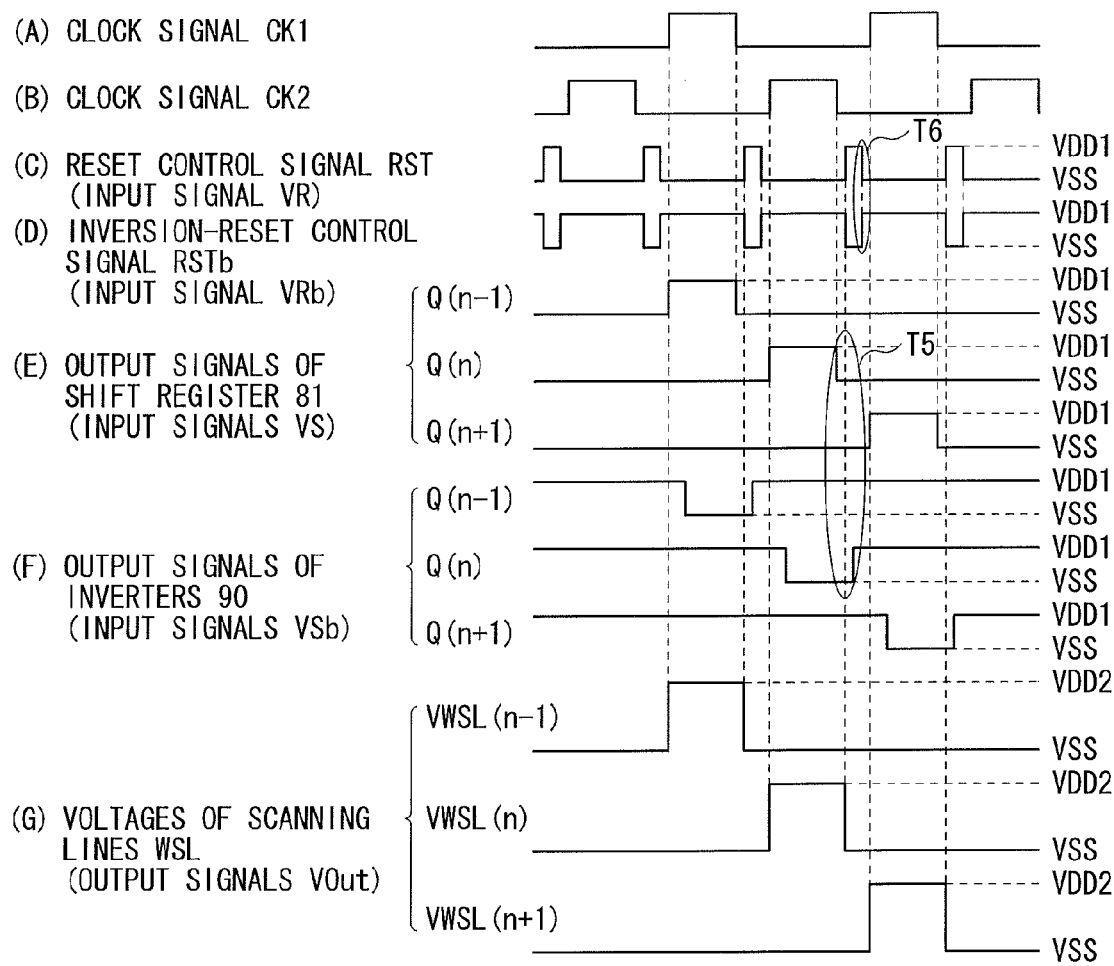
FIG. 33 is a timing waveform chart illustrating an operation example of the scanning line driving circuit illustrated in FIG. 32.

FIG. 33 illustrates a timing waveform chart of an operation of the scanning line driving circuit 73C, in which (A) illustrates a waveform of the clock signal CK1, (B) illustrates a waveform of the clock signal CK2, (C) illustrates a waveform of the reset control signal RST, (D) illustrates a waveform of the inversion-reset control signal RSTb, (E) illustrates waveforms of the output signals Q of the shift resistor 81, (F) illustrates waveforms of the output signals Qb of the inverters 90, and (G) illustrates waveforms of the voltages VWSL of the scanning lines WSL.

The shift register 81, based on the clock signals CK1 and CK2, takes the clock pulses thereof one-by-one in order, and generates and outputs the output signals Q(1) to Q(N) ((E) of FIG. 33). The inverters 90 respectively invert the output signals Q of the shift register 81, and output the inverted output signals Q as the output signal Qb ((F) of FIG. 33).

At this time, the waveform of the output signal Qb in the inverter 90 is delayed as compared with the input waveform thereof, due to a circuit delay in the inverter 90. For example, rising of the output signal Qb(n) of the n-th inverter 90(n) is occurred immediately after the falling of the output signal Q(n) of the shift resister 80 (a timing T5 of FIG. 33).

As illustrated in (C) of FIG. 33, a voltage of the reset control signal RST, supplied from the outside, is at a high level only in a portion of a time period in which voltages of the clock signals CK1 and CK2 are both at the low level. The inversion-reset control signal RSTb, supplied also from the outside, is the signal obtained by inverting the reset control signal RST, as illustrated in (D) of FIG. 33. The inversion-reset control signal RSTb can be any signal generated by an optional way, as long as the signal satisfy the condition that the rising of the inversion-reset control signal RSTb is at the same time as or immediately after the falling of the reset control signal RST (a timing T6 of FIG. 33). For example, the inversion-reset control signal RSTb can be a signal generated by an inverter based on the reset control signal RST, a signal generated separately from the reset control signal RST, or other suitable signal.

The level shifters 10, based on the signals supplied from the shift resistor 81 and the inverters 90, on the reset control signal RST, and on the inversion-reset control signal RSTb, each generate the signal having the larger amplitude than those of the signals supplied therefrom, and each apply the generated signal to the scanning line WSL as the voltage VWSL. More specifically, as illustrated in FIG. 32, the n-th level shifter 10(n) performs the operation described in any one of the embodiments and the modifications described above, by utilizing the output signal Q(n) of the shift register 81 as the set signal VS, utilizing the output signal Qb(n) of the inverter 90(n) as the inversion-set signal VSb, by utilizing the reset control signal RST as the reset signal VR, and utilizing the inversion-reset control signal RSTb as the inversion-reset signal VRb, for example.

In the third applied example, the reset control signal RST and the inversion-reset signal RSTb are supplied from the outside. Therefore, it is possible to set a timing of those signals freely, and to increase a degree of freedom of the operation of the scanning line driving circuit 73C.

Also, in the third applied example, the inverters 91 are removed from the first applied example, and the shift register 81 in which the number of outputs is decreased by half is used. Therefore, it is possible to reduce the number of elements in the scanning line driving circuit, and to achieve more simplified configuration.

Further, in the third applied example, the pulses of the reset control signal RST and the inversion-reset signal RSTb are each supplied between the pulse signals of the clock signals CK1 and CK2, and all of the output signals Q of the shift register 81 and those signals are used to operate the level shifters 10. Therefore, when frequencies of the clock signals CK1 and CK2 are set to be the same as those in the first applied example, it is possible to reduce the time it takes to apply the voltage VWSL to all of the scanning lines WSL to half.

The other effects achieved by the third applied example are similar to those of the first applied example described above.

Fourth Applied Example

Now, a scanning line driving circuit according to a fourth applied example of any one of the level shifters described in the embodiments and the modifications, will be described. The fourth applied example differs from the above applied examples, in that the reset signal VR and the inversion-reset signal VRb for the respective level shifters are supplied from the outside of the scanning line driving circuit as in the third applied example, and further, the inversion set signal VSb for the respective level shifters is generated from the clock signals CK1 and CK2. Note that the same or equivalent elements as those of the scanning line driving circuits according to the applied examples described above are denoted with the same reference numerals, and will not be described in detail.

Configuration Example

Figure 34:
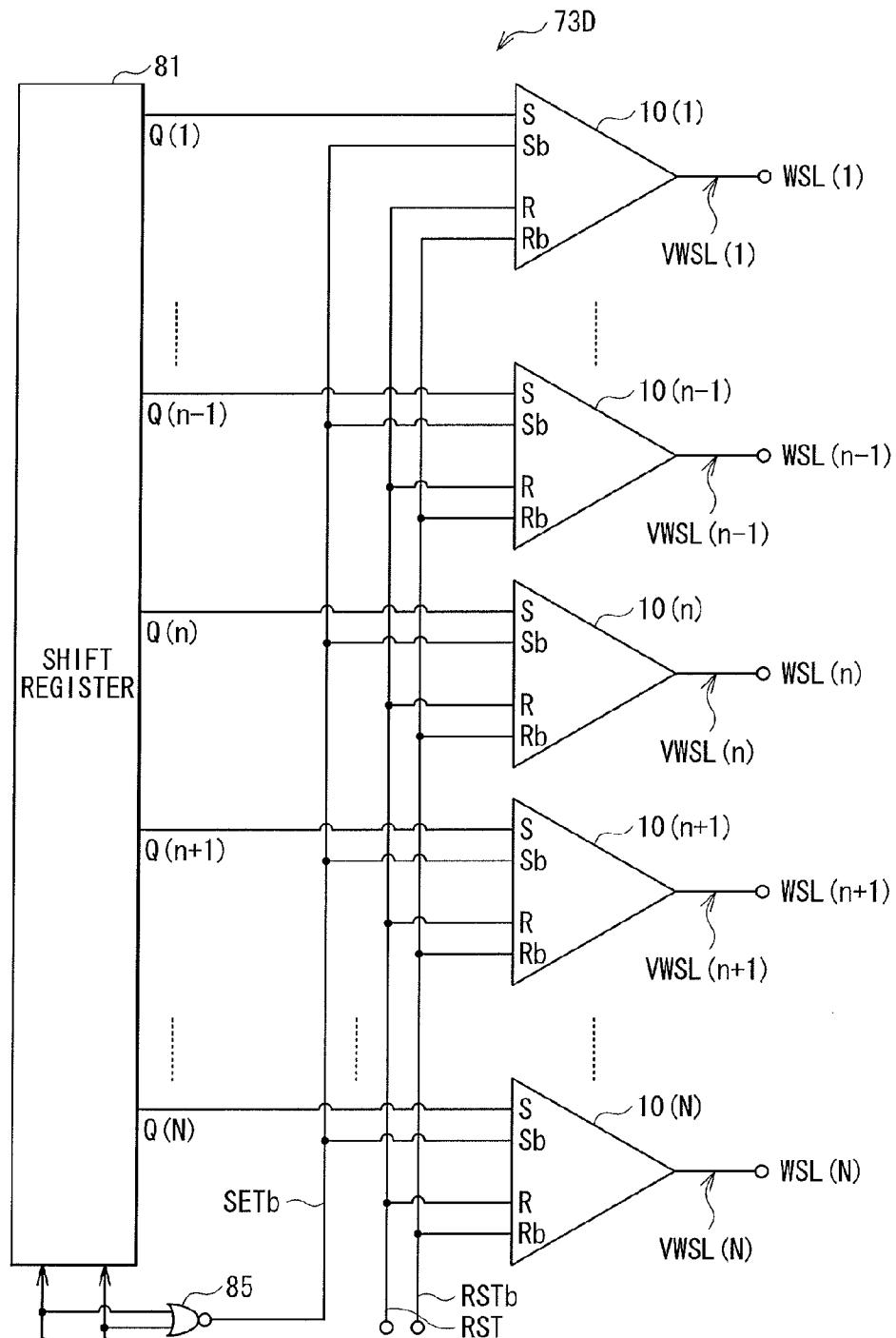
FIG. 34 is a block diagram illustrating an example of a configuration of a scanning line driving circuit according to a fourth applied example.

FIG. 34 illustrates an example of a configuration of a scanning line driving circuit 73D according to the fourth applied example of any one of the level shifters described in the embodiments and the modifications. The scanning line driving circuit 73D differs from the scanning line driving circuit 73C according to the third applied example illustrated in FIG. 32, in that the input terminal Sb of each of the level shifters 10 is so modified that the input terminal Sb is supplied with an output signal SETb from a NOR circuit 85, which generates an inversion-logical OR of the clock signal CK1 and the clock signal CK2 and output the generated inversion-logical OR as the output signal SETb, so as to eliminate the inverters 90. The other configurations in this applied example are similar to those of the above-described third applied example illustrated in FIG. 32.

Operation Example

Figure 35:
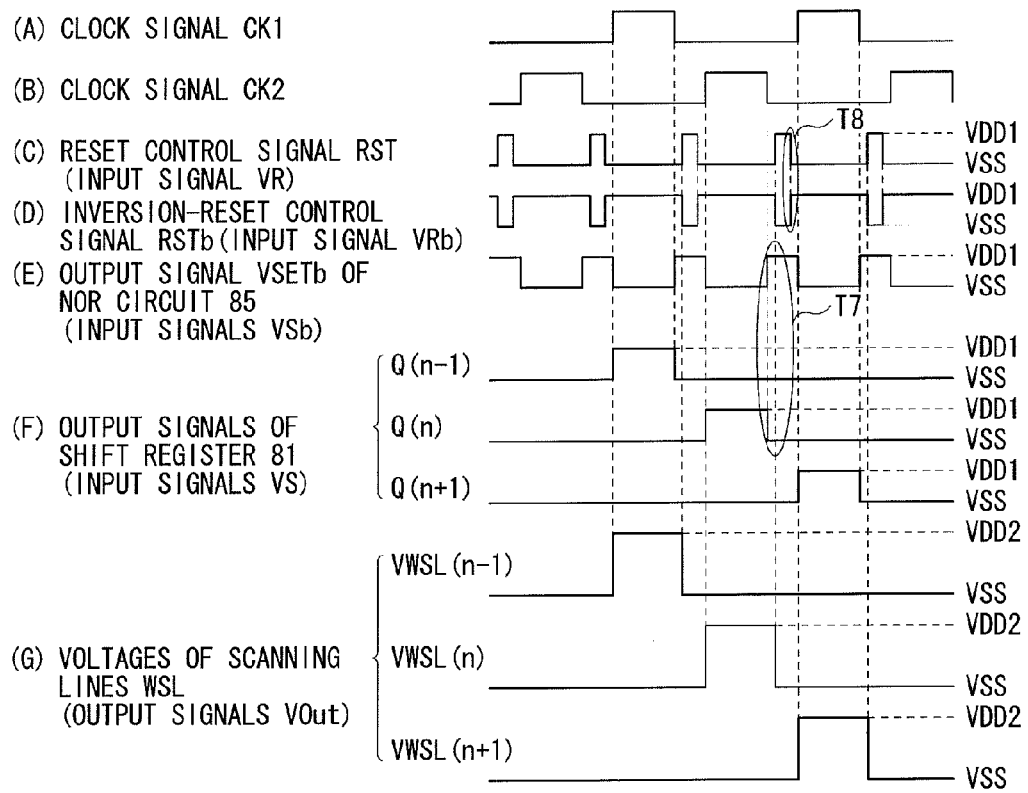
FIG. 35 is a timing waveform chart illustrating an operation example of the scanning line driving circuit illustrated in FIG. 34.

FIG. 35 illustrates a timing waveform chart of an operation of the scanning line driving circuit 73D, in which (A) illustrates a waveform of the clock signal CK1, (B) illustrates a waveform of the clock signal CK2, (C) illustrates a waveform of the reset control signal RST, (D) illustrates a waveform of the inversion-reset control signal RSTb, (E) illustrates a waveform of the output signal SETb of the NOR circuit 85, (F) illustrates waveforms of the output signals Q of the shift register 81, and (G) illustrates waveforms of the voltages VWSL of the scanning lines WSL.

The shift register 81, based on the clock signals CK1 and CK2, takes the clock pulses thereof one-by-one in order, and generates and outputs the output signals Q(1) to Q(N) ((F) of FIG. 35). The NOR circuit 85 generates the inversion-logical OR of the clock signal CK1 and the clock signal CK2, and outputs the output signal SETb ((E) of FIG. 35). The falling of the output signal Q of the shift register 81 and the rising of the output signal SETb of the NOR circuit 85 occur respectively based on the falling of the clock signal CK2, and occur, in principle, at the same timing (a timing T7 of FIG. 35).

As already described in the third applied example, the inversion-reset control signal RSTb is so supplied from the outside, that the rising of the inversion-reset control signal RSTb is at the same time as or immediately after the falling of the reset control signal RST (a timing T8 of FIG. 35).

The level shifters 10, based on the signals supplied from the shift resistor 81 and the NOR circuit 85, on the reset control signal RST, and on the inversion-reset control signal RSTb, each generate the signal having the larger amplitude than those of the signals supplied therefrom, and each apply the generated signal to the scanning line WSL as the voltage VWSL. More specifically, as illustrated in FIG. 34, the n-th level shifter 10(n) performs the operation described in any one of the embodiments and the modifications described above, by utilizing the output signal Q(n) of the shift register 81 as the set signal VS, utilizing the output signal SETb of the NOR circuit 85 as the inversion-set signal VSb, by utilizing the reset control signal RST as the reset signal VR, and utilizing the inversion-reset control signal RSTb as the inversion-reset signal VRb, for example.

In each of the first to the third applied examples, the set signal VS and the inversion-set signal VSb are in an inverted relationship, and the reset signal VR and the inversion-reset signal VRb are likewise in an inverted relationship. In contrast, in the fourth applied example, the set signal VS ((F) of FIG. 35) and the inversion-set signal VSb ((E) of FIG. 35) are not in the inverted relationship, and in particular, the inversion-set signal VSb continues to repeat the transition periodically even after the inversion-set signal VSb has once risen immediately after the falling of the set signal VS ((E) of FIG. 35). This may mean that the periodical waveform of the inversion-set signal VSb is likely to be transmitted to the internal waveforms of the level shifter 10, and malfunction or errors may be generated.

Thus, in case of the generation of malfunction or errors, a scheme may be introduced, which interrupts the inversion-set signal VSb when an output signal of the level shifter 10 is at a low level, for example.

Figure 36:
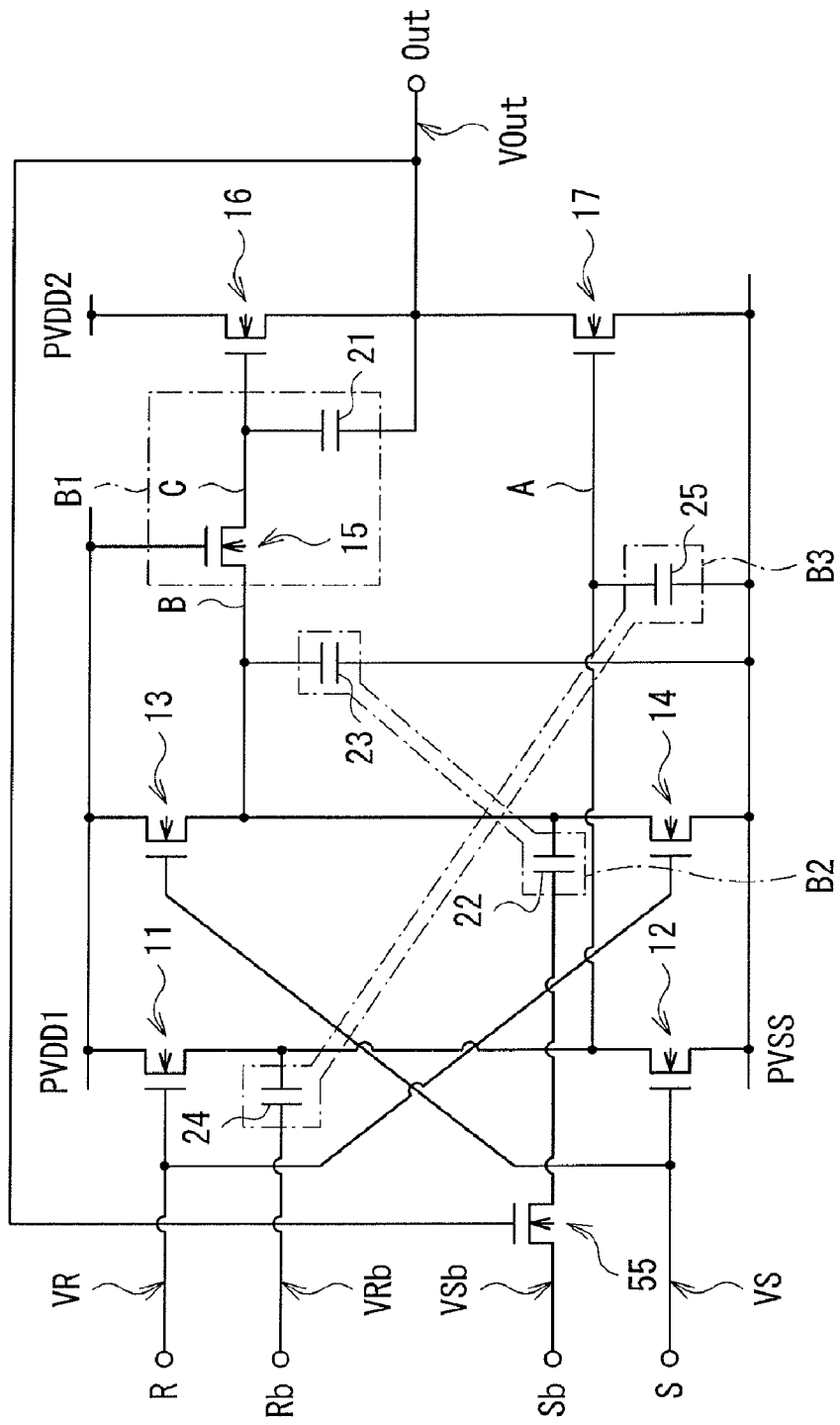
FIG. 36 is a circuit diagram illustrating an example of a configuration of a level shifter illustrated in FIG. 34.

FIG. 36 illustrates an example of a configuration of a level shifter 110 according to the fourth applied example of any one of the level shifters described in the embodiments and the modifications. The level shifter 110 differs from the level shifter 10 illustrated in FIG. 1, in that a MOS transistor 55, which is ON-OFF controlled based on the output signal VOut, is newly provided between the input terminal Sb and the capacitive element 22 in the level shifter 10. With this configuration, the MOS transistor 55 is in an ON state when the output signal VOut of the level shifter 110 is at the high level, so that the inversion-set signal VSb supplied to the input terminal Sb is transmitted to the node B through the capacitive element 22, thereby making it possible to cancel the voltage change caused by the immediately-previous set signal VS. On the other hand, the MOS transistor 55 is in an OFF state when the output signal VOut is at the low level, so that the inversion-set signal VSb supplied to the input terminal Sb is interrupted. Thereby, it is possible to prevent the occurrence of the malfunction or errors.

It is to be noted that, herein, the MOS transistor 55 is added to the level shifter 10 illustrated in FIG. 1, although it is not limited thereto. The scheme described above with reference to FIG. 36 is applicable to any of the level shifters according to the embodiments and the modifications.

In the fourth applied example, the inverters 90 are removed from the third applied example. Therefore, it is possible to reduce the number of elements in the scanning line driving circuit, and to achieve more simplified configuration. The other effects achieved by the fourth applied example are similar to those of the third applied example described above.

Fifth Applied Example

Now, a scanning line driving circuit according to a fifth applied example of any one of the level shifters described in the embodiments and the modifications, will be described. The fifth applied example uses a shift register, which outputs a signal at a timing different from the timing in the applied examples described above. That is, this applied example uses the shift register, which transmits a pulse signal in a certain output and transmits a pulse signal in a subsequent output at a timing in which the pulse signal in the certain output has returned to a low level, to structure the scanning line driving circuit. Note that the same or equivalent elements as those of the scanning line driving circuits according to the applied examples described above are denoted with the same reference numerals, and will not be described in detail.

Configuration Example

Figure 37:
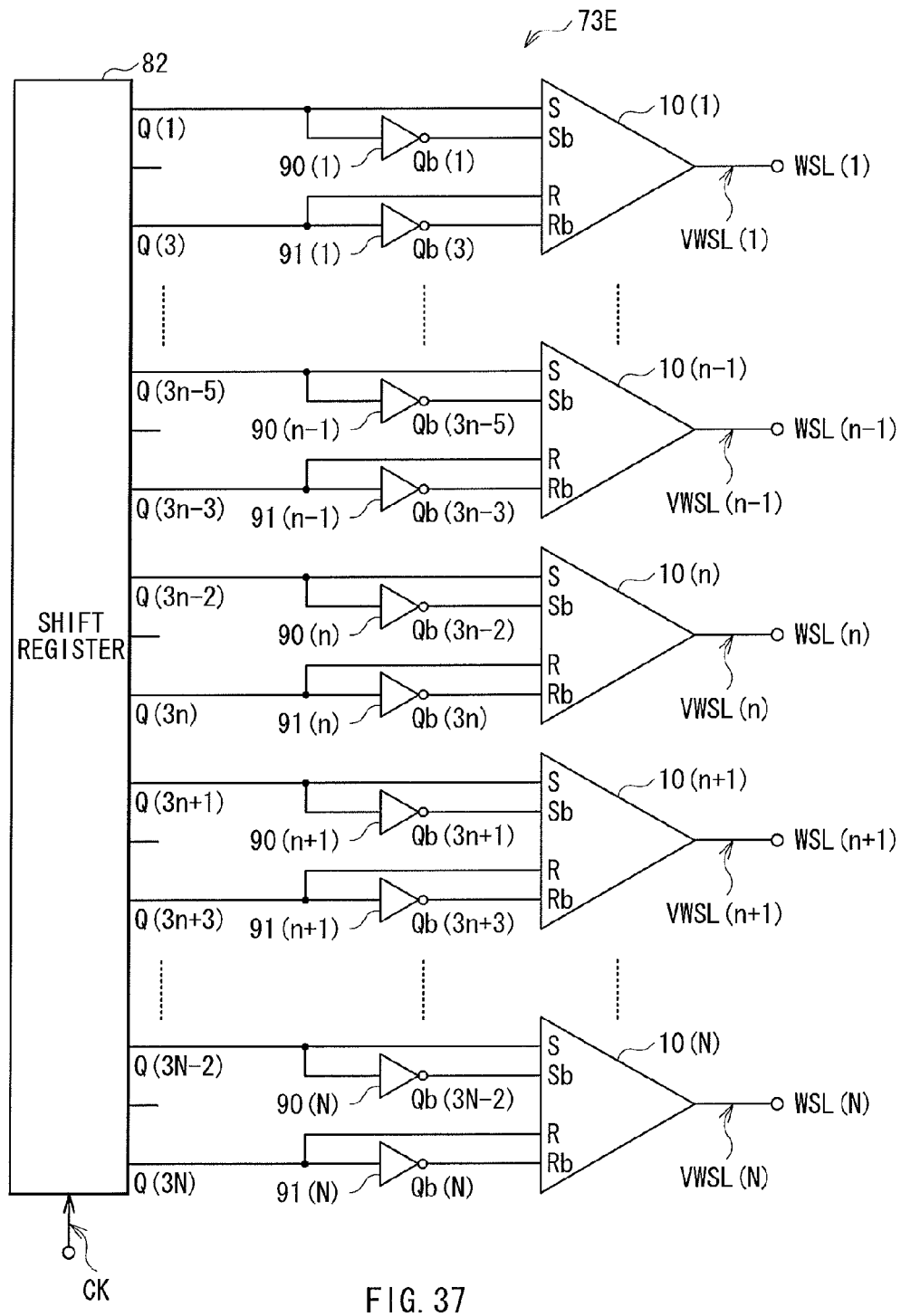
FIG. 37 is a block diagram illustrating an example of a configuration of a scanning line driving circuit according to a fifth applied example.

FIG. 37 illustrates an example of a configuration of a scanning line driving circuit 73E according to the fifth applied example of any one of the level shifters described in the embodiments and the modifications. The scanning line driving circuit 73E is provided with a shift register 82.

The shift register 82 has function of sequentially generating, in a time-divisional fashion, 3N-number of pulse signals based on a clock signal CK which is inputted, and outputting the generated 3N-number of pulse signals in an order of generation thereof as the output signals Q(1) to Q(3N). The clock signal CK is a repetitive waveform having a duty ratio of 50%, and is one illustrative example of a signal included in the control signal 72A which the timing generating circuit 72 generates and outputs. It is to be noted that, in the following, the output signals Q(1) to Q(3N) may be collectively referred to as output signals Q where appropriate.

In accordance with these modifications in the shift register 82, connections among the N-number of inverters 90, the N-number of inverters 91, and the N-number of level shifters 10 are also modified as follows. Each of the inverters 90 handle the output signal Q(3k–2) (where k is a natural number equal to or less than N) of the shift resistor 82 as an input, inverts the output signal Q, and outputs the inverted output signal Q as an output signal Qb(2k–1). Each of the inverters 91 handles the output signal Q(3k) of the shift resistor 82 as an input, inverts the output signal Q, and outputs the inverted output signal Q as an output signal Qb(3k). It is to be noted that, in the following, the output signals Qb(1) to Qb(2N) may be collectively referred to as output signals Qb where appropriate.

The n-th level shifter 10(n) includes: the input terminal S to which the output signal Q(3n–2) of the shift resistor 82 is supplied; the input terminal Sb to which the output signal Qb(3n–2) of the inverter 90(n), the input thereto being the signal supplied to the input terminal S, is supplied; the input terminal R to which the output signal Q(3n) of the shift resistor 82 is supplied; and the input terminal Rb to which the output signal Qb(3n) of the inverter 91(n), the input thereto being the signal supplied to the input terminal R, is supplied.

Operation Example

Figure 38:
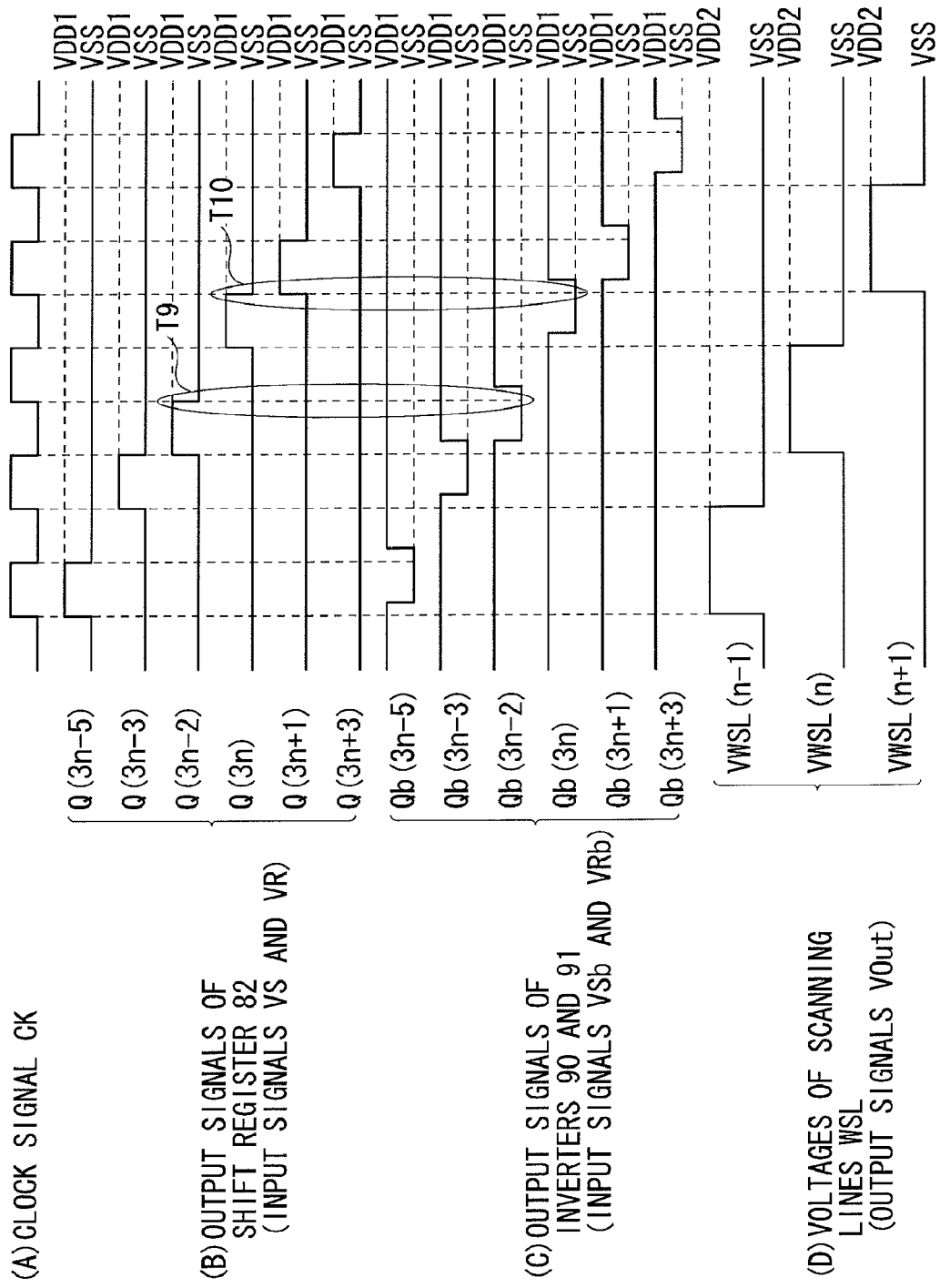
FIG. 38 is a timing waveform chart illustrating an operation example of the scanning line driving circuit illustrated in FIG. 37.

FIG. 38 illustrates a timing waveform chart of an operation of the scanning line driving circuit 73E, in which (A) illustrates a waveform of the clock signal CK, (B) illustrates waveforms of the output signals Q of the shift register 82, (C) illustrates waveforms of output signals Qb of the inverters 90 and 91, and (D) illustrates waveforms of the voltages VWSL of the scanning lines WSL.

The shift register 82, based on the clock signal CK, generates pulse signals, each having the same pulse width as the clock signal CK, to generate and output the output signals Q(1) to Q(3N) ((B) of FIG. 38). Herein, the shift register 82 so operates that the pulse signals are outputted continually from any one of the output signals Q(1) to Q(3N). For example, when the output signal Q(n) has risen with the rising of the clock signal CK, the output signal Q(n+1) rises at the same time as the falling of the output signal Q(n) in the subsequent falling of the clock signal CK.

In (B) of FIG. 38, only the output signals Q of the shift register 82 that are related to three particular level shifters 10(n–1) to 10(n+1) are illustrated. Thus, only the six waveforms of the output signals Q(3n–5), Q(3n–3), Q(3n–2), Q(3n), Q(3n+1), and Q(3n+3) are illustrated for the output signals Q of the shift register 82, and waveforms of the signals such as Q(3n–4), Q(3n–1), and Q(3n+2) are not illustrated, for example.

Each of the inverters 90 and 91 inverts the output signal Q supplied from the shift register 82, and outputs the inverted output signal Q as the output signal Qb ((D) of FIG. 29). At this time, the waveform of the output signal Qb in each of the inverters 90 and 91 is delayed as compared with the input waveform thereof, due to a circuit delay in each of the inverters 90 and 91. For example, rising of the output signal Qb(3n–2) of the n-th inverter 90(n) is occurred immediately after the falling of the output signal Q(3n–2) of the shift resister 82 (a timing T9 of FIG. 38). Similarly, rising of the output signal Qb(3n) of the n-th inverter 91(n) is occurred immediately after the falling of the output signal Q(3n) of the shift resister 82 (a timing T10 of FIG. 38), for example.

The level shifters 10, based on the signals supplied from the shift resistor 82 and the inverters 90 and 91, each generate the signal having the larger amplitude than those of the signals supplied therefrom, and each apply the generated signal to the scanning line WSL as the voltage VWSL. More specifically, as illustrated in FIG. 37, the n-th level shifter 10(n) performs the operation described in any one of the embodiments and the modifications described above, by utilizing the output signal Q(3n–2) of the shift register 82 as the set signal VS, utilizing the output signal Qb(3n–2) of the inverter 90(n) as the inversion-set signal VSb, by utilizing the output signal Q(3n) of the shift register 82 as the reset signal VR, and utilizing the output signal Qb(3n) of the inverter 91(n) as the inversion-reset signal VRb, for example.

In the level shifters according to the embodiments and the modifications, the through-current may be generated from the power sources PVDD1 and the PVDD2 to the power source PVSS when both of the set signal VS and the reset signal VR are set at the high level, and the power consumption increases accordingly. Hence, it is desirable that both of the set signal VS and the reset signal VR not be at the high level at the same time even if it is instantaneous.

In the fifth applied example, one of the three outputs among the outputs of the shift register 82 is not used, so as not to allow the set signal VS and the reset signal VR, inputted to a certain level shifter 10, to be at the high level at the same time. For example, in the n-th level shifter 10(n), the pulse signal in the output signal Q(3n–2) of the shift register 82 is used as the set signal VS, and the output signal Q(3n) of the shift register 82 is used as the reset signal VR. In other words, the output signal Q(3n–1) of the shift register 82 is not used, thereby allowing both of the set signal VS and the reset signal VR not to be at the high level at the same time even for an instantaneous moment.

In the fifth applied example, consecutive two output signals are caused not to be used for the set signal and the reset signal, in the shift register in which the pulse signals are sequentially output in a continual fashion from any one of the output signals. Therefore, it is possible to prevent the through-current, and to achieve low-power consumption. The other effects achieved by the fifth applied example are similar to those of the first applied example described above.

7. Application Examples to Electronic Device

Now, application examples to electronic devices of the level shifters, the driving circuits, and the display devices according to the embodiment, modifications, and the applied examples will be described with reference to FIG. 39 to FIG. 43G The level shifters, the driving circuits, and the display devices according to the embodiments, modifications, and the applied examples are applicable to any electronic device in any field. The electronic device can be, for example but not limited to, a television device, a digital camera, a computer including a desk-top personal computer and a laptop personal computer, a portable terminal device including a cellular phone, a video camera, or any other devices in which supplying of proper or well-shaped waveform is desirable.

First Application Example

Figure 39:
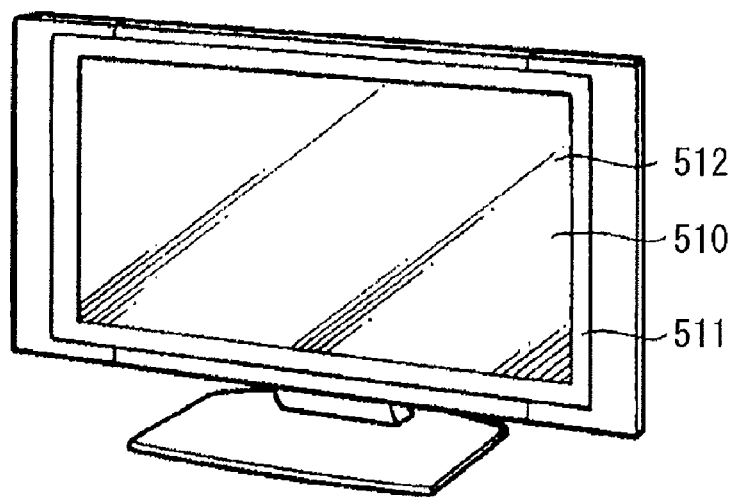
FIG. 39 is a perspective view illustrating an external appearance of a first application example.

FIG. 39 illustrates an external appearance of a television device to which the level shifter, the driving circuit, and the display device according to any one of the embodiments etc. described above are applied. The television device is provided with an image display screen unit 510 including a front panel 511 and a filter glass 512, for example. The image display screen unit 510 includes the level shifter, the driving circuit, and the display device according to any one of the embodiments etc. described above.

Second Application Example

Figure 40A:
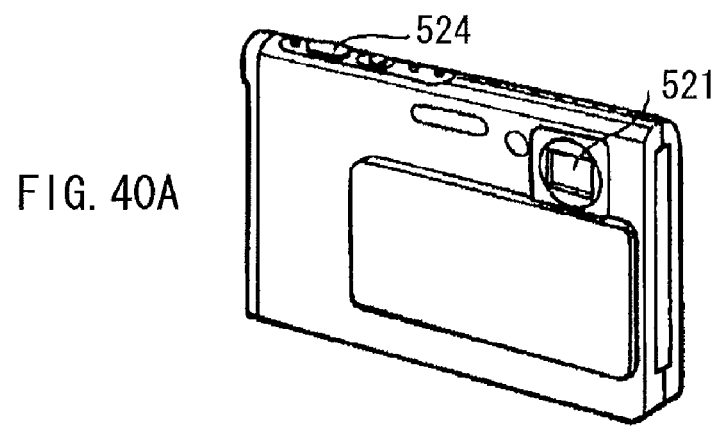
FIG. 40A is a perspective view illustrating an external appearance of a second application example as viewed from a front side thereof.
Figure 40B:
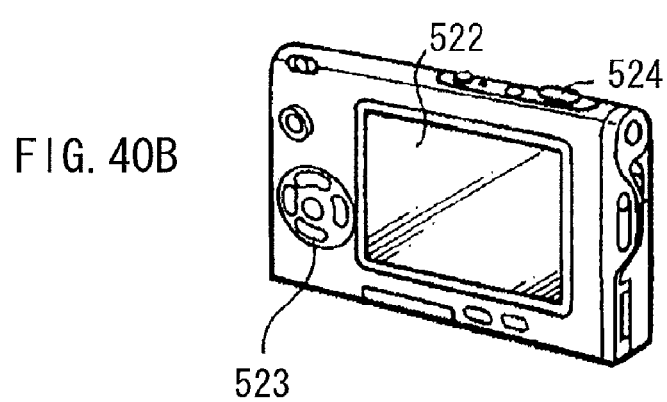
FIG. 40B is a perspective view illustrating the external appearance of the second application example as viewed from a back side thereof.

FIGS. 40A and 40B each illustrate an external appearance of a digital camera to which the level shifter, the driving circuit, and the display device according to any one of the embodiments etc. described above are applied. The digital camera is provided with a light emitting unit 521 for flash, a display unit 522, a menu switch section 523, and a shutter-release button 524, for example. The display unit 522 includes the level shifter, the driving circuit, and the display device according to any one of the embodiments etc. described above.

Third Application Example

Figure 41:
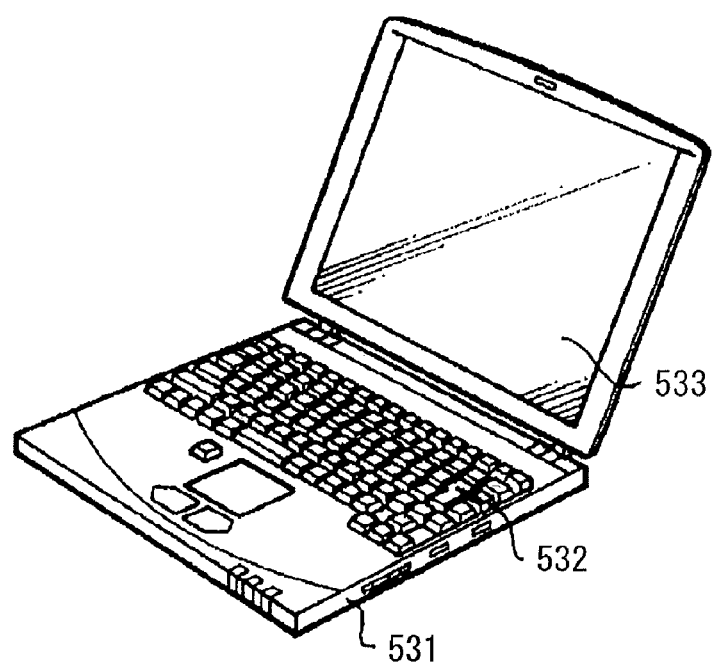
FIG. 41 is a perspective view illustrating an external appearance of a third application example.

FIG. 41 illustrates an external appearance of laptop personal computer to which the level shifter, the driving circuit, and the display device according to any one of the embodiments etc. described above are applied. The laptop personal computer is provided with a body 531, a keyboard 532 for input-manipulation of characters and the like, and a display unit 533 for displaying an image, for example. The display unit 533 includes the level shifter, the driving circuit, and the display device according to any one of the embodiments etc. described above.

Fourth Application Example

Figure 42:
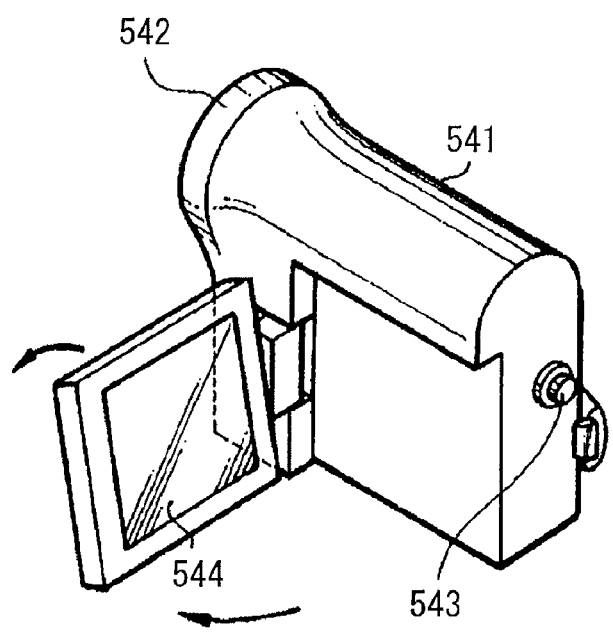
FIG. 42 is a perspective view illustrating an external appearance of a fourth application example.

FIG. 42 illustrates an external appearance of a video camera to which the level shifter, the driving circuit, and the display device according to any one of the embodiments etc. described above are applied. The video camera is provided with a body 541, a lens 542 provided in a front face of the body 541 for picking-up an image of an object, a shooting start/stop switch 543, and a display unit 544, for example. The display unit 544 includes the level shifter, the driving circuit, and the display device according to any one of the embodiments etc. described above.

Fifth Application Example

FIGS. 43A to 43G each illustrate an external appearance of a cellular phone to which the level shifter, the driving circuit, and the display device according to any one of the embodiments etc. described above are applied. The cellular phone couples an upper casing 710 and a lower casing 720 through a coupling part (or a hinge) 730, and is provided with a display 740, a sub-display 750, a picture light 760, and a camera 770, for example. The display 740 or the sub-display 750 includes the level shifter, the driving circuit, and the display device according to any one of the embodiments etc. described above.

Although the invention has been described in the foregoing by way of example with reference to the embodiments, the modifications, the applied examples, and the application examples to the electronic devices, the invention is not limited thereto but may be modified in a wide variety of ways.

In each of the level shifters according to the second embodiment to the fifth embodiments, the high level voltages VIH and the low level voltages VIL of the supplied inversion-set signal VSb and the supplied inversion-reset signal VRb each may be set at an optional voltage, as in one of the modifications of the first embodiment.

In each of the level shifters according to the second embodiment to the fifth embodiments, a relationship among the set signal VS, the reset signal VR, the inversion-set signal VSb, and the inversion-reset signal VRb which are supplied may satisfy the following conditions, as in one of the modifications of the first embodiment, that: the rising of the inversion-set signal VSb is at the same time as or after the falling of the set signal VS; and the falling of the inversion-set signal VSb is in a period in which the set signal VS is at the high level, and that: the rising of the inversion-reset signal VRb is at the same time as or after the falling of the reset signal VR; and the falling of the inversion-reset signal VRb is in a period in which the reset signal VR is at the high level.

In each of the level shifters according to the second embodiment to the fifth embodiments, the gate oxide film capacitances of MOS transistors may be utilized to configure the capacitances corresponding to the capacitive elements 22 to 25, as in one of the modifications of the first embodiment.

In each of the level shifters according to the second embodiment to the fifth embodiments, the double-gate MOS transistors or the triple-gate MOS transistors may be used, as in one of the modifications of the first embodiment.

In each of the level shifters according to the second embodiment to the fifth embodiments, the MOS transistor 15 may not be provided, as in one of the modifications of the first embodiment.

In each of the level shifters according to the second embodiment to the fifth embodiments, the P-channel MOS transistors may be used for the MOS transistors, as in one of the modifications of the first embodiment.

The present application contains subject matter related to that disclosed in Japanese Priority Patent Application JP 2009-298105 filed in the Japan Patent Office on Dec. 28, 2009, the entire content of which is hereby incorporated by reference.

Although the invention has been described in terms of exemplary embodiments, it is not limited thereto. It should be appreciated that variations may be made in the described embodiments by persons skilled in the art without departing from the scope of the invention as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. Moreover, no element or component in this disclosure is intended to be dedicated to the public regardless of whether the element or component is explicitly recited in the following claims.

What is claimed is:

1. A level shift circuit, comprising:
a first output transistor driven to be turned ON to output a voltage derived from a first power source voltage;
a second output transistor driven to be turned ON to output a voltage derived from a second power source voltage;
a first input transistor having an output terminal, and driven, based on a first input pulse signal, to be turned ON to output a first voltage, the first voltage being a basis of a drive voltage which allows the first output transistor to turn ON;
a second input transistor having an output terminal, and driven, based on the first input pulse signal, to be turned ON to output a second voltage, the second voltage being a basis of a drive voltage which allows the second output transistor to turn OFF;
a third input transistor having an output terminal connected the output terminal of the first input transistor, and driven, based on a second input pulse signal, to be turned ON to output a third voltage, the third voltage being a basis of a drive voltage which allows the first output transistor to turn OFF;

a fourth input transistor having an output terminal connected to the output terminal of the second input transistor, and driven, based on the second input pulse signal, to be turned ON to output a fourth voltage, the fourth voltage being a basis of a drive voltage which allows the second output transistor to turn ON;

a first bootstrap circuit enlarging an amplitude of the first voltage, to supply the enlarged first voltage to the first output transistor; and a first voltage compensation circuit making a voltage change based on a third input pulse signal, a direction of the voltage change being opposite to a direction of a voltage fluctuation which is caused in the first voltage at an end timing of the first input pulse signal due to a parasitic capacitance in the first input transistor.

2. The level shift circuit according to claim 1, further comprising a second voltage compensation circuit making a voltage change based on a fourth input pulse signal, a direction of the voltage change being opposite to a direction of a voltage fluctuation which is caused in the fourth voltage at an end timing of the second input pulse signal due to a parasitic capacitance in the fourth input transistor.

3. The level shift circuit according to claim 1, wherein the first input transistor outputs a voltage derived from a third power source voltage as the first voltage, and the fourth input transistor outputs a voltage derived from the third power source voltage as the fourth voltage.

4. The level shift circuit according to claim 3, wherein the first bootstrap circuit includes a first bootstrap capacitor inserted between a control terminal and the output terminal, of the first output transistor.

5. The level shift circuit according to claim 4, wherein the first bootstrap circuit further includes a first bootstrap transistor having a control terminal to which the third power source voltage is supplied, and which supplies, in an ON state, the first output transistor with an output voltage of the first input transistor or an output voltage of the third input transistor.

6. The level shift circuit according to claim 3, further comprising:

a second bootstrap circuit enlarging an amplitude of the first input pulse signal, to supply the enlarged first input pulse signal to the first input transistor; and a third bootstrap circuit enlarging an amplitude of the second input pulse signal, to supply the enlarged second input pulse signal to the fourth input transistor.

7. The level shift circuit according to claim 6, wherein the second bootstrap circuit includes:

a second bootstrap transistor supplying, in an ON state, the first input pulse signal to the first input transistor; and a second bootstrap capacitor inserted between a control terminal and the output terminal, of the first input transistor, and wherein the third bootstrap circuit includes:

a third bootstrap transistor supplying, in an ON state, the second input pulse signal to the fourth input transistor; and a third bootstrap capacitor inserted between a control terminal and the output terminal, of the fourth input transistor.

8. The level shift circuit according to claim 7, wherein the third power source voltage is supplied to both a control terminal of the second bootstrap transistor and a control terminal of the third bootstrap transistor.

9. The level shift circuit according to claim 7, wherein a fourth power source voltage is supplied to both a control terminal of the second bootstrap transistor and a control terminal of the third bootstrap transistor.

10. The level shift circuit according to claim 1, wherein the first voltage compensation circuit includes:

a first voltage compensation capacitor having a first end to which the third input pulse signal is supplied, and a second end connected to both the output terminal of the first input transistor and the output terminal of the third input transistor; and a second voltage compensation capacitor having a first end connected to both the output terminal of the first input transistor and the output terminal of the third input transistor, and a second end to which the second power source voltage is supplied.

11. The level shift circuit according to claim 10, wherein each of the first and the second voltage compensation capacitors is configured with use of a gate oxide film capacitance of a transistor.

12. The level shift circuit according to claim 1, further comprising:

a first voltage fixing transistor configured to perform, based on an output voltage of the first input transistor or an output voltage of the third input transistor, ON/OFF control between a power source line of the second power source voltage and the commonly connected output terminals which are of the second and the fourth input transistors, and being driven to be turned ON to fix the second voltage; and a second voltage fixing transistor configured to perform, based on an output voltage of the second input transistor or an output voltage of the fourth input transistor, ON/OFF control between the power source line of the second power source voltage and the commonly connected output terminals which are of the first the third input transistors, and being driven to be turned ON to fix the third voltage.

13. The level shift circuit according to claim 1, wherein an end timing of the third input pulse signal coincides with or comes after the end timing of the first input pulse signal.

14. The level shift circuit according to claim 1, wherein the third input pulse signal is generated by inverting the first input pulse signal, or by inverting the first input pulse signal and delaying a phase of the inverted first input pulse signal.

15. The level shift circuit according to claim 1, wherein the first input transistor outputs the first voltage which is derived from the first input pulse signal, and the fourth input transistor outputs the fourth voltage which is derived from the second input pulse signal.

16. The level shift circuit according to claim 1, the first and the second output transistors and the first to the fourth input transistors are MOS transistors of same conduction-type.

17. A level shift circuit, comprising:

a first transistor having a gate connected to a first signal supplier which supplies a signal derived from a first input signal;

a second transistor having a gate supplied with a second input signal, a drain connected to a source of the first transistor, and a source connected to a first power source;

a third transistor having a gate connected to a second signal supplier which supplies a signal derived from the second input signal;

a fourth transistor having a gate supplied with the first input signal, a drain connected to a source of the third transistor, and a source connected to the first power source;

a fifth transistor having a drain connected to a second power source, and a gate connected to a third signal supplier which supplies a signal derived from a signal outputted from the source of the third transistor;

a sixth transistor having a gate connected to the source of the first transistor, a drain connected to a source of the fifth transistor, and a source connected to the first power source;

a first capacitive element having a first end to which a third input signal synchronized with the second input signal is supplied, and a second end connected to the source of the third transistor;

a second capacitive element inserted between the source of the third transistor and the first power source; and a third capacitive element inserted between the gate and the source, of the fifth transistor, wherein a signal having an amplitude equal to or larger than amplitudes of the first to the third input signals is outputted from the source of the fifth transistor.

18. A level shift circuit, comprising:

a first input circuit to which a first input signal and a second input signal are supplied;

a second input circuit to which the first and the second input signals are supplied;

a first capacitive element having a first end to which a third input signal synchronized with the first input signal is supplied, and a second end connected to an output terminal of the second input circuit;

a second capacitive element inserted between the output terminal of the second input circuit and a power source; and an output circuit generating, based on an output voltage of the first input circuit and an output voltage of the second input circuit, an output signal having an amplitude larger than amplitudes of the first to the third input signals, wherein an amplitude fluctuation caused in an output of the second input circuit due to the second input signal is compensated by a combination of the third input signal and the first and the second capacitive elements.

19. A signal drive circuit, comprising:

a shift register circuit generating pulse signals based on control signals supplied, to sequentially output the generated pulse signals to a plurality of signal lines in a time-divisional fashion; and a level shift circuit generating a drive signal based on one or more of the pulse signals, to output the generated drive signal to one of a plurality of drive signal lines, the drive signal having a voltage amplitude equal to or larger than that of the pulse signals which are basis of the drive signal, wherein the level shift circuit includes:

a first output transistor driven to be turned ON to output a voltage derived from a first power source voltage;

a second output transistor driven to be turned ON to output a voltage derived from a second power source voltage;

a first input transistor having an output terminal, and driven, based on a first input pulse signal, to be turned ON to output a first voltage, the first voltage being a basis of a drive voltage which allows the first output transistor to turn ON;

a second input transistor having an output terminal, and driven, based on the first input pulse signal, to be turned ON to output a second voltage, the second voltage being a basis of a drive voltage which allows the second output transistor to turn OFF;

a third input transistor having an output terminal connected the output terminal of the first input transistor, and driven, based on a second input pulse signal, to be turned ON to output a third voltage, the third voltage being a basis of a drive voltage which allows the first output transistor to turn OFF;

a fourth input transistor having an output terminal connected to the output terminal of the second input transistor, and driven, based on the second input pulse signal, to be turned ON to output a fourth voltage, the fourth voltage being a basis of a drive voltage which allows the second output transistor to turn ON;

a first bootstrap circuit enlarging an amplitude of the first voltage, to supply the enlarged first voltage to the first output transistor; and a first voltage compensation circuit making a voltage change based on a third input pulse signal, a direction of the voltage change being opposite to a direction of a voltage fluctuation which is caused in the first voltage at an end timing of the first input pulse signal due to a parasitic capacitance in the first input transistor.

20. A display device, comprising:

a display section; and a display controlling section having a level shift circuit which outputs a control signal having an amplitude larger than that of one or more signals supplied, and driving the display section based on the control signal, wherein the level shift circuit includes:

a first output transistor driven to be turned ON to output a voltage derived from a first power source voltage;

a second output transistor driven to be turned ON to output a voltage derived from a second power source voltage;

a first input transistor having an output terminal, and driven, based on a first input pulse signal, to be turned ON to output a first voltage, the first voltage being a basis of a drive voltage which allows the first output transistor to turn ON;

a second input transistor having an output terminal, and driven, based on the first input pulse signal, to be turned ON to output a second voltage, the second voltage being a basis of a drive voltage which allows the second output transistor to turn OFF;

a third input transistor having an output terminal connected the output terminal of the first input transistor, and driven, based on a second input pulse signal, to be turned ON to output a third voltage, the third voltage being a basis of a drive voltage which allows the first output transistor to turn OFF;

a fourth input transistor having an output terminal connected to the output terminal of the second input transistor, and driven, based on the second input pulse signal, to be turned ON to output a fourth voltage, the fourth voltage being a basis of a drive voltage which allows the second output transistor to turn ON;

a first bootstrap circuit enlarging an amplitude of the first voltage, to supply the enlarged first voltage to the first output transistor; and a first voltage compensation circuit making a voltage change based on a third input pulse signal, a direction of the voltage change being opposite to a direction of a voltage fluctuation which is caused in the first voltage at an end timing of the first input pulse signal due to a parasitic capacitance in the first input transistor.

21. An electronic device, comprising:
a display section;
a processing section performing a predetermined process; and
a display controlling section having a level shift circuit which outputs a control signal having an amplitude larger than that of one or more signals supplied from the processing section, and driving the display section based on the control signal,
wherein the level shift circuit includes:
a first output transistor driven to be turned ON to output a voltage derived from a first power source voltage;
a second output transistor driven to be turned ON to output a voltage derived from a second power source voltage;
a first input transistor having an output terminal, and driven, based on a first input pulse signal, to be turned ON to output a first voltage, the first voltage being a basis of a drive voltage which allows the first output transistor to turn ON;
a second input transistor having an output terminal, and driven, based on the first input pulse signal, to be turned ON to output a second voltage, the second voltage being a basis of a drive voltage which allows the second output transistor to turn OFF;
a third input transistor having an output terminal connected the output terminal of the first input transistor, and driven, based on a second input pulse signal, to be turned ON to output a third voltage, the third voltage being a basis of a drive voltage which allows the first output transistor to turn OFF;
a fourth input transistor having an output terminal connected to the output terminal of the second input transistor, and driven, based on the second input pulse signal, to be turned ON to output a fourth voltage, the fourth voltage being a basis of a drive voltage which allows the second output transistor to turn ON;
a first bootstrap circuit enlarging an amplitude of the first voltage, to supply the enlarged first voltage to the first output transistor; and
a first voltage compensation circuit making a voltage change based on a third input pulse signal, a direction of the voltage change being opposite to a direction of a voltage fluctuation which is caused in the first voltage at an end timing of the first input pulse signal due to a parasitic capacitance in the first input transistor.

* * * * *